(12) United States Patent
Kothandaraman et al.

(10) Patent No.: US 12,299,940 B2
(45) Date of Patent: May 13, 2025

(54) INTERLEAVING OF VARIABLE BITRATE STREAMS FOR GPU IMPLEMENTATIONS

(71) Applicant: Intel Corporation, Santa Clara, CA (US)

(72) Inventors: Sreenivas Kothandaraman, Sammamish, WA (US); Stephen Junkins, Bend, OR (US); Srihari Pratapa, Seattle, WA (US); Prasoonkumar Surti, Folsom, CA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 17/854,310

(22) Filed: Jun. 30, 2022

(65) Prior Publication Data

US 2023/0057492 A1    Feb. 23, 2023

Related U.S. Application Data

(60) Provisional application No. 63/235,076, filed on Aug. 19, 2021.

(51) Int. Cl.
*G06T 9/00* (2006.01)
*G06T 1/20* (2006.01)

(52) U.S. Cl.
CPC ............... *G06T 9/001* (2013.01); *G06T 1/20* (2013.01)

(58) Field of Classification Search
CPC .......... G06T 9/001; G06T 1/20; G06T 9/005; H03M 7/6029; H03M 7/3084;
(Continued)

(56) References Cited

U.S. PATENT DOCUMENTS 3,978,319 A   8/1976 Vinal
2003/0128884 A1*  7/2003 Lee ........................ H04N 19/46
                                              375/E7.199

(Continued)

FOREIGN PATENT DOCUMENTS

DE   102022101975 A1   9/2022
WO     2009005758 A3   4/2009

OTHER PUBLICATIONS

Andrew Yeung. (Sep. 2020). DirectStorage is coming to PC. Retrieved from devblogs.microsoft.com: https://devblogs.microsoft.com/directx/directstorage-is-coming-to-pc/.

(Continued)

*Primary Examiner* — Ali Bayat
(74) *Attorney, Agent, or Firm* — JAFFERY WATSON HAMILTON & DESANCTIS LLP

(57) ABSTRACT

Interleaving of variable bitrate streams for GPU implementations is described. An example of an apparatus includes one or more processors including a graphic processor, the graphics processor including a super-compression encoder pipeline to provide variable width interleaved coding; and memory for storage of data, wherein the graphics processor is to perform parallel dictionary encoding on a bitstream of symbols one of multiple workgroups, the workgroup to employ a plurality of encoders to generate a plurality of token-streams of variable lengths; create a histogram including at least tokens from the plurality of token-streams for the workgroup to generate an optimized entropy code; entropy code each of the plurality of token-streams for the workgroup into an encoded bitstream; and variably interleave the encoded bitstreams to generate an interleaved bitstream and bookkeep a size of the interleaved bitstream.

20 Claims, 35 Drawing Sheets

(58) Field of Classification Search
CPC ............ H03M 7/4043; H03M 7/6023; H03M 7/6052; H04N 19/91
USPC ....................................................... 382/232
See application file for complete search history.

(56) References Cited

U.S. PATENT DOCUMENTS

| | | | | |
|---|---|---|---|---|
| 2003/0147470 | A1* | 8/2003 | Lee | H04N 19/126 375/E7.199 |
| 2006/0238390 | A1* | 10/2006 | Yi | H04N 19/94 341/87 |
| 2007/0053600 | A1* | 3/2007 | Lee | H04N 19/12 375/E7.199 |
| 2007/0183674 | A1* | 8/2007 | Lee | H04N 19/94 375/E7.206 |
| 2009/0006510 | A1 | 1/2009 | Laker et al. | |
| 2010/0191859 | A1 | 7/2010 | Raveendran | |
| 2010/0322308 | A1* | 12/2010 | Lee | H04N 19/00 375/E7.076 |
| 2012/0081242 | A1 | 4/2012 | He et al. | |
| 2018/0293692 | A1 | 10/2018 | Koker et al. | |
| 2019/0005703 | A1 | 1/2019 | Golas et al. | |
| 2022/0159255 | A1 | 5/2022 | Xu et al. | |
| 2023/0136121 | A1* | 5/2023 | Leleannec | H04N 19/186 375/240.02 |

OTHER PUBLICATIONS

Burnes, A. (Sep. 2020). Introducing Nvidia RTX IO: GPU-Accelerated Storage Technology For The Next Generation of Games. Retrieved from Nvidia.com: https://www.nvidia.com/en-us/geforce/news/rtx-io-gpu-accelerated-storage-technology/.

Duda, J. (2014). Asymmetric numeral systems: entropy coding combining speed of Huffman coding with compression rate of arithmetic coding. Retrieved from https://arxiv.org/abs/1311.2540.

Giesen, F. (2014). Interleaved Entropy Coders. Retrieved from https://arxiv.org/abs/1402.3392.

Weissenberger, A., & Schmidt, B. (2018). Massively Parallel Huffman Decoding on GPUs. ACM ICPP 2018: 47th Internation Conference on Parallel Processing. Eugene, Oregon. Retrieved fromhttps://dl.acm.org/doi/10.1145/3225058.3225076.

Yamamoto, N., Nakano, K., Ito, Y., Takafuji, D., Kasagi, A., & Tabaru, T. (2020). Huffman Coding with Gap Arrays for GPU Acceleration. ACM ICP 2020: International Conference on Parallel Processing. ACM. Retrieved from https://dl.acm.org/doi/abs/10.1145/3404397.3404429.

Extended European Search Report for EP22183479.9 mailed Jan. 30, 2023, 14 pages.

Notification of Publication for Chinese Patent Application No. 202210154266.6, Publication No. CN 115115719 A, mailed Oct. 11, 2022, 2 pages.

Sitaridi Eva et al: "Parallel lossless compression using GPUs", GPU Tech Conf, Dec. 31, 2014 (Dec. 31, 2014), pp. 1-42, XP093015123, Retrieved from the Internet: URL:https://on-demand.gputechconf.com/gtc/20 14/presentations/S4459-parallel-lossless-compression-using-gpus.pdf [retrieved on Jan. 18, 2023].

Various: "can there be some performance gain from using lizard in highly parallel compute?", encode.su, Jul. 23, 2019 (Jul. 23, 2019), pp. 1-8, XP093015141, Retrieved from the Internet: URL:https://encode.su/threads/3151-can-there-be-some-performance-gainfrom-using-lizard-in-highly-parallel-compute [retrieved on Jan. 18, 2023].

Non-Final Office Action issued in U.S. Appl. No. 17/357,038 mailed May 13, 2024, 28 pages.

Notice of Allowance for U.S. Appl. No. 17/357,038 mailed Oct. 9, 2024, 15 pages.

* cited by examiner

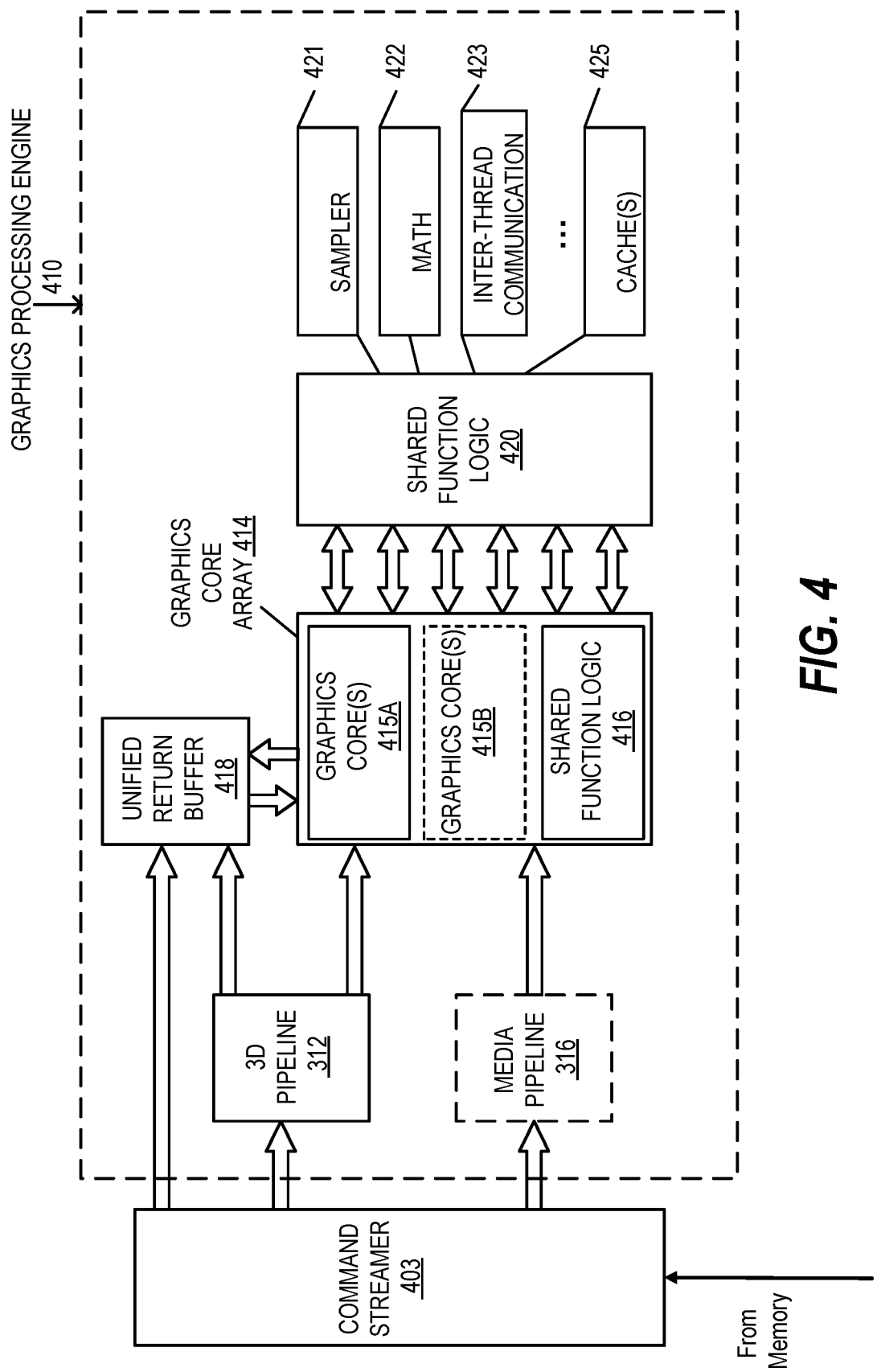

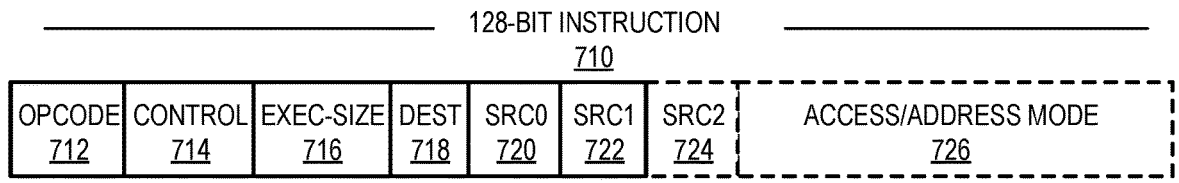
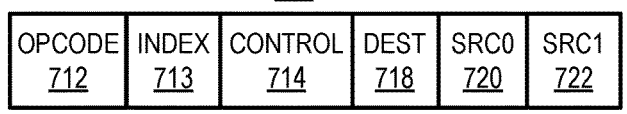
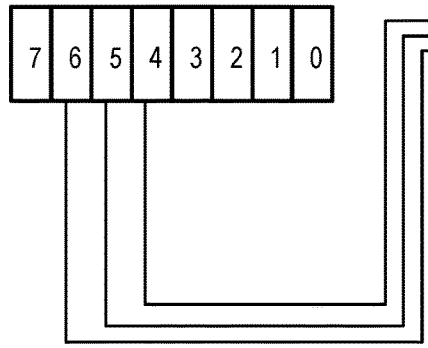
FIG. 7

INTERLEAVING OF VARIABLE BITRATE STREAMS FOR GPU IMPLEMENTATIONS

CLAIM TO PRIORITY

This application claims priority to U.S. Provisional Application Ser. No. 63/235,076, entitled INTERLEAVING OF VARIABLE BITRATE STREAMS FOR GPU IMPLEMENTATIONS, by Sreenivas Kothandaraman, et al., filed Aug. 19, 2021, the entire contents of which are incorporated herein by reference.

FIELD

This disclosure relates generally to data processing, and more particularly to interleaving of variable bitrate streams for GPU implementations.

BACKGROUND OF THE DISCLOSURE

Data compression remains a very high priority in data processing to minimize overhead in data transmission and storage. In particular, graphics processing operations encounter extremely large amounts of texture data that is utilized in gaming and other operations. The amount of data increases with advances in graphics, and such data requires rapid and efficient compression to allow the graphics operations to perform smoothly.

In graphics processing, texture compression may be applied to data, texture compression referring to a form of image compression for storing of texture maps. A system may then utilize supercompression on the texture compressed data, in which additional compression is applied to the data.

BRIEF DESCRIPTION OF THE DRAWINGS

So that the manner in which the above recited features of the present embodiments can be understood in detail, a more particular description of the embodiments, briefly summarized above, may be had by reference to embodiments, some of which are illustrated in the appended drawings. It is to be noted, however, that the appended drawings illustrate only typical embodiments and are therefore not to be considered limiting of its scope.

FIG. 4 is a block diagram of a graphics processing engine of a graphics processor in accordance with some embodiments;

FIG. 7 is a block diagram illustrating a graphics processor instruction formats 700 according to some embodiments;

DETAILED DESCRIPTION

Figure 1:
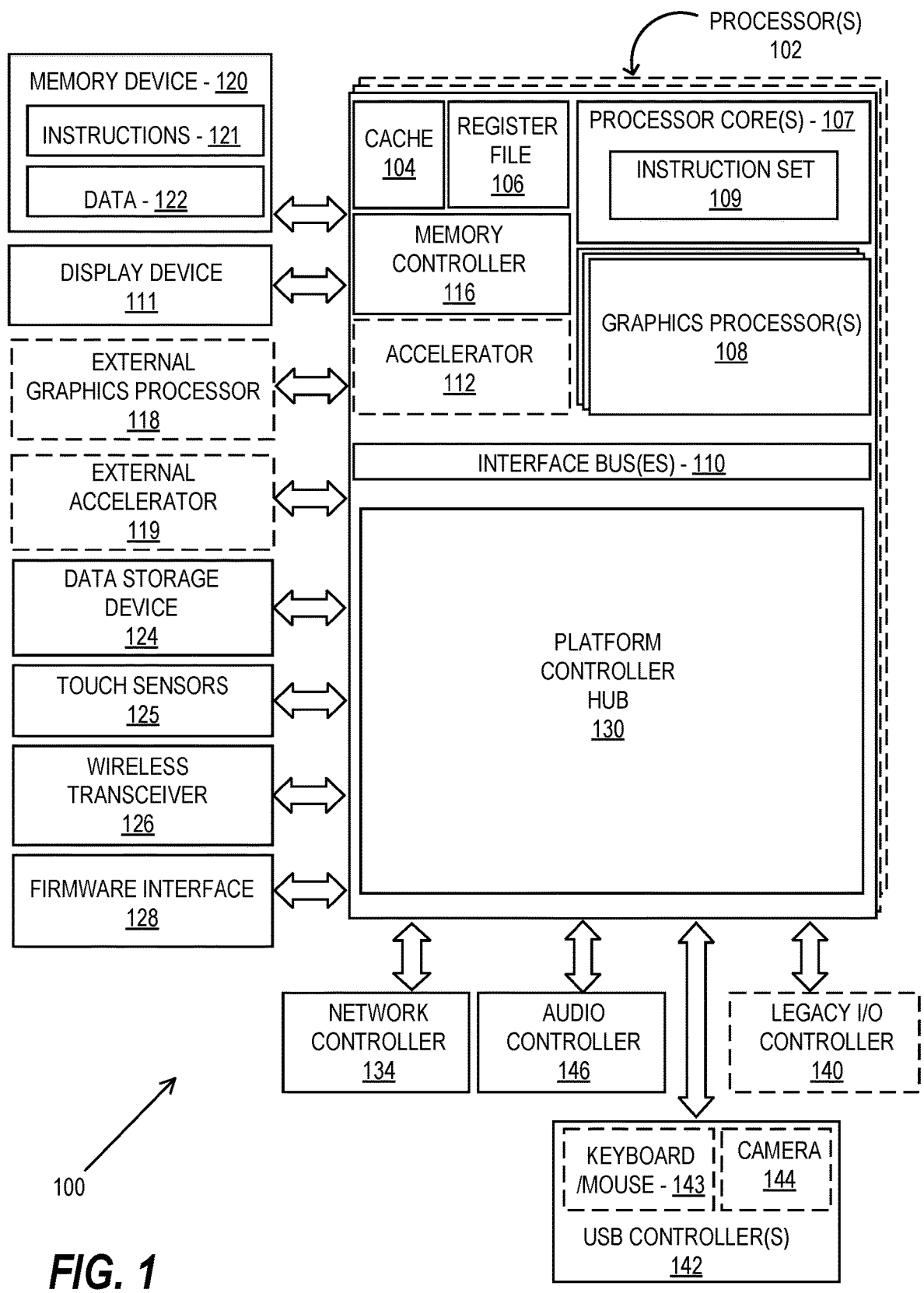
FIG. 1 is a block diagram of a processing system, according to an embodiment.

Embodiments relate to interleaving of variable bitrate streams produced by cascaded dictionary and entropy coders for GPU implementations.

In data processing operation that include graphics data, such as gaming and other graphics intensive applications (such as virtual reality applications) there may be very large amounts of texture and other data to be transferred and stored. In order to reduce the burden imposed by such data, the data is commonly compressed utilizing texture compression. In order to further reduce the data to be streamed, a second level compression referred to as supercompression is applied.

Supercompression may utilize dictionary encoding and entropy encoding. Dictionary coding in general refers to a compression algorithm in which there is a search for matches between the data to be compressed and symbols contained in a data structure (the dictionary) maintained by the encoder. Dictionary coding collapses multiple symbols into a token, a token being a data object that represents one or more symbols. In general as utilized herein, a token may represent a particular symbol, or may represent a sequence of n-number (n being a positive integer) symbols that may be fetched from a prior location in a stream (which may be defined by a distance and length within the steam). This results in the number of tokens to be decoded by a dictionary decoder to be variable as the number of symbols represented by a token may vary. When parallel streams are interleaved, it is important for decoders to know when to stop so as to not pull data that belongs to other decoders. To address this, naïve implementations will need signaling through metadata embedded in the stream, which increases the amount of data required to perform compression and decompression of data.

In dictionary coding, LZ77 refers to the Sliding Window Lempel-Ziv algorithm created in 1977 by Abraham Lempel and Jacob Ziv. LZW (Lempel-Ziv-Welch) refers to the universal lossless data compression algorithm created by Abraham Lempel, Jacob Ziv, and Terry Welch. LZ77 algorithms achieve compression by replacing repeated occurrences of data with references to a single copy of that data existing earlier in the uncompressed data stream.

Entropy coding refers to a lossless data compression operation that is independent of the specific characteristics of the medium, and thus is applicable to any stream. Commonly, entropy coding creates and assigns a unique prefix-free code to each unique symbol that occurs in the input. The entropy encoder then compresses data by replacing each fixed-length input symbol with the corresponding variable-length prefix-free output codeword.

In entropy coding, Huffman coding refers to a lossless data compression algorithm in which variable-length codes are assigned to input characters, with the lengths of the assigned codes being based on the frequency of occurrence of the encoded characters. The goal of such coding is for the most frequently occurring character to receive the smallest (shortest bit length) code and the least frequently occurring character to receive the largest (longest bit length) code.

The results of such encoding may be interleaved into a single stream for transmission to parallel decoders. However, the decoding of an interleaved bitstream commonly would require a significant amount of metadata to enable decoders to determine where within the compressed stream data for decoding is located.

In some embodiments, an apparatus, system, or process provides for interleaving of variable rate bitstreams comprising cascaded dictionary and entropy encoded stages for delivery to decoding stages. In particular, the interleaving is performed without incurring significant metadata costs, while minimizing GPU divergence and inefficient memory access patterns.

In some embodiments, an apparatus, system, or process is to fuse the entropy and dictionary decoding stages so that the decoder elements are aware of the symbols that are decoded. In an implementation, the metadata overhead that would otherwise be required is avoided, and thereby the compression factor is improved.

System Overview

FIG. 1 is a block diagram of a processing system 100, according to an embodiment. Processing system 100 may be used in a single processor desktop system, a multiprocessor workstation system, or a server system having a large number of processors 102 or processor cores 107. In one embodiment, the processing system 100 is a processing platform incorporated within a system-on-a-chip (SoC) integrated circuit for use in mobile, handheld, or embedded devices such as within Internet-of-things (IoT) devices with wired or wireless connectivity to a local or wide area network.

In one embodiment, processing system 100 can include, couple with, or be integrated within: a server-based gaming platform; a game console, including a game and media console; a mobile gaming console, a handheld game console, or an online game console. In some embodiments the processing system 100 is part of a mobile phone, smart phone, tablet computing device or mobile Internet-connected device such as a laptop with low internal storage capacity. Processing system 100 can also include, couple with, or be integrated within: a wearable device, such as a smart watch wearable device; smart eyewear or clothing enhanced with augmented reality (AR) or virtual reality (VR) features to provide visual, audio or tactile outputs to supplement real world visual, audio or tactile experiences or otherwise provide text, audio, graphics, video, holographic images or video, or tactile feedback; other augmented reality (AR) device; or other virtual reality (VR) device. In some embodiments, the processing system 100 includes or is part of a television or set top box device. In one embodiment, processing system 100 can include, couple with, or be integrated within a self-driving vehicle such as a bus, tractor trailer, car, motor or electric power cycle, plane or glider (or any combination thereof). The self-driving vehicle may use processing system 100 to process the environment sensed around the vehicle.

In some embodiments, the one or more processors 102 each include one or more processor cores 107 to process instructions which, when executed, perform operations for system or user software. In some embodiments, at least one of the one or more processor cores 107 is configured to process a specific instruction set 109. In some embodiments, instruction set 109 may facilitate Complex Instruction Set Computing (CISC), Reduced Instruction Set Computing (RISC), or computing via a Very Long Instruction Word (VLIW). One or more processor cores 107 may process a different instruction set 109, which may include instructions to facilitate the emulation of other instruction sets. Processor core 107 may also include other processing devices, such as a Digital Signal Processor (DSP).

In some embodiments, the processor 102 includes cache memory 104. Depending on the architecture, the processor 102 can have a single internal cache or multiple levels of internal cache. In some embodiments, the cache memory is shared among various components of the processor 102. In some embodiments, the processor 102 also uses an external cache (e.g., a Level-3 (L3) cache or Last Level Cache (LLC)) (not shown), which may be shared among processor cores 107 using known cache coherency techniques. A register file 106 can be additionally included in processor 102 and may include different types of registers for storing different types of data (e.g., integer registers, floating point registers, status registers, and an instruction pointer register). Some registers may be general-purpose registers, while other registers may be specific to the design of the processor 102.

In some embodiments, one or more processor(s) 102 are coupled with one or more interface bus(es) 110 to transmit communication signals such as address, data, or control signals between processor 102 and other components in the processing system 100. The interface bus 110, in one embodiment, can be a processor bus, such as a version of the Direct Media Interface (DMI) bus. However, processor busses are not limited to the DMI bus, and may include one or more Peripheral Component Interconnect buses (e.g., PCI, PCI express), memory busses, or other types of interface busses. In one embodiment the processor(s) 102 include an integrated memory controller 116 and a platform controller hub 130. The memory controller 116 facilitates communication between a memory device and other components of the processing system 100, while the platform controller hub (PCH) 130 provides connections to I/O devices via a local I/O bus.

The memory device 120 can be a dynamic random-access memory (DRAM) device, a static random-access memory (SRAM) device, flash memory device, phase-change memory device, or some other memory device having suitable performance to serve as process memory. In one embodiment the memory device 120 can operate as system memory for the processing system 100, to store data 122 and instructions 121 for use when the one or more processors 102 executes an application or process. Memory controller 116 also couples with an optional external graphics processor 118, which may communicate with the one or more graphics processors 108 in processors 102 to perform graphics and media operations. In some embodiments, graphics, media, and or compute operations may be assisted by an accelerator 112 which is a coprocessor that can be configured to perform a specialized set of graphics, media, or compute operations. For example, in one embodiment the accelerator 112 is a matrix multiplication accelerator used to optimize machine learning or compute operations. In one embodiment the accelerator 112 is a ray-tracing accelerator that can be used to perform ray-tracing operations in concert with the graphics processor 108. In one embodiment, an external accelerator 119 may be used in place of or in concert with the accelerator 112.

In some embodiments a display device 111 can connect to the processor(s) 102. The display device 111 can be one or more of an internal display device, as in a mobile electronic device or a laptop device or an external display device attached via a display interface (e.g., DisplayPort, etc.). In one embodiment the display device 111 can be a head mounted display (HMD) such as a stereoscopic display device for use in virtual reality (VR) applications or augmented reality (AR) applications.

In some embodiments the platform controller hub 130 enables peripherals to connect to memory device 120 and processor 102 via a high-speed I/O bus. The I/O peripherals include, but are not limited to, an audio controller 146, a network controller 134, a firmware interface 128, a wireless transceiver 126, touch sensors 125, a data storage device 124 (e.g., non-volatile memory, volatile memory, hard disk drive, flash memory, NAND, 3D NAND, 3D XPoint, etc.). The data storage device 124 can connect via a storage interface (e.g., SATA) or via a peripheral bus, such as a Peripheral Component Interconnect bus (e.g., PCI, PCI express). The touch sensors 125 can include touch screen sensors, pressure sensors, or fingerprint sensors. The wireless transceiver 126 can be a Wi-Fi transceiver, a Bluetooth transceiver, or a mobile network transceiver such as a 3G, 4G, 5G, or Long-Term Evolution (LTE) transceiver. The firmware interface 128 enables communication with system firmware, and can be, for example, a unified extensible firmware interface (UEFI). The network controller 134 can enable a network connection to a wired network. In some embodiments, a high-performance network controller (not shown) couples with the interface bus 110. The audio controller 146, in one embodiment, is a multi-channel high definition audio controller. In one embodiment the processing system 100 includes an optional legacy I/O controller 140 for coupling legacy (e.g., Personal System 2 (PS/2)) devices to the system. The platform controller hub 130 can also connect to one or more Universal Serial Bus (USB) controllers 142 connect input devices, such as keyboard and mouse 143 combinations, a camera 144, or other USB input devices.

It will be appreciated that the processing system 100 shown is exemplary and not limiting, as other types of data processing systems that are differently configured may also be used. For example, an instance of the memory controller 116 and platform controller hub 130 may be integrated into a discreet external graphics processor, such as the external graphics processor 118. In one embodiment the platform controller hub 130 and/or memory controller 116 may be external to the one or more processor(s) 102. For example, the processing system 100 can include an external memory controller 116 and platform controller hub 130, which may be configured as a memory controller hub and peripheral controller hub within a system chipset that is in communication with the processor(s) 102.

For example, circuit boards ("sleds") can be used on which components such as CPUs, memory, and other components are placed are designed for increased thermal performance. In some examples, processing components such as the processors are located on a top side of a sled while near memory, such as DIMMs, are located on a bottom side of the sled. As a result of the enhanced airflow provided by this design, the components may operate at higher frequencies and power levels than in typical systems, thereby increasing performance. Furthermore, the sleds are configured to blindly mate with power and data communication cables in a rack, thereby enhancing their ability to be quickly removed, upgraded, reinstalled, and/or replaced. Similarly, individual components located on the sleds, such as processors, accelerators, memory, and data storage drives, are configured to be easily upgraded due to their increased spacing from each other. In the illustrative embodiment, the components additionally include hardware attestation features to prove their authenticity.

A data center can utilize a single network architecture ("fabric") that supports multiple other network architectures including Ethernet and Omni-Path. The sleds can be coupled to switches via optical fibers, which provide higher bandwidth and lower latency than typical twisted pair cabling (e.g., Category 5, Category 5e, Category 6, etc.). Due to the high bandwidth, low latency interconnections and network architecture, the data center may, in use, pool resources, such as memory, accelerators (e.g., GPUs, graphics accelerators, FPGAs, ASICs, neural network and/or artificial intelligence accelerators, etc.), and data storage drives that are physically disaggregated, and provide them to compute resources (e.g., processors) on an as needed basis, enabling the compute resources to access the pooled resources as if they were local.

A power supply or source can provide voltage and/or current to processing system 100 or any component or system described herein. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

FIGS. 2A-2D illustrate computing systems and graphics processors provided by embodiments described herein. The elements of FIGS. 2A-2D having the same reference numbers (or names) as the elements of any other figure herein can operate or function in any manner similar to that described elsewhere herein, but are not limited to such.

Figure 2A:
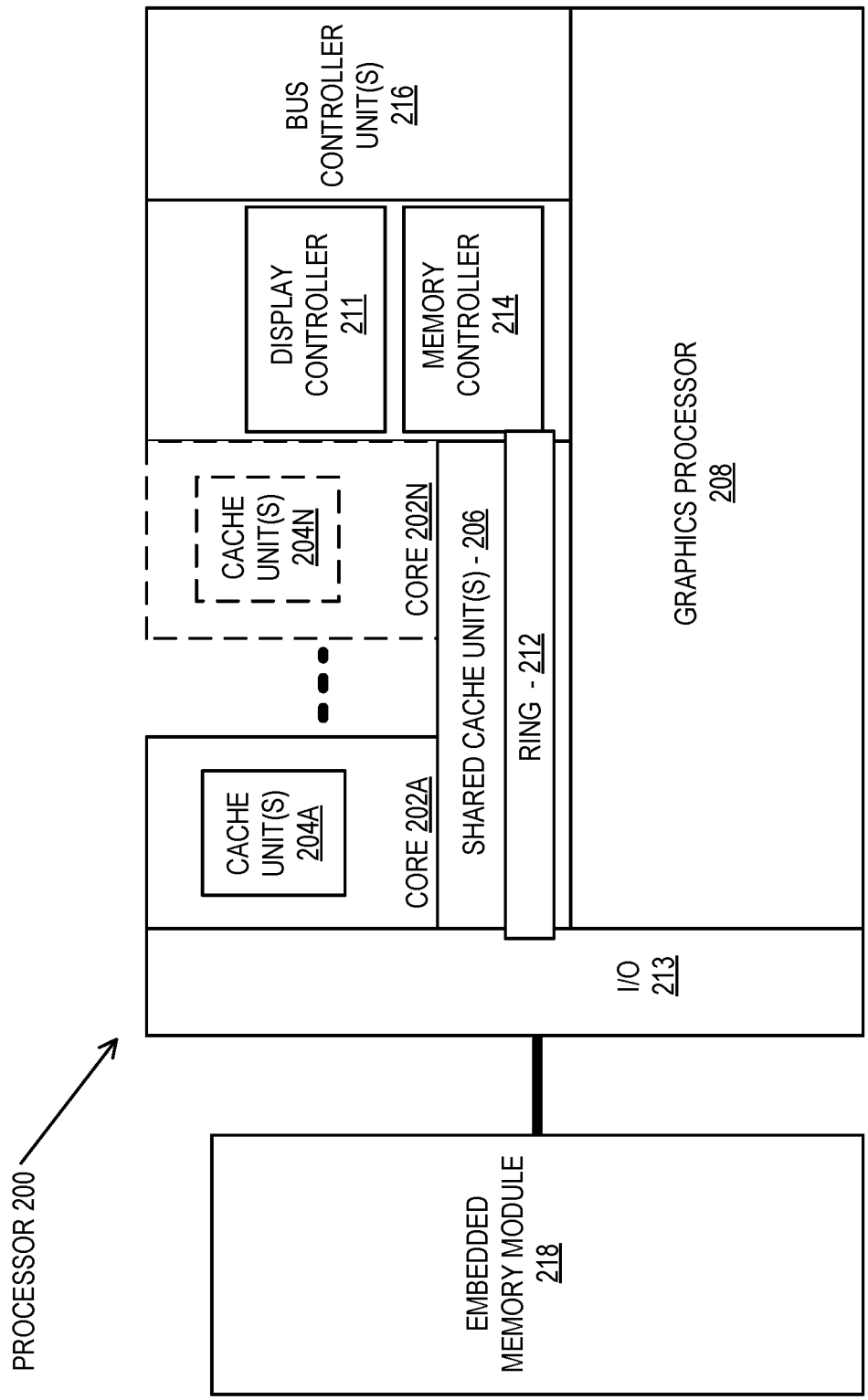
FIGS. 2A-2D illustrate computing systems and graphics processors provided by embodiments described herein.

FIG. 2A is a block diagram of an embodiment of a processor 200 having one or more processor cores 202A-202N, an integrated memory controller 214, and an integrated graphics processor 208. Processor 200 can include additional cores up to and including additional core 202N represented by the dashed lined boxes. Each of processor cores 202A-202N includes one or more internal cache units 204A-204N. In some embodiments each processor core also has access to one or more shared cached units 206. The internal cache units 204A-204N and shared cache units 206 represent a cache memory hierarchy within the processor 200. The cache memory hierarchy may include at least one level of instruction and data cache within each processor core and one or more levels of shared mid-level cache, such as a Level 2 (L2), Level 3 (L3), Level 4 (L4), or other levels of cache, where the highest level of cache before external memory is classified as the LLC. In some embodiments, cache coherency logic maintains coherency between the various cache units 206 and 204A-204N.

In some embodiments, processor 200 may also include a set of one or more bus controller units 216 and a system agent core 210. The one or more bus controller units 216 manage a set of peripheral buses, such as one or more PCI or PCI express busses. System agent core 210 provides management functionality for the various processor components. In some embodiments, system agent core 210 includes one or more integrated memory controllers 214 to manage access to various external memory devices (not shown).

In some embodiments, one or more of the processor cores 202A-202N include support for simultaneous multi-threading. In such embodiment, the system agent core 210 includes components for coordinating and operating cores 202A-202N during multi-threaded processing. System agent core 210 may additionally include a power control unit (PCU), which includes logic and components to regulate the power state of processor cores 202A-202N and graphics processor 208.

In some embodiments, processor 200 additionally includes graphics processor 208 to execute graphics processing operations. In some embodiments, the graphics processor 208 couples with the set of shared cache units 206, and the system agent core 210, including the one or more integrated memory controllers 214. In some embodiments, the system agent core 210 also includes a display controller 211 to drive graphics processor output to one or more coupled displays. In some embodiments, display controller 211 may also be a separate module coupled with the graphics processor via at least one interconnect, or may be integrated within the graphics processor 208.

In some embodiments, a ring-based interconnect 212 is used to couple the internal components of the processor 200. However, an alternative interconnect unit may be used, such as a point-to-point interconnect, a switched interconnect, or other techniques, including techniques well known in the art. In some embodiments, graphics processor 208 couples with the ring-based interconnect 212 via an I/O link 213.

The exemplary I/O link 213 represents at least one of multiple varieties of I/O interconnects, including an on package I/O interconnect which facilitates communication between various processor components and a high-performance embedded memory module 218, such as an eDRAM module. In some embodiments, each of the processor cores 202A-202N and graphics processor 208 can use embedded memory modules 218 as a shared Last Level Cache.

In some embodiments, processor cores 202A-202N are homogenous cores executing the same instruction set architecture. In another embodiment, processor cores 202A-202N are heterogeneous in terms of instruction set architecture (ISA), where one or more of processor cores 202A-202N execute a first instruction set, while at least one of the other cores executes a subset of the first instruction set or a different instruction set. In one embodiment, processor cores 202A-202N are heterogeneous in terms of microarchitecture, where one or more cores having a relatively higher power consumption couple with one or more power cores having a lower power consumption. In one embodiment, processor cores 202A-202N are heterogeneous in terms of computational capability. Additionally, processor 200 can be implemented on one or more chips or as an SoC integrated circuit having the illustrated components, in addition to other components.

Figure 2B:
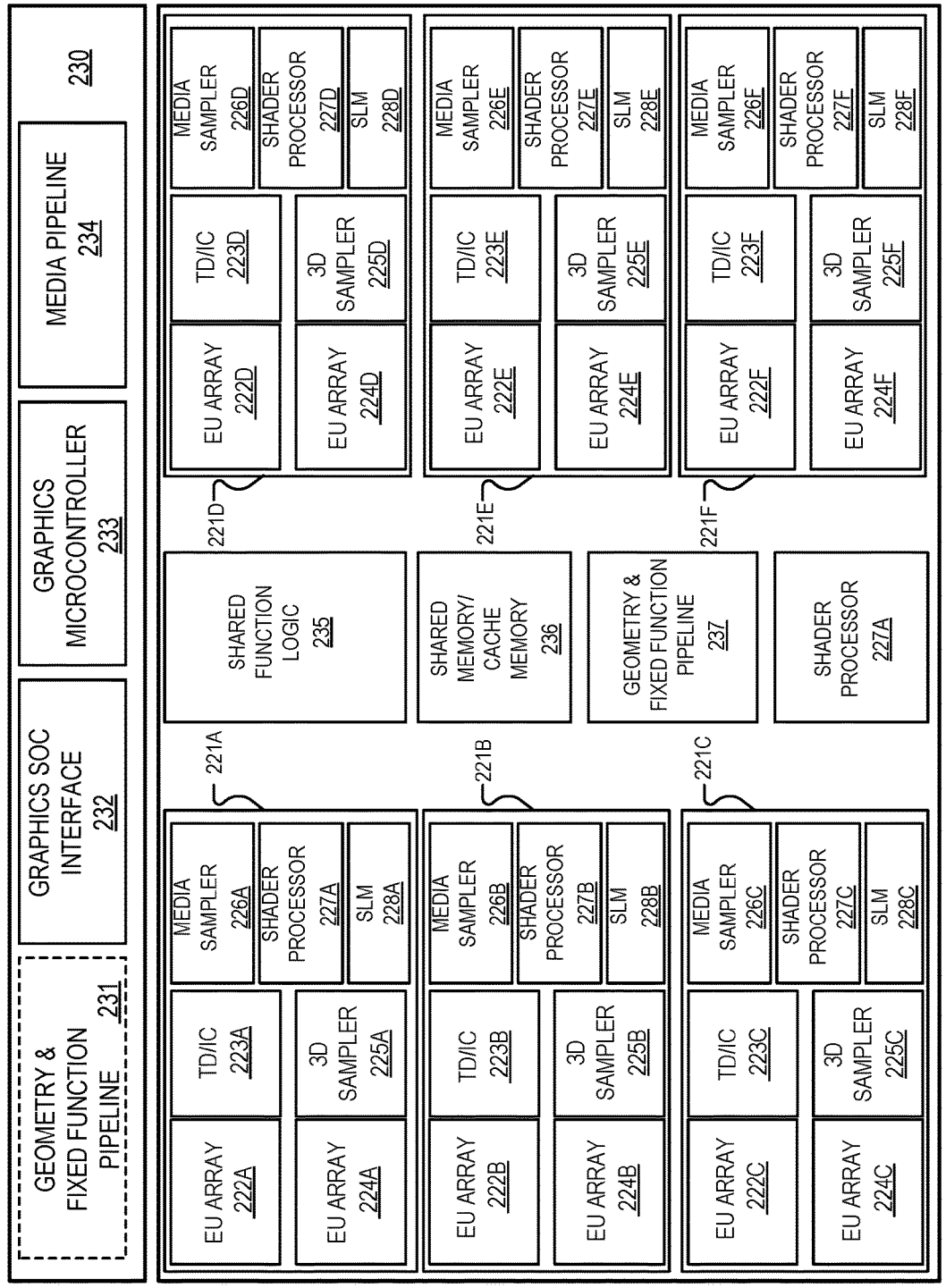

FIG. 2B is a block diagram of hardware logic of a graphics processor core 219, according to some embodiments described herein. Elements of FIG. 2B having the same reference numbers (or names) as the elements of any other figure herein can operate or function in any manner similar to that described elsewhere herein, but are not limited to such. The graphics processor core 219, sometimes referred to as a core slice, can be one or multiple graphics cores within a modular graphics processor. The graphics processor core 219 is exemplary of one graphics core slice, and a graphics processor as described herein may include multiple graphics core slices based on target power and performance envelopes. Each graphics processor core 219 can include a fixed function block 230 coupled with multiple sub-cores 221A-221F, also referred to as sub-slices, that includes modular blocks of general-purpose and fixed function logic.

In some embodiments, the fixed function block 230 includes a geometry/fixed function pipeline 231 that can be shared by all sub-cores in the graphics processor core 219, for example, in lower performance and/or lower power graphics processor implementations. In various embodiments, the geometry/fixed function pipeline 231 includes a 3D fixed function pipeline (e.g., 3D pipeline 312 as in FIG. 3A and FIG. 4, described below) a video front-end unit, a thread spawner and thread dispatcher, and a unified return buffer manager, which manages unified return buffers (e.g., unified return buffer 418 in FIG. 4, as described below).

In one embodiment the fixed function block 230 also includes a graphics SoC interface 232, a graphics microcontroller 233, and a media pipeline 234. The graphics SoC interface 232 provides an interface between the graphics processor core 219 and other processor cores within a system on a chip integrated circuit. The graphics microcontroller 233 is a programmable sub-processor that is configurable to manage various functions of the graphics processor core 219, including thread dispatch, scheduling, and preemption. The media pipeline 234 (e.g., media pipeline 316 of FIG. 3A and FIG. 4) includes logic to facilitate the decoding, encoding, pre-processing, and/or post-processing of multimedia data, including image and video data. The media pipeline 234 implement media operations via requests to compute or sampling logic within the sub-cores 221-221F.

In one embodiment the SoC interface 232 enables the graphics processor core 219 to communicate with general-purpose application processor cores (e.g., CPUs) and/or other components within an SoC, including memory hierarchy elements such as a shared last level cache memory, the system RAM, and/or embedded on-chip or on-package DRAM. The SoC interface 232 can also enable communication with fixed function devices within the SoC, such as camera imaging pipelines, and enables the use of and/or implements global memory atomics that may be shared between the graphics processor core 219 and CPUs within the SoC. The SoC interface 232 can also implement power management controls for the graphics processor core 219 and enable an interface between a clock domain of the graphics processor core 219 and other clock domains within the SoC. In one embodiment the SoC interface 232 enables receipt of command buffers from a command streamer and global thread dispatcher that are configured to provide commands and instructions to each of one or more graphics cores within a graphics processor. The commands and instructions can be dispatched to the media pipeline 234, when media operations are to be performed, or a geometry and fixed function pipeline (e.g., geometry and fixed function pipeline 231, geometry and fixed function pipeline 237) when graphics processing operations are to be performed.

The graphics microcontroller 233 can be configured to perform various scheduling and management tasks for the graphics processor core 219. In one embodiment the graphics microcontroller 233 can perform graphics and/or compute workload scheduling on the various graphics parallel engines within execution unit (EU) arrays 222A-222F, 224A-224F within the sub-cores 221A-221F. In this scheduling model, host software executing on a CPU core of an SoC including the graphics processor core 219 can submit workloads one of multiple graphic processor doorbells, which invokes a scheduling operation on the appropriate graphics engine. Scheduling operations include determining which workload to run next, submitting a workload to a command streamer, pre-empting existing workloads running on an engine, monitoring progress of a workload, and notifying host software when a workload is complete. In one embodiment the graphics microcontroller 233 can also facilitate low-power or idle states for the graphics processor core 219, providing the graphics processor core 219 with the ability to save and restore registers within the graphics processor core 219 across low-power state transitions independently from the operating system and/or graphics driver software on the system.

The graphics processor core 219 may have greater than or fewer than the illustrated sub-cores 221A-221F, up to N modular sub-cores. For each set of N sub-cores, the graphics processor core 219 can also include shared function logic 235, shared and/or cache memory 236, a geometry/fixed function pipeline 237, as well as additional fixed function logic 238 to accelerate various graphics and compute processing operations. The shared function logic 235 can include logic units associated with the shared function logic 420 of FIG. 4 (e.g., sampler, math, and/or inter-thread communication logic) that can be shared by each N sub-cores within the graphics processor core 219. The shared and/or cache memory 236 can be a last-level cache for the set of N sub-cores 221A-221F within the graphics processor core 219, and can also serve as shared memory that is accessible by multiple sub-cores. The geometry/fixed function pipeline 237 can be included instead of the geometry/fixed function pipeline 231 within the fixed function block 230 and can include the same or similar logic units.

In one embodiment the graphics processor core 219 includes additional fixed function logic 238 that can include various fixed function acceleration logic for use by the graphics processor core 219. In one embodiment the additional fixed function logic 238 includes an additional geometry pipeline for use in position only shading. In position-only shading, two geometry pipelines exist, the full geometry pipeline within the geometry/fixed function pipeline 238, 231, and a cull pipeline, which is an additional geometry pipeline which may be included within the additional fixed function logic 238. In one embodiment the cull pipeline is a trimmed down version of the full geometry pipeline. The full pipeline and the cull pipeline can execute different instances of the same application, each instance having a separate context. Position only shading can hide long cull runs of discarded triangles, enabling shading to be completed earlier in some instances. For example and in one embodiment the cull pipeline logic within the additional fixed function logic 238 can execute position shaders in parallel with the main application and generally generates critical results faster than the full pipeline, as the cull pipeline fetches and shades only the position attribute of the vertices, without performing rasterization and rendering of the pixels to the frame buffer. The cull pipeline can use the generated critical results to compute visibility information for all the triangles without regard to whether those triangles are culled. The full pipeline (which in this instance may be referred to as a replay pipeline) can consume the visibility information to skip the culled triangles to shade only the visible triangles that are finally passed to the rasterization phase.

In one embodiment the additional fixed function logic 238 can also include machine-learning acceleration logic, such as fixed function matrix multiplication logic, for implementations including optimizations for machine learning training or inferencing.

Within each graphics sub-core 221A-221F includes a set of execution resources that may be used to perform graphics, media, and compute operations in response to requests by graphics pipeline, media pipeline, or shader programs. The graphics sub-cores 221A-221F include multiple EU arrays 222A-222F, 224A-224F, thread dispatch and inter-thread communication (TD/IC) logic 223A-223F, a 3D (e.g., texture) sampler 225A-225F, a media sampler 226A-226F, a shader processor 227A-227F, and shared local memory (SLM) 228A-228F. The EU arrays 222A-222F, 224A-224F each include multiple execution units, which are general-purpose graphics processing units capable of performing floating-point and integer/fixed-point logic operations in service of a graphics, media, or compute operation, including graphics, media, or compute shader/GPGPU programs. The TD/IC logic 223A-223F performs local thread dispatch and thread control operations for the execution units within a sub-core and facilitate communication between threads executing on the execution units of the sub-core. The 3D sampler 225A-225F can read texture or other 3D graphics related data into memory. The 3D sampler can read texture data differently based on a configured sample state and the texture format associated with a given texture. The media sampler 226A-226F can perform similar read operations based on the type and format associated with media data. In one embodiment, each graphics sub-core 221A-221F can alternately include a unified 3D and media sampler. Threads executing on the execution units within each of the sub-cores 221A-221F can make use of shared local memory 228A-228F within each sub-core, to enable threads executing within a thread group to execute using a common pool of on-chip memory.

Figure 2C:
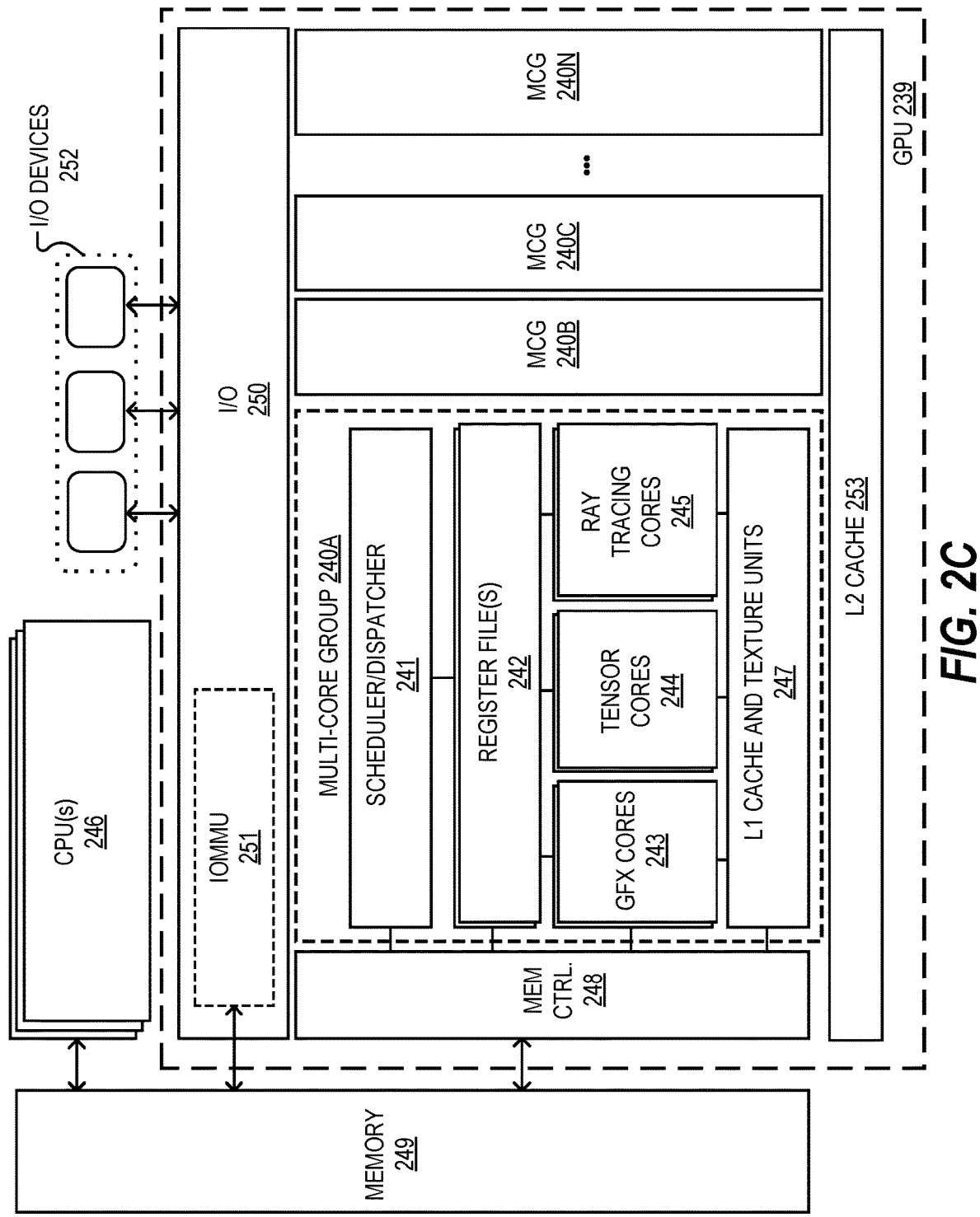

FIG. 2C illustrates a graphics processing unit (GPU) 239 that includes dedicated sets of graphics processing resources arranged into multi-core groups 240A-240N. The details of multi-core group 240A are illustrated. Multi-core groups 240B-240N may be equipped with the same or similar sets of graphics processing resources.

As illustrated, a multi-core group 240A may include a set of graphics cores 243, a set of tensor cores 244, and a set of ray tracing cores 245. A scheduler/dispatcher 241 schedules and dispatches the graphics threads for execution on the various cores 243, 244, 245. In one embodiment the tensor cores 244 are sparse tensor cores with hardware to enable multiplication operations having a zero value input to be bypassed.

A set of register files 242 can store operand values used by the cores 243, 244, 245 when executing the graphics threads. These may include, for example, integer registers for storing integer values, floating point registers for storing floating point values, vector registers for storing packed data elements (integer and/or floating point data elements) and tile registers for storing tensor/matrix values. In one embodiment, the tile registers are implemented as combined sets of vector registers.

One or more combined level 1 (L1) caches and shared memory units 247 store graphics data such as texture data, vertex data, pixel data, ray data, bounding volume data, etc., locally within each multi-core group 240A. One or more texture units 247 can also be used to perform texturing operations, such as texture mapping and sampling. A Level 2 (L2) cache 253 shared by all or a subset of the multi-core groups 240A-240N stores graphics data and/or instructions for multiple concurrent graphics threads. As illustrated, the L2 cache 253 may be shared across a plurality of multi-core groups 240A-240N. One or more memory controllers 248 couple the GPU 239 to a memory 249 which may be a system memory (e.g., DRAM) and/or a dedicated graphics memory (e.g., GDDR6 memory).

Input/output (I/O) circuitry 250 couples the GPU 239 to one or more I/O devices 252 such as digital signal processors (DSPs), network controllers, or user input devices. An on-chip interconnect may be used to couple the I/O devices 252 to the GPU 239 and memory 249. One or more I/O memory management units (IOMMUs) 251 of the I/O circuitry 250 couple the I/O devices 252 directly to the memory 249. In one embodiment, the IOMMU 251 manages multiple sets of page tables to map virtual addresses to physical addresses in memory 249. In this embodiment, the I/O devices 252, CPU(s) 246, and GPU 239 may share the same virtual address space.

In one implementation, the IOMMU 251 supports virtualization. In this case, it may manage a first set of page tables to map guest/graphics virtual addresses to guest/graphics physical addresses and a second set of page tables to map the guest/graphics physical addresses to system/host physical addresses (e.g., within memory 249). The base addresses of each of the first and second sets of page tables may be stored in control registers and swapped out on a context switch (e.g., so that the new context is provided with access to the relevant set of page tables). While not illustrated in FIG. 2C, each of the cores 243, 244, 245 and/or multi-core groups 240A-240N may include translation lookaside buffers (TLBs) to cache guest virtual to guest physical translations, guest physical to host physical translations, and guest virtual to host physical translations.

In one embodiment, the CPUs 246, GPU 239, and I/O devices 252 are integrated on a single semiconductor chip and/or chip package. The memory 249 may be integrated on the same chip or may be coupled to the memory controllers 248 via an off-chip interface. In one implementation, the memory 249 comprises GDDR6 memory which shares the same virtual address space as other physical system-level memories, although the underlying principles of the invention are not limited to this specific implementation.

In one embodiment, the tensor cores 244 include a plurality of execution units specifically designed to perform matrix operations, which are the fundamental compute operation used to perform deep learning operations. For example, simultaneous matrix multiplication operations may be used for neural network training and inferencing. The tensor cores 244 may perform matrix processing using a variety of operand precisions including single precision floating-point (e.g., 32 bits), half-precision floating point (e.g., 16 bits), integer words (16 bits), bytes (8 bits), and half-bytes (4 bits). In one embodiment, a neural network implementation extracts features of each rendered scene, potentially combining details from multiple frames, to construct a high-quality final image.

In deep learning implementations, parallel matrix multiplication work may be scheduled for execution on the tensor cores 244. The training of neural networks, in particular, requires a significant number of matrix dot product operations. In order to process an inner-product formulation of an N×N×N matrix multiply, the tensor cores 244 may include at least N dot-product processing elements. Before the matrix multiply begins, one entire matrix is loaded into tile registers and at least one column of a second matrix is loaded each cycle for N cycles. Each cycle, there are N dot products that are processed.

Matrix elements may be stored at different precisions depending on the particular implementation, including 16-bit words, 8-bit bytes (e.g., INT8) and 4-bit half-bytes (e.g., INT4). Different precision modes may be specified for the tensor cores 244 to ensure that the most efficient precision is used for different workloads (e.g., such as inferencing workloads which can tolerate quantization to bytes and half-bytes).

In one embodiment, the ray tracing cores 245 accelerate ray tracing operations for both real-time ray tracing and non-real-time ray tracing implementations. In particular, the ray tracing cores 245 include ray traversal/intersection circuitry for performing ray traversal using bounding volume hierarchies (BVHs) and identifying intersections between rays and primitives enclosed within the BVH volumes. The ray tracing cores 245 may also include circuitry for performing depth testing and culling (e.g., using a Z buffer or similar arrangement). In one implementation, the ray tracing cores 245 perform traversal and intersection operations in concert with the image denoising techniques described herein, at least a portion of which may be executed on the tensor cores 244. For example, in one embodiment, the tensor cores 244 implement a deep learning neural network to perform denoising of frames generated by the ray tracing cores 245. However, the CPU(s) 246, graphics cores 243, and/or ray tracing cores 245 may also implement all or a portion of the denoising and/or deep learning algorithms.

In addition, as described above, a distributed approach to denoising may be employed in which the GPU 239 is in a computing device coupled to other computing devices over a network or high speed interconnect. In this embodiment, the interconnected computing devices share neural network learning/training data to improve the speed with which the overall system learns to perform denoising for different types of image frames and/or different graphics applications.

In one embodiment, the ray tracing cores 245 process all BVH traversal and ray-primitive intersections, saving the graphics cores 243 from being overloaded with thousands of instructions per ray. In one embodiment, each ray tracing core 245 includes a first set of specialized circuitry for performing bounding box tests (e.g., for traversal operations) and a second set of specialized circuitry for performing the ray-triangle intersection tests (e.g., intersecting rays which have been traversed). Thus, in one embodiment, the multi-core group 240A can simply launch a ray probe, and the ray tracing cores 245 independently perform ray traversal and intersection and return hit data (e.g., a hit, no hit, multiple hits, etc.) to the thread context. The other cores 243, 244 are freed to perform other graphics or compute work while the ray tracing cores 245 perform the traversal and intersection operations.

In one embodiment, each ray tracing core 245 includes a traversal unit to perform BVH testing operations and an intersection unit which performs ray-primitive intersection tests. The intersection unit generates a "hit", "no hit", or "multiple hit" response, which it provides to the appropriate thread. During the traversal and intersection operations, the execution resources of the other cores (e.g., graphics cores 243 and tensor cores 244) are freed to perform other forms of graphics work.

In one particular embodiment described below, a hybrid rasterization/ray tracing approach is used in which work is distributed between the graphics cores 243 and ray tracing cores 245.

In one embodiment, the ray tracing cores 245 (and/or other cores 243, 244) include hardware support for a ray tracing instruction set such as Microsoft's DirectX Ray Tracing (DXR) which includes a DispatchRays command, as well as ray-generation, closest-hit, any-hit, and miss shaders, which enable the assignment of unique sets of shaders and textures for each object. Another ray tracing platform which may be supported by the ray tracing cores 245, graphics cores 243 and tensor cores 244 is Vulkan 1.1.85. Note, however, that the underlying principles of the invention are not limited to any particular ray tracing ISA.

In general, the various cores 245, 244, 243 may support a ray tracing instruction set that includes instructions/functions for ray generation, closest hit, any hit, ray-primitive intersection, per-primitive and hierarchical bounding box construction, miss, visit, and exceptions. More specifically, one embodiment includes ray tracing instructions to perform the following functions:

Ray Generation—Ray generation instructions may be executed for each pixel, sample, or other user-defined work assignment.

Closest Hit—A closest hit instruction may be executed to locate the closest intersection point of a ray with primitives within a scene.

Any Hit—An any hit instruction identifies multiple intersections between a ray and primitives within a scene, potentially to identify a new closest intersection point.

Intersection—An intersection instruction performs a ray-primitive intersection test and outputs a result.

Per-primitive Bounding box Construction—This instruction builds a bounding box around a given primitive or group of primitives (e.g., when building a new BVH or other acceleration data structure).

Miss—Indicates that a ray misses all geometry within a scene, or specified region of a scene.

Visit—Indicates the children volumes a ray will traverse.

Exceptions—Includes various types of exception handlers (e.g., invoked for various error conditions).

In one embodiment the ray tracing cores 245 may be adapted to accelerate general-purpose compute operations that can be accelerated using computational techniques that are analogous to ray intersection tests. A compute framework can be provided that enables shader programs to be compiled into low level instructions and/or primitives that perform general-purpose compute operations via the ray tracing cores. Exemplary computational problems that can benefit from compute operations performed on the ray tracing cores 245 include computations involving beam, wave, ray, or particle propagation within a coordinate space. Interactions associated with that propagation can be computed relative to a geometry or mesh within the coordinate space. For example, computations associated with electromagnetic signal propagation through an environment can be accelerated via the use of instructions or primitives that are executed via the ray tracing cores. Diffraction and reflection of the signals by objects in the environment can be computed as direct ray-tracing analogies.

Ray tracing cores 245 can also be used to perform computations that are not directly analogous to ray tracing. For example, mesh projection, mesh refinement, and volume sampling computations can be accelerated using the ray tracing cores 245. Generic coordinate space calculations, such as nearest neighbor calculations can also be performed. For example, the set of points near a given point can be discovered by defining a bounding box in the coordinate space around the point. BVH and ray probe logic within the ray tracing cores 245 can then be used to determine the set of point intersections within the bounding box. The intersections constitute the origin point and the nearest neighbors to that origin point. Computations that are performed using the ray tracing cores 245 can be performed in parallel with computations performed on the graphics cores 243 and tensor cores 244. A shader compiler can be configured to compile a compute shader or other general-purpose graphics processing program into low level primitives that can be parallelized across the graphics cores 243, tensor cores 244, and ray tracing cores 245.

Figure 2D:
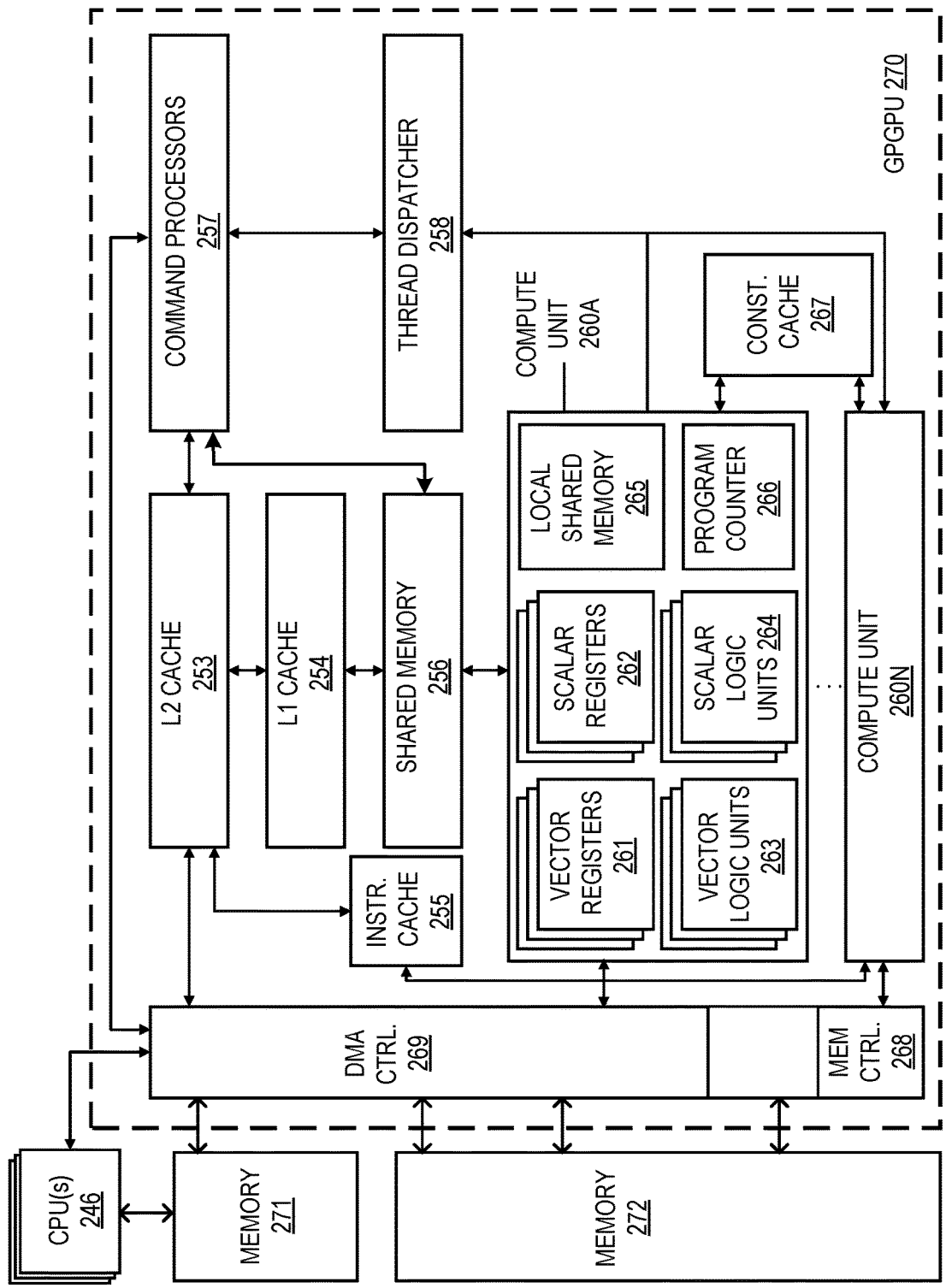

FIG. 2D is a block diagram of general purpose graphics processing unit (GPGPU) 270 that can be configured as a graphics processor and/or compute accelerator, according to embodiments described herein. The GPGPU 270 can interconnect with host processors (e.g., one or more CPU(s) 246) and memory 271, 272 via one or more system and/or memory busses. In one embodiment the memory 271 is system memory that may be shared with the one or more CPU(s) 246, while memory 272 is device memory that is dedicated to the GPGPU 270. In one embodiment, components within the GPGPU 270 and memory 272 may be mapped into memory addresses that are accessible to the one or more CPU(s) 246. Access to memory 271 and 272 may be facilitated via a memory controller 268. In one embodiment the memory controller 268 includes an internal direct memory access (DMA) controller 269 or can include logic to perform operations that would otherwise be performed by a DMA controller.

The GPGPU 270 includes multiple cache memories, including an L2 cache 253, L1 cache 254, an instruction cache 255, and shared memory 256, at least a portion of which may also be partitioned as a cache memory. The GPGPU 270 also includes multiple compute units 260A-260N. Each compute unit 260A-260N includes a set of vector registers 261, scalar registers 262, vector logic units 263, and scalar logic units 264. The compute units 260A-260N can also include local shared memory 265 and a program counter 266. The compute units 260A-260N can couple with a constant cache 267, which can be used to store constant data, which is data that will not change during the run of kernel or shader program that executes on the GPGPU 270. In one embodiment the constant cache 267 is a scalar data cache and cached data can be fetched directly into the scalar registers 262.

During operation, the one or more CPU(s) 246 can write commands into registers or memory in the GPGPU 270 that has been mapped into an accessible address space. The command processors 257 can read the commands from registers or memory and determine how those commands will be processed within the GPGPU 270. A thread dispatcher 258 can then be used to dispatch threads to the compute units 260A-260N to perform those commands. Each compute unit 260A-260N can execute threads independently of the other compute units. Additionally each compute unit 260A-260N can be independently configured for conditional computation and can conditionally output the results of computation to memory. The command processors 257 can interrupt the one or more CPU(s) 246 when the submitted commands are complete.

Figure 3A:
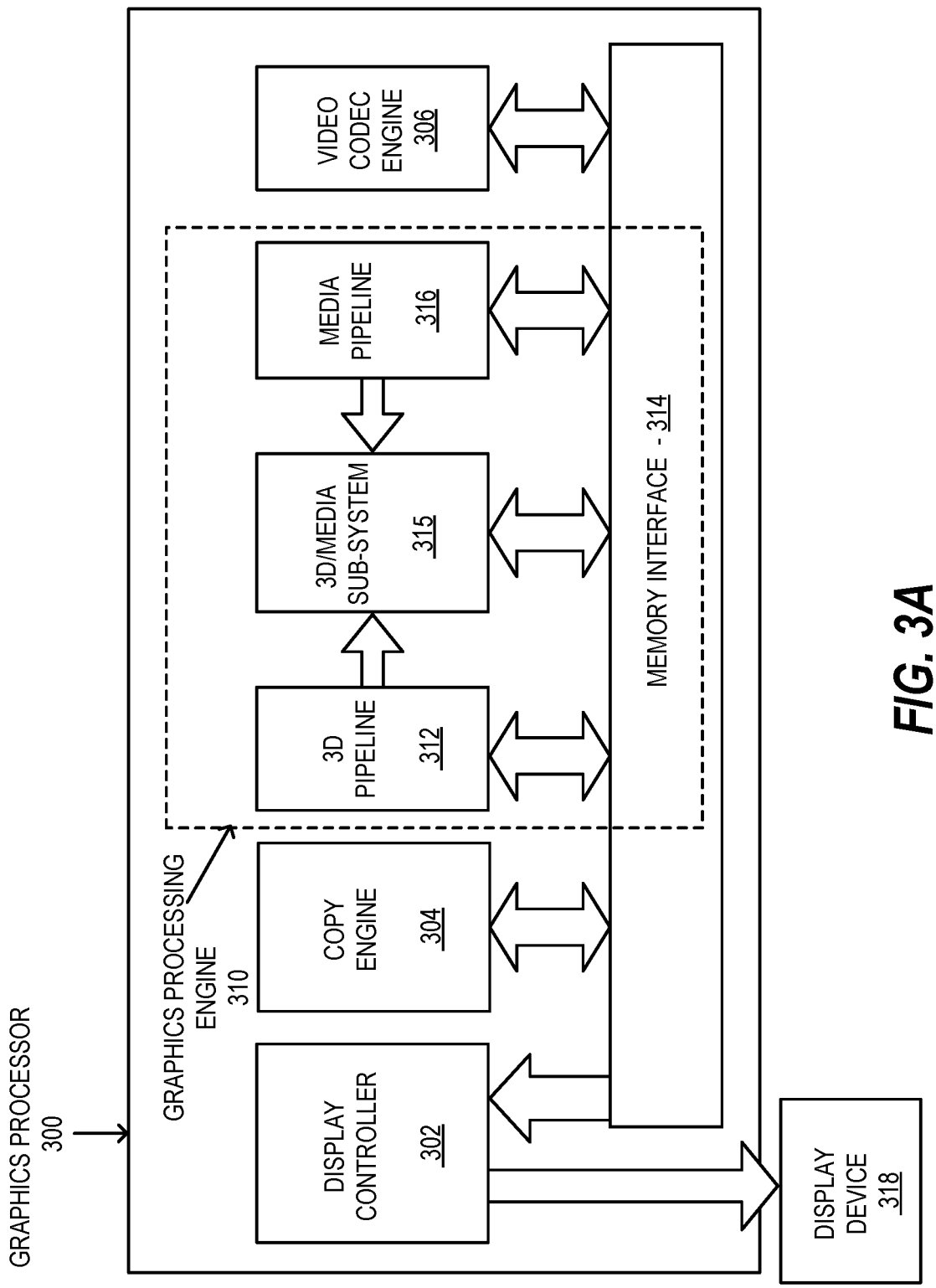
FIGS. 3A-3C illustrate block diagrams of additional graphics processor and compute accelerator architectures provided by embodiments described herein.
Figure 3B:
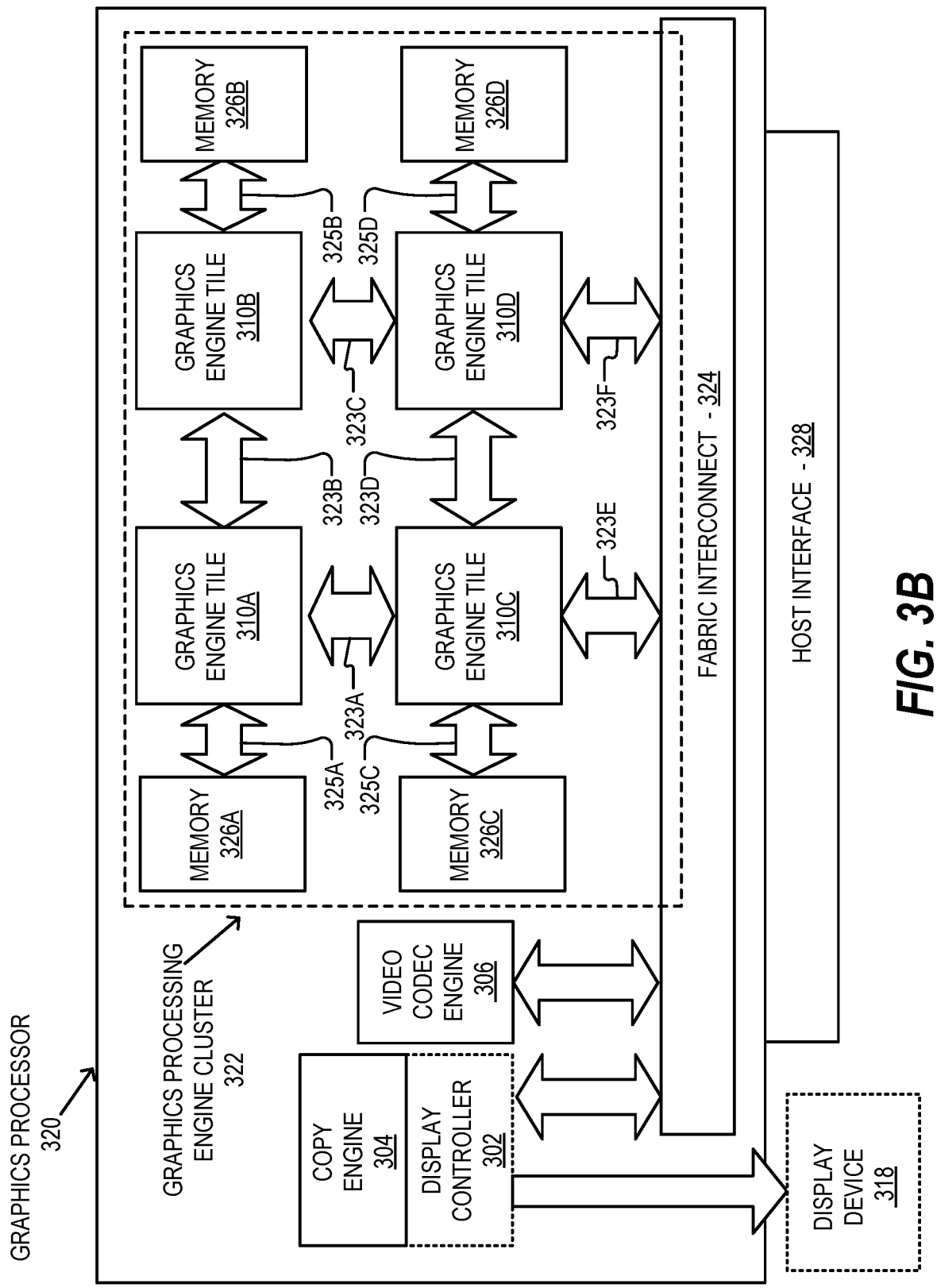
Figure 3C:
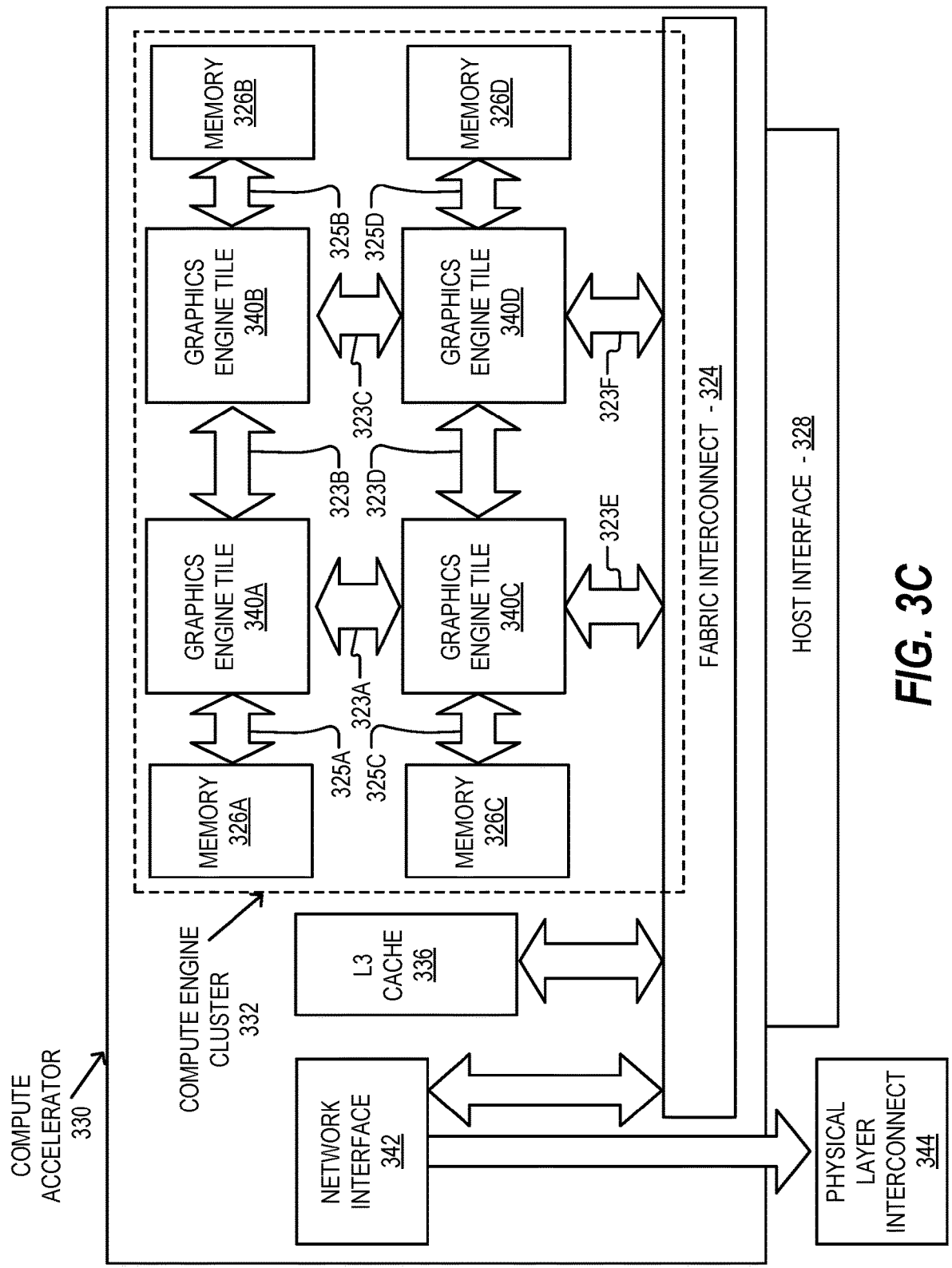

FIGS. 3A-3C illustrate block diagrams of additional graphics processor and compute accelerator architectures provided by embodiments described herein. The elements of FIGS. 3A-3C having the same reference numbers (or names) as the elements of any other figure herein can operate or function in any manner similar to that described elsewhere herein, but are not limited to such.

FIG. 3A is a block diagram of a graphics processor 300, which may be a discrete graphics processing unit, or may be a graphics processor integrated with a plurality of processing cores, or other semiconductor devices such as, but not limited to, memory devices or network interfaces. In some embodiments, the graphics processor communicates via a memory mapped I/O interface to registers on the graphics processor and with commands placed into the processor memory. In some embodiments, graphics processor 300 includes a memory interface 314 to access memory. Memory interface 314 can be an interface to local memory, one or more internal caches, one or more shared external caches, and/or to system memory.

In some embodiments, graphics processor 300 also includes a display controller 302 to drive display output data to a display device 318. Display controller 302 includes hardware for one or more overlay planes for the display and composition of multiple layers of video or user interface elements. The display device 318 can be an internal or external display device. In one embodiment the display device 318 is a head mounted display device, such as a virtual reality (VR) display device or an augmented reality (AR) display device. In some embodiments, graphics processor 300 includes a video codec engine 306 to encode, decode, or transcode media to, from, or between one or more media encoding formats, including, but not limited to Moving Picture Experts Group (MPEG) formats such as MPEG-2, Advanced Video Coding (AVC) formats such as H.264/MPEG-4 AVC, H.265/HEVC, Alliance for Open Media (AOMedia) VP8, VP9, as well as the Society of Motion Picture & Television Engineers (SMPTE) 421M/VC-1, and Joint Photographic Experts Group (JPEG) formats such as JPEG, and Motion JPEG (MJPEG) formats.

In some embodiments, graphics processor 300 includes a block image transfer (BLIT) engine 304 to perform two-dimensional (2D) rasterizer operations including, for example, bit-boundary block transfers. However, in one embodiment, 2D graphics operations are performed using one or more components of graphics processing engine (GPE) 310. In some embodiments, GPE 310 is a compute engine for performing graphics operations, including three-dimensional (3D) graphics operations and media operations.

In some embodiments, GPE 310 includes a 3D pipeline 312 for performing 3D operations, such as rendering three-dimensional images and scenes using processing functions that act upon 3D primitive shapes (e.g., rectangle, triangle, etc.). The 3D pipeline 312 includes programmable and fixed function elements that perform various tasks within the element and/or spawn execution threads to a 3D/Media subsystem 315. While 3D pipeline 312 can be used to perform media operations, an embodiment of GPE 310 also includes a media pipeline 316 that is specifically used to perform media operations, such as video post-processing and image enhancement.

In some embodiments, media pipeline 316 includes fixed function or programmable logic units to perform one or more specialized media operations, such as video decode acceleration, video de-interlacing, and video encode acceleration in place of, or on behalf of video codec engine 306. In some embodiments, media pipeline 316 additionally includes a thread spawning unit to spawn threads for execution on 3D/Media subsystem 315. The spawned threads perform computations for the media operations on one or more graphics execution units included in 3D/Media subsystem 315.

In some embodiments, 3D/Media subsystem 315 includes logic for executing threads spawned by 3D pipeline 312 and media pipeline 316. In one embodiment, the pipelines send thread execution requests to 3D/Media subsystem 315, which includes thread dispatch logic for arbitrating and dispatching the various requests to available thread execution resources. The execution resources include an array of graphics execution units to process the 3D and media threads. In some embodiments, 3D/Media subsystem 315 includes one or more internal caches for thread instructions and data. In some embodiments, the subsystem also includes shared memory, including registers and addressable memory, to share data between threads and to store output data.

FIG. 3B illustrates a graphics processor 320 having a tiled architecture, according to embodiments described herein. In one embodiment the graphics processor 320 includes a graphics processing engine cluster 322 having multiple instances of the graphics processing engine 310 of FIG. 3A within a graphics engine tile 310A-310D. Each graphics engine tile 310A-310D can be interconnected via a set of tile interconnects 323A-323F. Each graphics engine tile 310A-310D can also be connected to a memory module or memory device 326A-326D via memory interconnects 325A-325D. The memory devices 326A-326D can use any graphics memory technology. For example, the memory devices 326A-326D may be graphics double data rate (GDDR) memory. The memory devices 326A-326D, in one embodiment, are high-bandwidth memory (HBM) modules that can be on-die with their respective graphics engine tile 310A-310D. In one embodiment the memory devices 326A-326D are stacked memory devices that can be stacked on top of their respective graphics engine tile 310A-310D. In one embodiment, each graphics engine tile 310A-310D and associated memory 326A-326D reside on separate chiplets, which are bonded to a base die or base substrate, as described on further detail in FIGS. 11B-11D.

The graphics processor 320 may be configured with a non-uniform memory access (NUMA) system in which memory devices 326A-326D are coupled with associated graphics engine tiles 310A-310D. A given memory device may be accessed by graphics engine tiles other than the tile to which it is directly connected. However, access latency to the memory devices 326A-326D may be lowest when accessing a local tile. In one embodiment, a cache coherent NUMA (ccNUMA) system is enabled that uses the tile interconnects 323A-323F to enable communication between cache controllers within the graphics engine tiles 310A-310D to maintain a consistent memory image when more than one cache stores the same memory location.

The graphics processing engine cluster 322 can connect with an on-chip or on-package fabric interconnect 324. In one embodiment the fabric interconnect 324 includes a network processor, network on a chip (NoC), or another switching processor to enable the fabric interconnect 324 to act as a packet switched fabric interconnect that switches data packets between components of the graphics processor 320. The fabric interconnect 324 can enable communication between graphics engine tiles 310A-310D and components such as the video codec engine 306 and one or more copy engines 304. The copy engines 304 can be used to move data out of, into, and between the memory devices 326A-326D and memory that is external to the graphics processor 320 (e.g., system memory). The fabric interconnect 324 can also couple with one or more of the tile interconnects 323A-323F to facilitate or enhance the interconnection between the graphics engine tiles 310A-310D. The fabric interconnect 324 is also configurable to interconnect multiple instances of the graphics processor 320 (e.g., via the host interface 328), enabling tile-to-tile communication between graphics engine tiles 310A-310D of multiple GPUs. In one embodiment, the graphics engine tiles 310A-310D of multiple GPUs can be presented to a host system as a single logical device.

The graphics processor 320 may optionally include a display controller 302 to enable a connection with the display device 318. The graphics processor may also be configured as a graphics or compute accelerator. In the accelerator configuration, the display controller 302 and display device 318 may be omitted.

The graphics processor 320 can connect to a host system via a host interface 328. The host interface 328 can enable communication between the graphics processor 320, system memory, and/or other system components. The host interface 328 can be, for example a PCI express bus or another type of host system interface. For example, the host interface 328 may be an NVLink or NVSwitch interface. The host interface 328 and fabric interconnect 324 can cooperate to enable multiple instances of the graphics processor 320 to act as single logical device. Cooperation between the host interface 328 and fabric interconnect 324 can also enable the individual graphics engine tiles 310A-310D to be presented to the host system as distinct logical graphics devices.

FIG. 3C illustrates a compute accelerator 330, according to embodiments described herein. The compute accelerator 330 can include architectural similarities with the graphics processor 320 of FIG. 3B and is optimized for compute acceleration. A compute engine cluster 332 can include a set of compute engine tiles 340A-340D that include execution logic that is optimized for parallel or vector-based general-purpose compute operations. In some embodiments, the compute engine tiles 340A-340D do not include fixed function graphics processing logic, although in one embodiment one or more of the compute engine tiles 340A-340D can include logic to perform media acceleration. The compute engine tiles 340A-340D can connect to memory 326A-326D via memory interconnects 325A-325D. The memory 326A-326D and memory interconnects 325A-325D may be similar technology as in graphics processor 320, or can be different. The graphics compute engine tiles 340A-340D can also be interconnected via a set of tile interconnects 323A-323F and may be connected with and/or interconnected by a fabric interconnect 324. Cross-tile communications can be facilitated via the fabric interconnect 324. The fabric interconnect 324 (e.g., via the host interface 328) can also facilitate communication between compute engine tiles 340A-340D of multiple instances of the compute accelerator 330. In one embodiment the compute accelerator 330 includes a large L3 cache 336 that can be configured as a device-wide cache. The compute accelerator 330 can also connect to a host processor and memory via a host interface 328 in a similar manner as the graphics processor 320 of FIG. 3B.

The compute accelerator 330 can also include an integrated network interface 342. In one embodiment the network interface 342 includes a network processor and controller logic that enables the compute engine cluster 332 to communicate over a physical layer interconnect 344 without requiring data to traverse memory of a host system. In one embodiment, one of the compute engine tiles 340A-340D is replaced by network processor logic and data to be transmitted or received via the physical layer interconnect 344 may be transmitted directly to or from memory 326A-326D. Multiple instances of the compute accelerator 330 may be joined via the physical layer interconnect 344 into a single logical device. Alternatively, the various compute engine tiles 340A-340D may be presented as distinct network accessible compute accelerator devices.

Graphics Processing Engine

FIG. 4 is a block diagram of a graphics processing engine 410 of a graphics processor in accordance with some embodiments. In one embodiment, the graphics processing engine (GPE) 410 is a version of the GPE 310 shown in FIG. 3A, and may also represent a graphics engine tile 310A-310D of FIG. 3B. Elements of FIG. 4 having the same reference numbers (or names) as the elements of any other figure herein can operate or function in any manner similar to that described elsewhere herein, but are not limited to such. For example, the 3D pipeline 312 and media pipeline 316 of FIG. 3A are illustrated. The media pipeline 316 is optional in some embodiments of the GPE 410 and may not be explicitly included within the GPE 410. For example and in at least one embodiment, a separate media and/or image processor is coupled to the GPE 410.

In some embodiments, GPE 410 couples with or includes a command streamer 403, which provides a command stream to the 3D pipeline 312 and/or media pipelines 316. Alternatively or additionally, the command streamer 403 may be directly coupled to a unified return buffer 418. The unified return buffer 418 may be communicatively coupled to a graphics core array 414. In some embodiments, command streamer 403 is coupled with memory, which can be system memory, or one or more of internal cache memory and shared cache memory. In some embodiments, command streamer 403 receives commands from the memory and sends the commands to 3D pipeline 312 and/or media pipeline 316. The commands are directives fetched from a ring buffer, which stores commands for the 3D pipeline 312 and media pipeline 316. In one embodiment, the ring buffer can additionally include batch command buffers storing batches of multiple commands. The commands for the 3D pipeline 312 can also include references to data stored in memory, such as but not limited to vertex and geometry data for the 3D pipeline 312 and/or image data and memory objects for the media pipeline 316. The 3D pipeline 312 and media pipeline 316 process the commands and data by performing operations via logic within the respective pipelines or by dispatching one or more execution threads to a graphics core array 414. In one embodiment the graphics core array 414 include one or more blocks of graphics cores (e.g., graphics core(s) 415A, graphics core(s) 415B), each block including one or more graphics cores. Each graphics core includes a set of graphics execution resources that includes general-purpose and graphics specific execution logic to perform graphics and compute operations, as well as fixed function texture processing and/or machine learning and artificial intelligence acceleration logic.

In various embodiments the 3D pipeline 312 can include fixed function and programmable logic to process one or more shader programs, such as vertex shaders, geometry shaders, pixel shaders, fragment shaders, compute shaders, or other shader and/or GPGPU programs, by processing the instructions and dispatching execution threads to the graphics core array 414. The graphics core array 414 provides a unified block of execution resources for use in processing these shader programs. Multi-purpose execution logic (e.g., execution units) within the graphics core(s) 415A-414B of the graphics core array 414 includes support for various 3D API shader languages and can execute multiple simultaneous execution threads associated with multiple shaders.

In some embodiments, the graphics core array 414 includes execution logic to perform media functions, such as video and/or image processing. In one embodiment, the execution units include general-purpose logic that is programmable to perform parallel general-purpose computational operations, in addition to graphics processing operations. The general-purpose logic can perform processing operations in parallel or in conjunction with general-purpose logic within the processor core(s) 107 of FIG. 1 or core 202A-202N as in FIG. 2A.

Output data generated by threads executing on the graphics core array 414 can output data to memory in a unified return buffer (URB) 418. The URB 418 can store data for multiple threads. In some embodiments the URB 418 may be used to send data between different threads executing on the graphics core array 414. In some embodiments the URB 418 may additionally be used for synchronization between threads on the graphics core array and fixed function logic within the shared function logic 420.

In some embodiments, graphics core array 414 is scalable, such that the array includes a variable number of graphics cores, each having a variable number of execution units based on the target power and performance level of GPE 410. In one embodiment the execution resources are dynamically scalable, such that execution resources may be enabled or disabled as needed.

The graphics core array 414 couples with shared function logic 420 that includes multiple resources that are shared between the graphics cores in the graphics core array. The shared functions within the shared function logic 420 are hardware logic units that provide specialized supplemental functionality to the graphics core array 414. In various embodiments, shared function logic 420 includes but is not limited to sampler 421, math 422, and inter-thread communication (ITC) 423 logic. Additionally, some embodiments implement one or more cache(s) 425 within the shared function logic 420.

A shared function is implemented at least in a case where the demand for a given specialized function is insufficient for inclusion within the graphics core array 414. Instead a single instantiation of that specialized function is implemented as a stand-alone entity in the shared function logic 420 and shared among the execution resources within the graphics core array 414. The precise set of functions that are shared between the graphics core array 414 and included within the graphics core array 414 varies across embodiments. In some embodiments, specific shared functions within the shared function logic 420 that are used extensively by the graphics core array 414 may be included within shared function logic 416 within the graphics core array 414. In various embodiments, the shared function logic 416 within the graphics core array 414 can include some or all logic within the shared function logic 420. In one embodiment, all logic elements within the shared function logic 420 may be duplicated within the shared function logic 416 of the graphics core array 414. In one embodiment the shared function logic 420 is excluded in favor of the shared function logic 416 within the graphics core array 414.

Execution Units

Figure 5A:
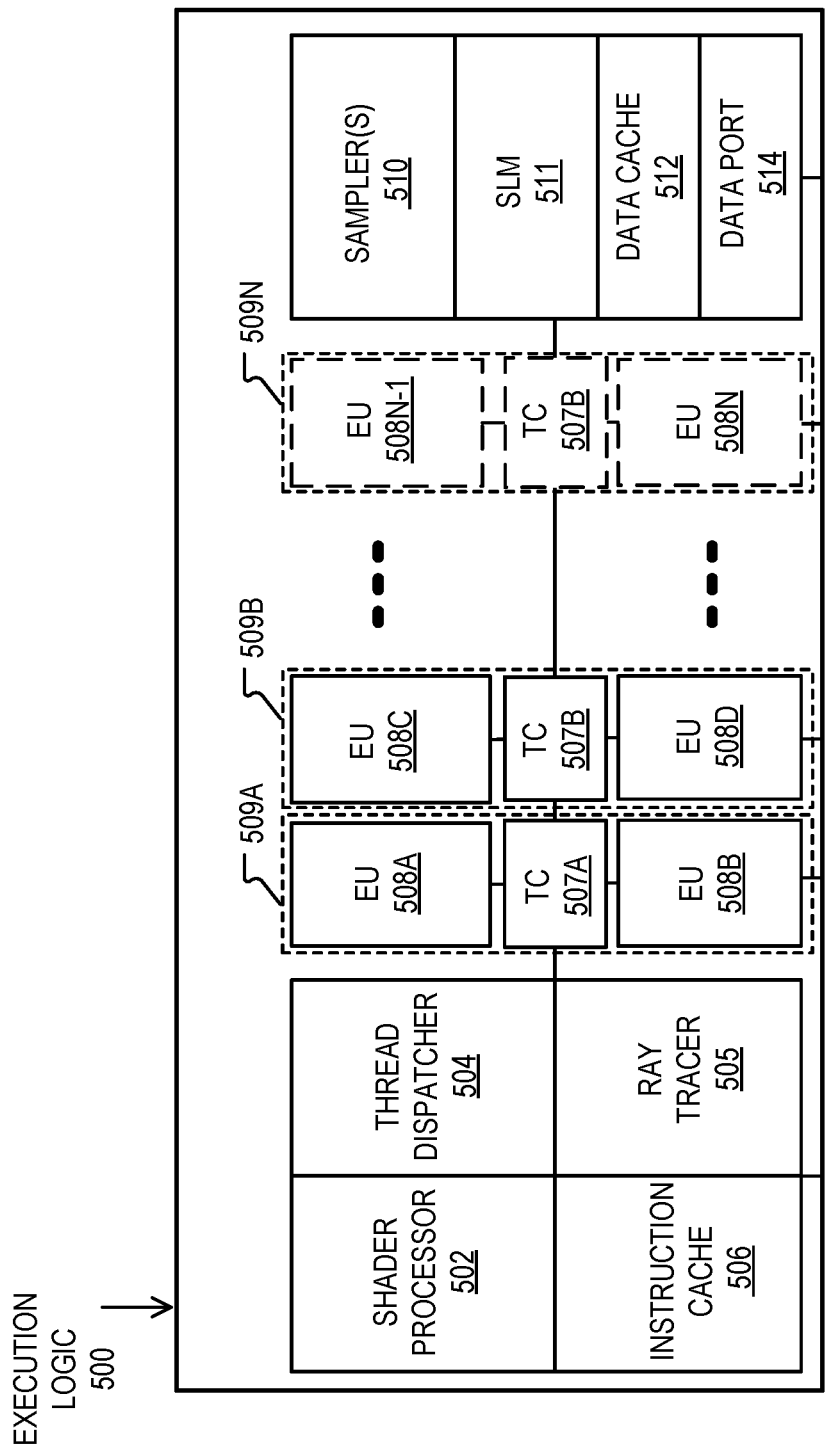
FIGS. 5A-5B illustrate thread execution logic including an array of processing elements employed in a graphics processor core according to embodiments described herein.
Figure 5B:
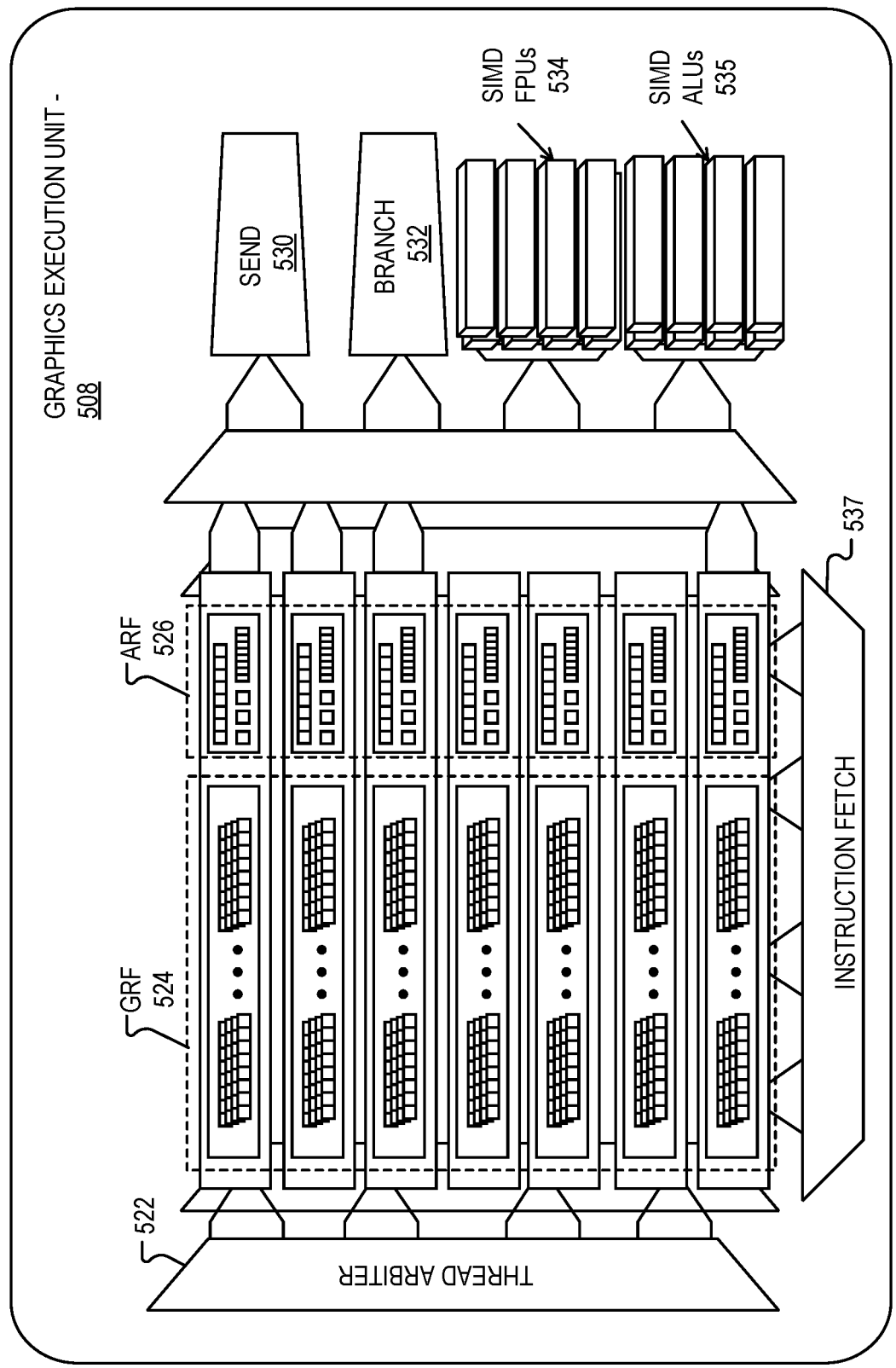

FIGS. 5A-5B illustrate thread execution logic 500 including an array of processing elements employed in a graphics processor core according to embodiments described herein. Elements of FIGS. 5A-5B having the same reference numbers (or names) as the elements of any other figure herein can operate or function in any manner similar to that described elsewhere herein, but are not limited to such. FIG. 5A-5B illustrates an overview of thread execution logic 500, which may be representative of hardware logic illustrated with each sub-core 221A-221F of FIG. 2B. FIG. 5A is representative of an execution unit within a general-purpose graphics processor, while FIG. 5B is representative of an execution unit that may be used within a compute accelerator.

As illustrated in FIG. 5A, in some embodiments thread execution logic 500 includes a shader processor 502, a thread dispatcher 504, instruction cache 506, a scalable execution unit array including a plurality of graphics execution units 508A-508N, a sampler 510, shared local memory 511, a data cache 512, and a data port 514. In one embodiment the scalable execution unit array can dynamically scale by enabling or disabling one or more execution units (e.g., any of graphics execution units 508A, 508B, 508C, 508D, through 508N-1 and 508N) based on the computational requirements of a workload. In one embodiment the included components are interconnected via an interconnect fabric that links to each of the components. In some embodiments, thread execution logic 500 includes one or more connections to memory, such as system memory or cache memory, through one or more of instruction cache 506, data port 514, sampler 510, and graphics execution units 508A-508N. In some embodiments, each execution unit (e.g. 508A) is a stand-alone programmable general-purpose computational unit that is capable of executing multiple simultaneous hardware threads while processing multiple data elements in parallel for each thread. In various embodiments, the array of graphics execution units 508A-508N is scalable to include any number individual execution units.

In some embodiments, the graphics execution units 508A-508N are primarily used to execute shader programs. A shader processor 502 can process the various shader programs and dispatch execution threads associated with the shader programs via a thread dispatcher 504. In one embodiment the thread dispatcher includes logic to arbitrate thread initiation requests from the graphics and media pipelines and instantiate the requested threads on one or more execution unit in the graphics execution units 508A-508N. For example, a geometry pipeline can dispatch vertex, tessellation, or geometry shaders to the thread execution logic for processing. In some embodiments, thread dispatcher 504 can also process runtime thread spawning requests from the executing shader programs.

In some embodiments, the graphics execution units 508A-508N support an instruction set that includes native support for many standard 3D graphics shader instructions, such that shader programs from graphics libraries (e.g., Direct 3D and OpenGL) are executed with a minimal translation. The execution units support vertex and geometry processing (e.g., vertex programs, geometry programs, vertex shaders), pixel processing (e.g., pixel shaders, fragment shaders) and general-purpose processing (e.g., compute and media shaders). Each of the execution units 508A-508N is capable of multi-issue single instruction multiple data (SIMD) execution and multi-threaded operation enables an efficient execution environment in the face of higher latency memory accesses. Each hardware thread within each execution unit has a dedicated high-bandwidth register file and associated independent thread-state. Execution is multi-issue per clock to pipelines capable of integer, single and double precision floating point operations, SIMD branch capability, logical operations, transcendental operations, and other miscellaneous operations. While waiting for data from memory or one of the shared functions, dependency logic within the graphics execution units 508A-508N causes a waiting thread to sleep until the requested data has been returned. While the waiting thread is sleeping, hardware resources may be devoted to processing other threads. For example, during a delay associated with a vertex shader operation, an execution unit can perform operations for a pixel shader, fragment shader, or another type of shader program, including a different vertex shader. Various embodiments can apply to use execution by use of Single Instruction Multiple Thread (SIMT) as an alternate to use of SIMD or in addition to use of SIMD. Reference to a SIMD core or operation can apply also to SIMT or apply to SIMD in combination with SIMT.

Each execution unit in graphics execution units 508A-508N operates on arrays of data elements. The number of data elements is the "execution size," or the number of channels for the instruction. An execution channel is a logical unit of execution for data element access, masking, and flow control within instructions. The number of channels may be independent of the number of physical Arithmetic Logic Units (ALUs), Floating Point Units (FPUs), or other logic units (e.g., tensor cores, ray tracing cores, etc.) for a particular graphics processor. In some embodiments, graphics execution units 508A-508N support integer and floating-point data types.

The execution unit instruction set includes SIMD instructions. The various data elements can be stored as a packed data type in a register and the execution unit will process the various elements based on the data size of the elements. For example, when operating on a 256-bit wide vector, the 256 bits of the vector are stored in a register and the execution unit operates on the vector as four separate 54-bit packed data elements (Quad-Word (QW) size data elements), eight separate 32-bit packed data elements (Double Word (DW) size data elements), sixteen separate 16-bit packed data elements (Word (W) size data elements), or thirty-two separate 8-bit data elements (byte (B) size data elements). However, different vector widths and register sizes are possible.

In one embodiment one or more execution units can be combined into a fused execution unit 509A-509N having thread control logic (507A-507N) that is common to the fused EUs. Multiple EUs can be fused into an EU group. Each EU in the fused EU group can be configured to execute a separate SIMD hardware thread. The number of EUs in a fused EU group can vary according to embodiments. Additionally, various SIMD widths can be performed per-EU, including but not limited to SIMD8, SIMD16, and SIMD32. Each fused graphics execution unit 509A-509N includes at least two execution units. For example, fused execution unit 509A includes a first EU 508A, second EU 508B, and thread control logic 507A that is common to the first EU 508A and the second EU 508B. The thread control logic 507A controls threads executed on the fused graphics execution unit 509A, allowing each EU within the fused execution units 509A-509N to execute using a common instruction pointer register.

One or more internal instruction caches (e.g., 506) are included in the thread execution logic 500 to cache thread instructions for the execution units. In some embodiments, one or more data caches (e.g., 512) are included to cache thread data during thread execution. Threads executing on the execution logic 500 can also store explicitly managed data in the shared local memory 511. In some embodiments, a sampler 510 is included to provide texture sampling for 3D operations and media sampling for media operations. In some embodiments, sampler 510 includes specialized texture or media sampling functionality to process texture or media data during the sampling process before providing the sampled data to an execution unit.

During execution, the graphics and media pipelines send thread initiation requests to thread execution logic 500 via thread spawning and dispatch logic. Once a group of geometric objects has been processed and rasterized into pixel data, pixel processor logic (e.g., pixel shader logic, fragment shader logic, etc.) within the shader processor 502 is invoked to further compute output information and cause results to be written to output surfaces (e.g., color buffers, depth buffers, stencil buffers, etc.). In some embodiments, a pixel shader or fragment shader calculates the values of the various vertex attributes that are to be interpolated across the rasterized object. In some embodiments, pixel processor logic within the shader processor 502 then executes an application programming interface (API)-supplied pixel or fragment shader program. To execute the shader program, the shader processor 502 dispatches threads to an execution unit (e.g., 508A) via thread dispatcher 504. In some embodiments, shader processor 502 uses texture sampling logic in the sampler 510 to access texture data in texture maps stored in memory. Arithmetic operations on the texture data and the input geometry data compute pixel color data for each geometric fragment, or discards one or more pixels from further processing.

In some embodiments, the data port 514 provides a memory access mechanism for the thread execution logic 500 to output processed data to memory for further processing on a graphics processor output pipeline. In some embodiments, the data port 514 includes or couples to one or more cache memories (e.g., data cache 512) to cache data for memory access via the data port.

In one embodiment, the execution logic 500 can also include a ray tracer 505 that can provide ray tracing acceleration functionality. The ray tracer 505 can support a ray tracing instruction set that includes instructions/functions for ray generation. The ray tracing instruction set can be similar to or different from the ray-tracing instruction set supported by the ray tracing cores 245 in FIG. 2C.

FIG. 5B illustrates exemplary internal details of an execution unit 508, according to embodiments. A graphics execution unit 508 can include an instruction fetch unit 537, a general register file array (GRF) 524, an architectural register file array (ARF) 526, a thread arbiter 522, a send unit 530, a branch unit 532, a set of SIMD floating point units (FPUs) 534, and in one embodiment a set of dedicated integer SIMD ALUs 535. The GRF 524 and ARF 526 includes the set of general register files and architecture register files associated with each simultaneous hardware thread that may be active in the graphics execution unit 508. In one embodiment, per thread architectural state is maintained in the ARF 526, while data used during thread execution is stored in the GRF 524. The execution state of each thread, including the instruction pointers for each thread, can be held in thread-specific registers in the ARF 526.

In one embodiment the graphics execution unit 508 has an architecture that is a combination of Simultaneous Multi-Threading (SMT) and fine-grained Interleaved Multi-Threading (IMT). The architecture has a modular configuration that can be fine-tuned at design time based on a target number of simultaneous threads and number of registers per execution unit, where execution unit resources are divided across logic used to execute multiple simultaneous threads. The number of logical threads that may be executed by the graphics execution unit 508 is not limited to the number of hardware threads, and multiple logical threads can be assigned to each hardware thread.

In one embodiment, the graphics execution unit 508 can co-issue multiple instructions, which may each be different instructions. The thread arbiter 522 of the graphics execution unit thread 508 can dispatch the instructions to one of the send unit 530, branch unit 532, or SIMD FPU(s) 534 for execution. Each execution thread can access 128 general-purpose registers within the GRF 524, where each register can store 32 bytes, accessible as a SIMD 8-element vector of 32-bit data elements. In one embodiment, each execution unit thread has access to 4 Kbytes within the GRF 524, although embodiments are not so limited, and greater or fewer register resources may be provided in other embodiments. In one embodiment the graphics execution unit 508 is partitioned into seven hardware threads that can independently perform computational operations, although the number of threads per execution unit can also vary according to embodiments. For example, in one embodiment up to 16 hardware threads are supported. In an embodiment in which seven threads may access 4 Kbytes, the GRF 524 can store a total of 28 Kbytes. Where 16 threads may access 4 Kbytes, the GRF 524 can store a total of 64 Kbytes. Flexible addressing modes can permit registers to be addressed together to build effectively wider registers or to represent strided rectangular block data structures.

In one embodiment, memory operations, sampler operations, and other longer-latency system communications are dispatched via "send" instructions that are executed by the message passing send unit 530. In one embodiment, branch instructions are dispatched to a dedicated branch unit 532 to facilitate SIMD divergence and eventual convergence.

In one embodiment the graphics execution unit 508 includes one or more SIMD floating point units (FPU(s)) 534 to perform floating-point operations. In one embodiment, the FPU(s) 534 also support integer computation. In one embodiment the FPU(s) 534 can SIMD execute up to M number of 32-bit floating-point (or integer) operations, or SIMD execute up to 2M 16-bit integer or 16-bit floating-point operations. In one embodiment, at least one of the FPU(s) provides extended math capability to support high-throughput transcendental math functions and double precision 54-bit floating-point. In some embodiments, a set of 8-bit integer SIMD ALUs 535 are also present, and may be specifically optimized to perform operations associated with machine learning computations.

In one embodiment, arrays of multiple instances of the graphics execution unit 508 can be instantiated in a graphics sub-core grouping (e.g., a sub-slice). For scalability, product architects can choose the exact number of execution units per sub-core grouping. In one embodiment the execution unit 508 can execute instructions across a plurality of execution channels. In a further embodiment, each thread executed on the graphics execution unit 508 is executed on a different channel.

Figure 6:
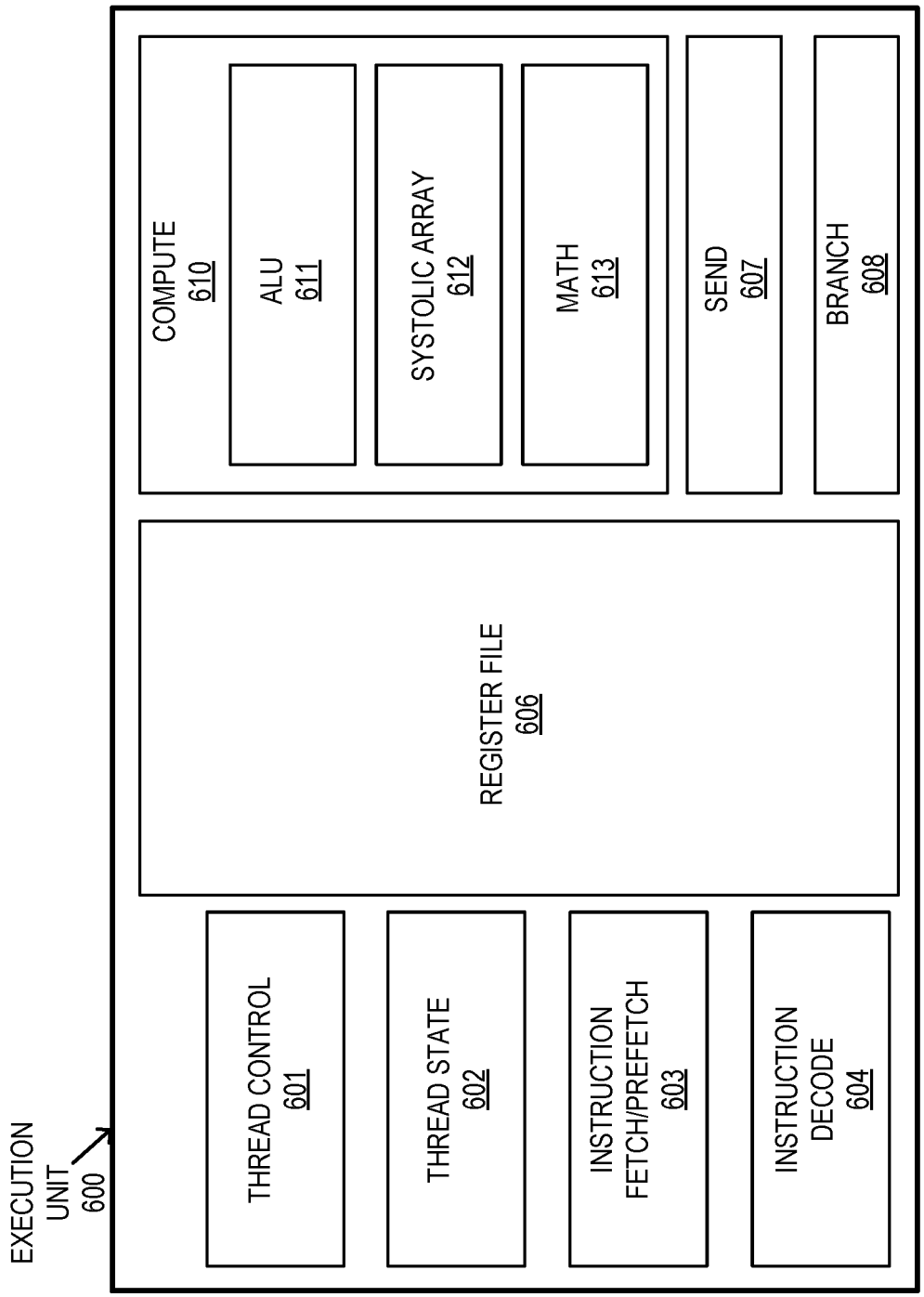
FIG. 6 illustrates an additional execution unit, according to an embodiment.

FIG. 6 illustrates an additional execution unit 600, according to an embodiment. The execution unit 600 may be a compute-optimized execution unit for use in, for example, a compute engine tile 340A-340D as in FIG. 3C, but is not limited as such. Variants of the execution unit 600 may also be used in a graphics engine tile 310A-310D as in FIG. 3B. In one embodiment, the execution unit 600 includes a thread control unit 601, a thread state unit 602, an instruction fetch/prefetch unit 603, and an instruction decode unit 604. The execution unit 600 additionally includes a register file 606 that stores registers that can be assigned to hardware threads within the execution unit. The execution unit 600 additionally includes a send unit 607 and a branch unit 608. In one embodiment, the send unit 607 and branch unit 608 can operate similarly as the send unit 530 and a branch unit 532 of the graphics execution unit 508 of FIG. 5B.

The execution unit 600 also includes a compute unit 610 that includes multiple different types of functional units. The compute unit 610 can include an ALU 611, a systolic array 612, and a math unit 613. The ALU 611 includes an array of arithmetic logic units. The ALU 611 can be configured to perform 64-bit, 32-bit, and 16-bit integer and floating point operations across multiple processing lanes and data channels and for multiple hardware and/or software threads. The ALU 611 can perform integer and floating point operations simultaneously (e.g., within the same clock cycle).

The systolic array 612 includes a W wide and D deep network of data processing units that can be used to perform vector or other data-parallel operations in a systolic manner. In one embodiment the systolic array 612 can be configured to perform various matrix operations, including as dot product, outer product, and general matrix-matrix multiplication (GEMM) operations. In one embodiment the systolic array 612 supports 16-bit floating point operations, as well as 8-bit, 4-bit, 2-bit, and binary integer operations. The systolic array 612 can be configured to accelerate specific machine learning operations, in addition to matrix multiply operations. In such embodiments, the systolic array 612 can be configured with support for the bfloat (brain floating point) 16-bit floating point format or a tensor float 32-bit floating point format (TF32) that have different numbers of mantissa and exponent bits relative to Institute of Electrical and Electronics Engineers (IEEE) 754 formats.

The systolic array 612 includes hardware to accelerate sparse matrix operations. In one embodiment, multiplication operations for sparse regions of input data can be bypassed at the processing element level by skipping multiply operations that have a zero value operand. In on embodiment, sparsity within input matrices can be detected and operations having known output values can be bypassed before being submitted to the processing elements of the systolic array 612. Additionally, the loading of zero value operands into the processing elements can be bypassed and the processing elements can be configured to perform multiplications on the non-zero value input elements. Output can be generated in a compressed (e.g., dense) format, with associated decompression or decoding metadata. The output can be cached in the compressed format. The output can be maintained in the compressed format when written to local memory or host system memory. The output may also be decompressed before being written to local memory or host system memory.

In one embodiment, the systolic array 612 includes hardware to enable operations on sparse data having a compressed representation. A compressed representation of a sparse matrix stores non-zero values and metadata that identifies the positions of the non-zero values within the matrix. Exemplary compressed representations include but are not limited to compressed tensor representations such as compressed sparse row (CSR), compressed sparse column (CSC), compressed sparse fiber (CSF) representations. Support for compressed representations enable operations to be performed on input in a compressed tensor format without requiring the compressed representation to be decompressed or decoded. In such embodiment, operations can be performed only on non-zero input values and the resulting non-zero output values can be mapped into an output matrix. In some embodiments, hardware support is also provided for machine-specific lossless data compression formats that are used when transmitting data within hardware or across system busses. Such data may be retained in a compressed format for sparse input data and the systolic array 612 can used the compression metadata for the compressed data to enable operations to be performed on only non-zero values, or to enable blocks of zero data input to be bypassed for multiply operations.

In one embodiment, a math unit 613 can be included to perform a specific subset of mathematical operations in an efficient and lower-power manner than the ALU 611. The math unit 613 can include a variant of math logic that may be found in shared function logic of a graphics processing engine provided by other embodiments (e.g., math logic 422 of the shared function logic 420 of FIG. 4). In one embodiment the math unit 613 can be configured to perform 32-bit and 64-bit floating point operations.

The thread control unit 601 includes logic to control the execution of threads within the execution unit. The thread control unit 601 can include thread arbitration logic to start, stop, and preempt execution of threads within the execution unit 600. The thread state unit 602 can be used to store thread state for threads assigned to execute on the execution unit 600. Storing the thread state within the execution unit 600 enables the rapid pre-emption of threads when those threads become blocked or idle. The instruction fetch/prefetch unit 603 can fetch instructions from an instruction cache of higher-level execution logic (e.g., instruction cache 506 as in FIG. 5A). The instruction fetch/prefetch unit 603 can also issue prefetch requests for instructions to be loaded into the instruction cache based on an analysis of currently executing threads. The instruction decode unit 604 can be used to decode instructions to be executed by the compute units. In one embodiment, the instruction decode unit 604 can be used as a secondary decoder to decode complex instructions into constituent micro-operations.

The execution unit 600 additionally includes a register file 606 that can be used by hardware threads executing on the execution unit 600. Registers in the register file 606 can be divided across the logic used to execute multiple simultaneous threads within the compute unit 610 of the execution unit 600. The number of logical threads that may be executed by the graphics execution unit 600 is not limited to the number of hardware threads, and multiple logical threads can be assigned to each hardware thread. The size of the register file 606 can vary across embodiments based on the number of supported hardware threads. In one embodiment, register renaming may be used to dynamically allocate registers to hardware threads.

FIG. 7 is a block diagram illustrating graphics processor instruction formats 700 according to some embodiments. In one or more embodiment, the graphics processor execution units support an instruction set having instructions in multiple formats. The solid lined boxes illustrate the components that are generally included in an execution unit instruction, while the dashed lines include components that are optional or that are only included in a sub-set of the instructions. In some embodiments, the graphics processor instruction format 700 described and illustrated are macro-instructions, in that they are instructions supplied to the execution unit, as opposed to micro-operations resulting from instruction decode once the instruction is processed. Thus, a single instructions may cause hardware to perform multiple micro-operations.

In some embodiments, the graphics processor execution units natively support instructions in a 128-bit instruction format 710. A 64-bit compacted instruction format 730 is available for some instructions based on the selected instruction, instruction options, and number of operands. The native 128-bit instruction format 710 provides access to all instruction options, while some options and operations are restricted in the 64-bit format 730. The native instructions available in the 64-bit format 730 vary by embodiment. In some embodiments, the instruction is compacted in part using a set of index values in an index field 713. The execution unit hardware references a set of compaction tables based on the index values and uses the compaction table outputs to reconstruct a native instruction in the 128-bit instruction format 710. Other sizes and formats of instruction can be used.

For each format, instruction opcode 712 defines the operation that the execution unit is to perform. The execution units execute each instruction in parallel across the multiple data elements of each operand. For example, in response to an add instruction the execution unit performs a simultaneous add operation across each color channel representing a texture element or picture element. By default, the execution unit performs each instruction across all data channels of the operands. In some embodiments, instruction control field 714 enables control over certain execution options, such as channels selection (e.g., predication) and data channel order (e.g., swizzle). For instructions in the 128-bit instruction format 710 an exec-size field 716 limits the number of data channels that will be executed in parallel. In some embodiments, exec-size field 716 is not available for use in the 64-bit compact instruction format 730.

Some execution unit instructions have up to three operands including two source operands, src0 720, src1 722, and one destination 718. In some embodiments, the execution units support dual destination instructions, where one of the destinations is implied. Data manipulation instructions can have a third source operand (e.g., SRC2 724), where the instruction opcode 712 determines the number of source operands. An instruction's last source operand can be an immediate (e.g., hard-coded) value passed with the instruction.

In some embodiments, the 128-bit instruction format 710 includes an access/address mode field 726 specifying, for example, whether direct register addressing mode or indirect register addressing mode is used. When direct register addressing mode is used, the register address of one or more operands is directly provided by bits in the instruction.

In some embodiments, the 128-bit instruction format 710 includes an access/address mode field 726, which specifies an address mode and/or an access mode for the instruction. In one embodiment the access mode is used to define a data access alignment for the instruction. Some embodiments support access modes including a 16-byte aligned access mode and a 1-byte aligned access mode, where the byte alignment of the access mode determines the access alignment of the instruction operands. For example, when in a first mode, the instruction may use byte-aligned addressing for source and destination operands and when in a second mode, the instruction may use 16-byte-aligned addressing for all source and destination operands.

In one embodiment, the address mode portion of the access/address mode field 726 determines whether the instruction is to use direct or indirect addressing. When direct register addressing mode is used bits in the instruction directly provide the register address of one or more operands. When indirect register addressing mode is used, the register address of one or more operands may be computed based on an address register value and an address immediate field in the instruction.

In some embodiments instructions are grouped based on opcode 712 bit-fields to simplify Opcode decode 740. For an 8-bit opcode, bits 4, 5, and 6 allow the execution unit to determine the type of opcode. The precise opcode grouping shown is merely an example. In some embodiments, a move and logic opcode group 742 includes data movement and logic instructions (e.g., move (mov), compare (cmp)). In some embodiments, move and logic group 742 shares the five most significant bits (MSB), where move (mov) instructions are in the form of 0000xxxxb and logic instructions are in the form of 0001xxxxb. A flow control instruction group 744 (e.g., call, jump (jmp)) includes instructions in the form of 0010xxxxb (e.g., 0x20). A miscellaneous instruction group 746 includes a mix of instructions, including synchronization instructions (e.g., wait, send) in the form of 0011xxxxb (e.g., 0x30). A parallel math instruction group 748 includes component-wise arithmetic instructions (e.g., add, multiply (mul)) in the form of 0100xxxxb (e.g., 0x40). The parallel math instruction group 748 performs the arithmetic operations in parallel across data channels. The vector math group 750 includes arithmetic instructions (e.g., dp4) in the form of 0101xxxxb (e.g., 0x50). The vector math group performs arithmetic such as dot product calculations on vector operands. The illustrated opcode decode 740, in one embodiment, can be used to determine which portion of an execution unit will be used to execute a decoded instruction. For example, some instructions may be designated as systolic instructions that will be performed by a systolic array. Other instructions, such as ray-tracing instructions (not shown) can be routed to a ray-tracing core or ray-tracing logic within a slice or partition of execution logic.

Graphics Pipeline

Figure 8:
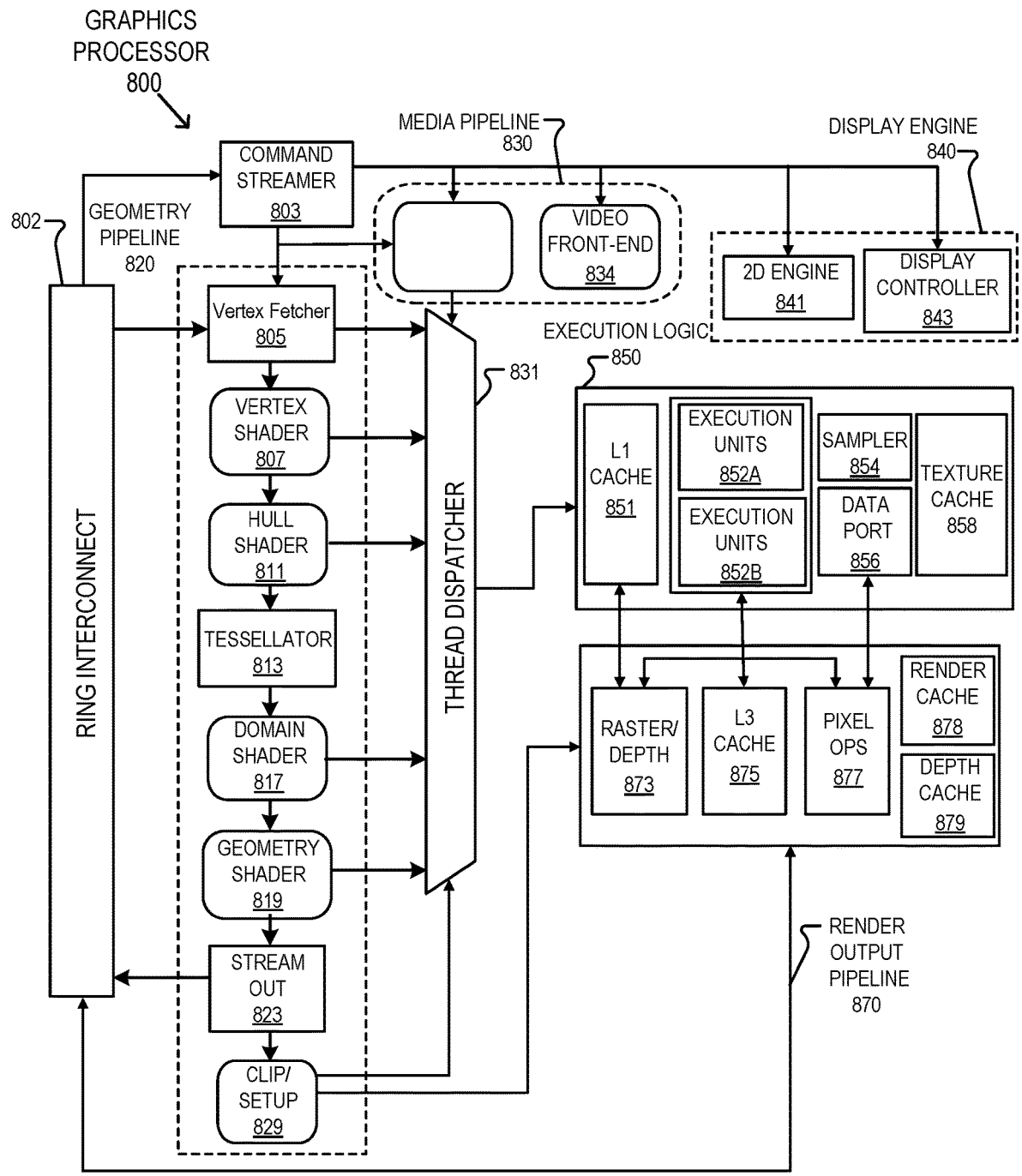
FIG. 8 is a block diagram of another embodiment of a graphics processor.

FIG. 8 is a block diagram of another embodiment of a graphics processor 800. Elements of FIG. 8 having the same reference numbers (or names) as the elements of any other figure herein can operate or function in any manner similar to that described elsewhere herein, but are not limited to such.

In some embodiments, graphics processor 800 includes a geometry pipeline 820, a media pipeline 830, a display engine 840, thread execution logic 850, and a render output pipeline 870. In some embodiments, graphics processor 800 is a graphics processor within a multi-core processing system that includes one or more general-purpose processing cores. The graphics processor is controlled by register writes to one or more control registers (not shown) or via commands issued to graphics processor 800 via a ring interconnect 802. In some embodiments, ring interconnect 802 couples graphics processor 800 to other processing components, such as other graphics processors or general-purpose processors. Commands from ring interconnect 802 are interpreted by a command streamer 803, which supplies instructions to individual components of the geometry pipeline 820 or the media pipeline 830.

In some embodiments, command streamer 803 directs the operation of a vertex fetcher 805 that reads vertex data from memory and executes vertex-processing commands provided by command streamer 803. In some embodiments, vertex fetcher 805 provides vertex data to a vertex shader 807, which performs coordinate space transformation and lighting operations to each vertex. In some embodiments, vertex fetcher 805 and vertex shader 807 execute vertex-processing instructions by dispatching execution threads to execution units 852A-852B via a thread dispatcher 831.

In some embodiments, execution units 852A-852B are an array of vector processors having an instruction set for performing graphics and media operations. In some embodiments, execution units 852A-852B have an attached L1 cache 851 that is specific for each array or shared between the arrays. The cache can be configured as a data cache, an instruction cache, or a single cache that is partitioned to contain data and instructions in different partitions.

In some embodiments, geometry pipeline 820 includes tessellation components to perform hardware-accelerated tessellation of 3D objects. In some embodiments, a programmable hull shader 811 configures the tessellation operations. A programmable domain shader 817 provides back-end evaluation of tessellation output. A tessellator 813 operates at the direction of hull shader 811 and contains special purpose logic to generate a set of detailed geometric objects based on a coarse geometric model that is provided as input to geometry pipeline 820. In some embodiments, if tessellation is not used, tessellation components (e.g., hull shader 811, tessellator 813, and domain shader 817) can be bypassed. The tessellation components can operate based on data received from the vertex shader 807.

In some embodiments, complete geometric objects can be processed by a geometry shader 819 via one or more threads dispatched to execution units 852A-852B, or can proceed directly to the clipper 829. In some embodiments, the geometry shader operates on entire geometric objects, rather than vertices or patches of vertices as in previous stages of the graphics pipeline. If the tessellation is disabled the geometry shader 819 receives input from the vertex shader 807. In some embodiments, geometry shader 819 is programmable by a geometry shader program to perform geometry tessellation if the tessellation units are disabled.

Before rasterization, a clipper 829 processes vertex data. The clipper 829 may be a fixed function clipper or a programmable clipper having clipping and geometry shader functions. In some embodiments, a rasterizer and depth test component 873 in the render output pipeline 870 dispatches pixel shaders to convert the geometric objects into per pixel representations. In some embodiments, pixel shader logic is included in thread execution logic 850. In some embodiments, an application can bypass the rasterizer and depth test component 873 and access un-rasterized vertex data via a stream out unit 823.

The graphics processor 800 has an interconnect bus, interconnect fabric, or some other interconnect mechanism that allows data and message passing amongst the major components of the processor. In some embodiments, execution units 852A-852B and associated logic units (e.g., L1 cache 851, sampler 854, texture cache 858, etc.) interconnect via a data port 856 to perform memory access and communicate with render output pipeline components of the processor. In some embodiments, sampler 854, caches 851, 858 and execution units 852A-852B each have separate memory access paths. In one embodiment the texture cache 858 can also be configured as a sampler cache.

In some embodiments, render output pipeline 870 contains a rasterizer and depth test component 873 that converts vertex-based objects into an associated pixel-based representation. In some embodiments, the rasterizer logic includes a windower/masker unit to perform fixed function triangle and line rasterization. An associated render cache 878 and depth cache 879 are also available in some embodiments. A pixel operations component 877 performs pixel-based operations on the data, though in some instances, pixel operations associated with 2D operations (e.g. bit block image transfers with blending) are performed by the 2D engine 841, or substituted at display time by the display controller 843 using overlay display planes. In some embodiments, a shared L3 cache 875 is available to all graphics components, allowing the sharing of data without the use of main system memory.

In some embodiments, media pipeline 830 includes a media engine 837 and a video front-end 834. In some embodiments, video front-end 834 receives pipeline commands from the command streamer 803. In some embodiments, media pipeline 830 includes a separate command streamer. In some embodiments, video front-end 834 processes media commands before sending the command to the media engine 837. In some embodiments, media engine 837 includes thread spawning functionality to spawn threads for dispatch to thread execution logic 850 via thread dispatcher 831.

In some embodiments, graphics processor 800 includes a display engine 840. In some embodiments, display engine 840 is external to processor 800 and couples with the graphics processor via the ring interconnect 802, or some other interconnect bus or fabric. In some embodiments, display engine 840 includes a 2D engine 841 and a display controller 843. In some embodiments, display engine 840 contains special purpose logic capable of operating independently of the 3D pipeline. In some embodiments, display controller 843 couples with a display device (not shown), which may be a system integrated display device, as in a laptop computer, or an external display device attached via a display device connector.

In some embodiments, the geometry pipeline 820 and media pipeline 830 are configurable to perform operations based on multiple graphics and media programming interfaces and are not specific to any one application programming interface (API). In some embodiments, driver software for the graphics processor translates API calls that are specific to a particular graphics or media library into commands that can be processed by the graphics processor. In some embodiments, support is provided for the Open Graphics Library (OpenGL), Open Computing Language (OpenCL), and/or Vulkan graphics and compute API, all from the Khronos Group. In some embodiments, support may also be provided for the Direct3D library from the Microsoft Corporation. In some embodiments, a combination of these libraries may be supported. Support may also be provided for the Open Source Computer Vision Library (OpenCV). A future API with a compatible 3D pipeline would also be supported if a mapping can be made from the pipeline of the future API to the pipeline of the graphics processor.

Graphics Pipeline Programming

Figure 9:
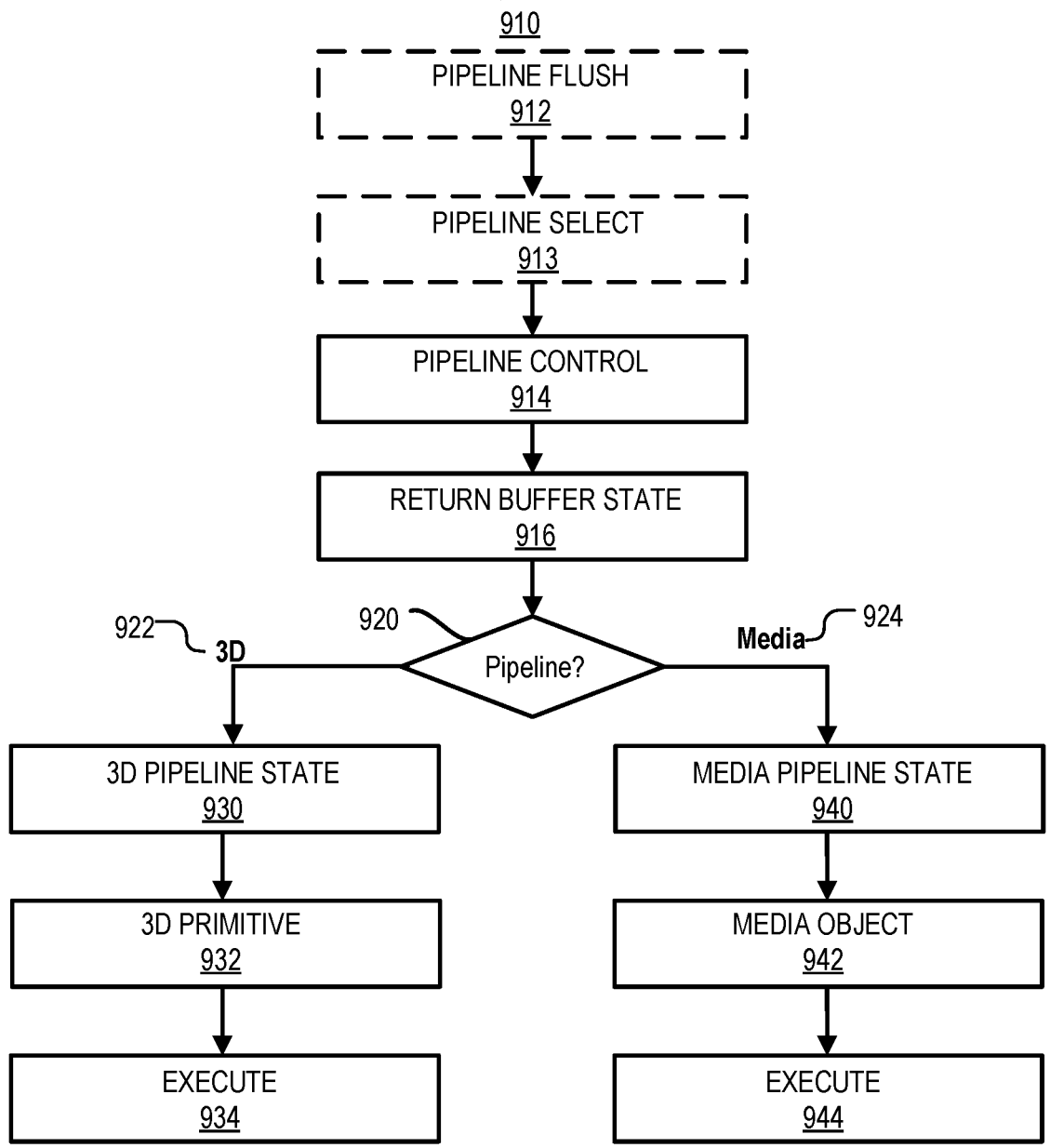
FIG. 9A is a block diagram illustrating a graphics processor command format 900 according to some embodiments.
FIG. 9B is a block diagram illustrating a graphics processor command sequence 910 according to an embodiment.

FIG. 9A is a block diagram illustrating a graphics processor command format 900 that may be used to program graphics processing pipelines according to some embodiments. FIG. 9B is a block diagram illustrating a graphics processor command sequence 910 according to an embodiment. The solid lined boxes in FIG. 9A illustrate the components that are generally included in a graphics command while the dashed lines include components that are optional or that are only included in a sub-set of the graphics commands. The exemplary graphics processor command format 900 of FIG. 9A includes data fields to identify a client 902, a command operation code (opcode) 904, and a data field 906 for the command. A sub-opcode 905 and a command size 908 are also included in some commands.

In some embodiments, client 902 specifies the client unit of the graphics device that processes the command data. In some embodiments, a graphics processor command parser examines the client field of each command to condition the further processing of the command and route the command data to the appropriate client unit. In some embodiments, the graphics processor client units include a memory interface unit, a render unit, a 2D unit, a 3D unit, and a media unit. Each client unit has a corresponding processing pipeline that processes the commands. Once the command is received by the client unit, the client unit reads the opcode 904 and, if present, sub-opcode 905 to determine the operation to perform. The client unit performs the command using information in data field 906. For some commands, an explicit command size 908 is expected to specify the size of the command. In some embodiments, the command parser automatically determines the size of at least some of the commands based on the command opcode. In some embodiments commands are aligned via multiples of a double word. Other command formats can be used.

The flow diagram in FIG. 9B illustrates an exemplary graphics processor command sequence 910. In some embodiments, software or firmware of a data processing system that features an embodiment of a graphics processor uses a version of the command sequence shown to set up, execute, and terminate a set of graphics operations. A sample command sequence is shown and described for purposes of example only as embodiments are not limited to these specific commands or to this command sequence. Moreover, the commands may be issued as batch of commands in a command sequence, such that the graphics processor will process the sequence of commands in at least partially concurrence.

In some embodiments, the graphics processor command sequence 910 may begin with a pipeline flush command 912 to cause any active graphics pipeline to complete the currently pending commands for the pipeline. In some embodiments, the 3D pipeline 922 and the media pipeline 924 do not operate concurrently. The pipeline flush is performed to cause the active graphics pipeline to complete any pending commands. In response to a pipeline flush, the command parser for the graphics processor will pause command processing until the active drawing engines complete pending operations and the relevant read caches are invalidated. Optionally, any data in the render cache that is marked 'dirty' can be flushed to memory. In some embodiments, pipeline flush command 912 can be used for pipeline synchronization or before placing the graphics processor into a low power state.

In some embodiments, a pipeline select command 913 is used when a command sequence requires the graphics processor to explicitly switch between pipelines. In some embodiments, a pipeline select command 913 is required only once within an execution context before issuing pipeline commands unless the context is to issue commands for both pipelines. In some embodiments, a pipeline flush command 912 is required immediately before a pipeline switch via the pipeline select command 913.

In some embodiments, a pipeline control command 914 configures a graphics pipeline for operation and is used to program the 3D pipeline 922 and the media pipeline 924. In some embodiments, pipeline control command 914 configures the pipeline state for the active pipeline. In one embodiment, the pipeline control command 914 is used for pipeline synchronization and to clear data from one or more cache memories within the active pipeline before processing a batch of commands.

In some embodiments, commands related to the return buffer state 916 are used to configure a set of return buffers for the respective pipelines to write data. Some pipeline operations require the allocation, selection, or configuration of one or more return buffers into which the operations write intermediate data during processing. In some embodiments, the graphics processor also uses one or more return buffers to store output data and to perform cross thread communication. In some embodiments, the return buffer state 916 includes selecting the size and number of return buffers to use for a set of pipeline operations.

The remaining commands in the command sequence differ based on the active pipeline for operations. Based on a pipeline determination 920, the command sequence is tailored to the 3D pipeline 922 beginning with the 3D pipeline state 930 or the media pipeline 924 beginning at the media pipeline state 940.

The commands to configure the 3D pipeline state 930 include 3D state setting commands for vertex buffer state, vertex element state, constant color state, depth buffer state, and other state variables that are to be configured before 3D primitive commands are processed. The values of these commands are determined at least in part based on the particular 3D API in use. In some embodiments, 3D pipeline state 930 commands are also able to selectively disable or bypass certain pipeline elements if those elements will not be used.

In some embodiments, 3D primitive 932 command is used to submit 3D primitives to be processed by the 3D pipeline. Commands and associated parameters that are passed to the graphics processor via the 3D primitive 932 command are forwarded to the vertex fetch function in the graphics pipeline. The vertex fetch function uses the 3D primitive 932 command data to generate vertex data structures. The vertex data structures are stored in one or more return buffers. In some embodiments, 3D primitive 932 command is used to perform vertex operations on 3D primitives via vertex shaders. To process vertex shaders, 3D pipeline 922 dispatches shader execution threads to graphics processor execution units.

In some embodiments, 3D pipeline 922 is triggered via an execute 934 command or event. In some embodiments, a register write triggers command execution. In some embodiments execution is triggered via a 'go' or 'kick' command in the command sequence. In one embodiment, command execution is triggered using a pipeline synchronization command to flush the command sequence through the graphics pipeline. The 3D pipeline will perform geometry processing for the 3D primitives. Once operations are complete, the resulting geometric objects are rasterized and the pixel engine colors the resulting pixels. Additional commands to control pixel shading and pixel back end operations may also be included for those operations.

In some embodiments, the graphics processor command sequence 910 follows the media pipeline 924 path when performing media operations. In general, the specific use and manner of programming for the media pipeline 924 depends on the media or compute operations to be performed. Specific media decode operations may be offloaded to the media pipeline during media decode. In some embodiments, the media pipeline can also be bypassed and media decode can be performed in whole or in part using resources provided by one or more general-purpose processing cores. In one embodiment, the media pipeline also includes elements for general-purpose graphics processor unit (GPGPU) operations, where the graphics processor is used to perform SIMD vector operations using computational shader programs that are not explicitly related to the rendering of graphics primitives.

In some embodiments, media pipeline 924 is configured in a similar manner as the 3D pipeline 922. A set of commands to configure the media pipeline state 940 are dispatched or placed into a command queue before the media object commands 942. In some embodiments, commands for the media pipeline state 940 include data to configure the media pipeline elements that will be used to process the media objects. This includes data to configure the video decode and video encode logic within the media pipeline, such as encode or decode format. In some embodiments, commands for the media pipeline state 940 also support the use of one or more pointers to "indirect" state elements that contain a batch of state settings.

In some embodiments, media object commands 942 supply pointers to media objects for processing by the media pipeline. The media objects include memory buffers containing video data to be processed. In some embodiments, all media pipeline states must be valid before issuing a media object command 942. Once the pipeline state is configured and media object commands 942 are queued, the media pipeline 924 is triggered via an execute command 944 or an equivalent execute event (e.g., register write). Output from media pipeline 924 may then be post processed by operations provided by the 3D pipeline 922 or the media pipeline 924. In some embodiments, GPGPU operations are configured and executed in a similar manner as media operations.

Graphics Software Architecture

Figure 10:
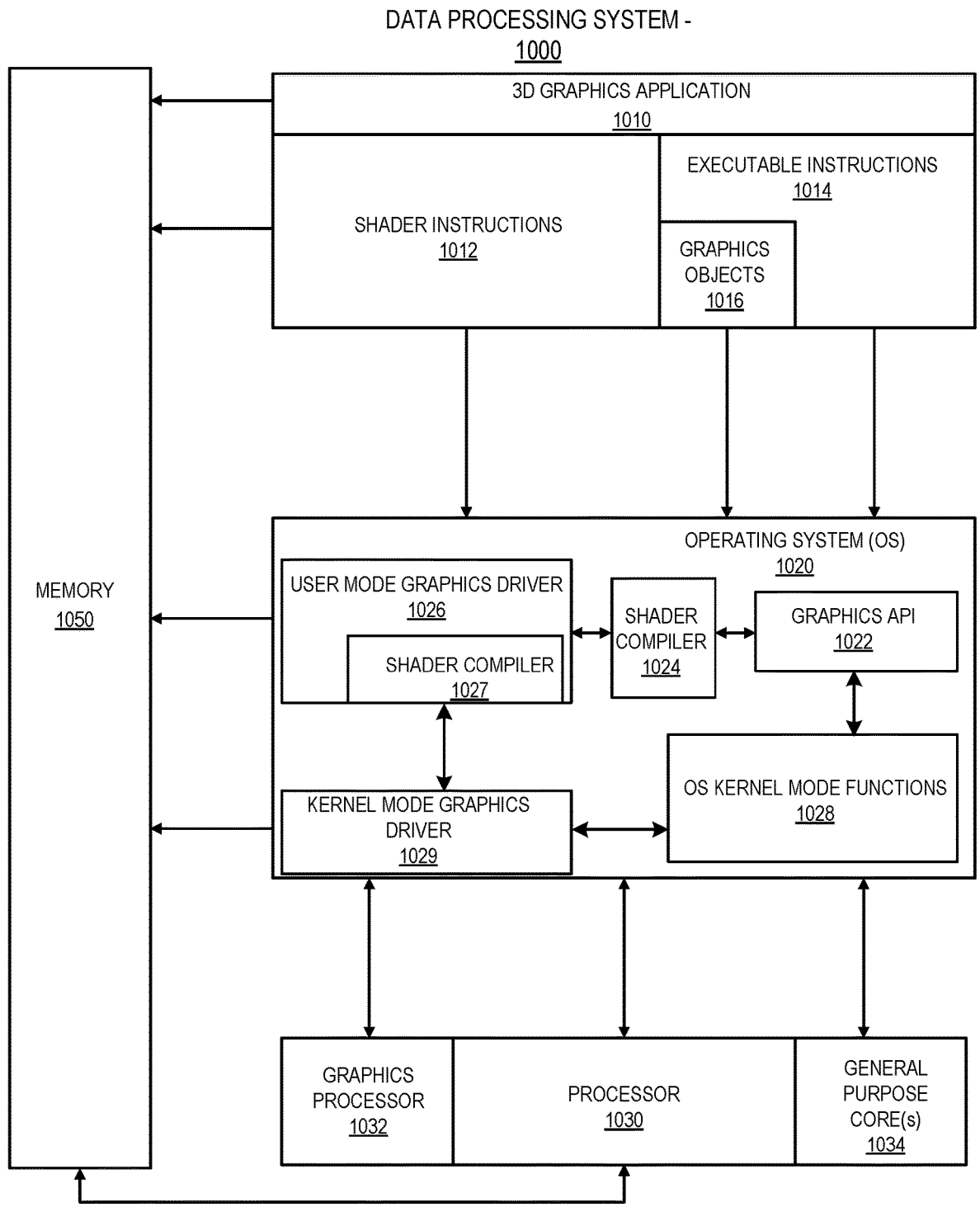
FIG. 10 illustrates an exemplary graphics software architecture for a data processing system according to some embodiments.

FIG. 10 illustrates an exemplary graphics software architecture for a data processing system 1000 according to some embodiments. In some embodiments, software architecture includes a 3D graphics application 1010, an operating system 1020, and at least one processor 1030. In some embodiments, processor 1030 includes a graphics processor 1032 and one or more general-purpose processor core(s) 1034. The graphics application 1010 and operating system 1020 each execute in the system memory 1050 of the data processing system.

In some embodiments, 3D graphics application 1010 contains one or more shader programs including shader instructions 1012. The shader language instructions may be in a high-level shader language, such as the High-Level Shader Language (HLSL) of Direct3D, the OpenGL Shader Language (GLSL), and so forth. The application also includes executable instructions 1014 in a machine language suitable for execution by the general-purpose processor core 1034. The application also includes graphics objects 1016 defined by vertex data.

In some embodiments, operating system 1020 is a Microsoft® Windows® operating system from the Microsoft Corporation, a proprietary UNIX-like operating system, or an open source UNIX-like operating system using a variant of the Linux kernel. The operating system 1020 can support a graphics API 1022 such as the Direct3D API, the OpenGL API, or the Vulkan API. When the Direct3D API is in use, the operating system 1020 uses a front-end shader compiler 1024 to compile any shader instructions 1012 in HLSL into a lower-level shader language. The compilation may be a just-in-time (JIT) compilation or the application can perform shader pre-compilation. In some embodiments, high-level shaders are compiled into low-level shaders during the compilation of the 3D graphics application 1010. In some embodiments, the shader instructions 1012 are provided in an intermediate form, such as a version of the Standard Portable Intermediate Representation (SPIR) used by the Vulkan API.

In some embodiments, user mode graphics driver 1026 contains a back-end shader compiler 1027 to convert the shader instructions 1012 into a hardware specific representation. When the OpenGL API is in use, shader instructions 1012 in the GLSL high-level language are passed to a user mode graphics driver 1026 for compilation. In some embodiments, user mode graphics driver 1026 uses operating system kernel mode functions 1028 to communicate with a kernel mode graphics driver 1029. In some embodiments, kernel mode graphics driver 1029 communicates with graphics processor 1032 to dispatch commands and instructions.

IP Core Implementations

One or more aspects of at least one embodiment may be implemented by representative code stored on a machine-readable medium which represents and/or defines logic within an integrated circuit such as a processor. For example, the machine-readable medium may include instructions which represent various logic within the processor. When read by a machine, the instructions may cause the machine to fabricate the logic to perform the techniques described herein. Such representations, known as "IP cores," are reusable units of logic for an integrated circuit that may be stored on a tangible, machine-readable medium as a hardware model that describes the structure of the integrated circuit. The hardware model may be supplied to various customers or manufacturing facilities, which load the hardware model on fabrication machines that manufacture the integrated circuit. The integrated circuit may be fabricated such that the circuit performs operations described in association with any of the embodiments described herein.

Figure 11A:
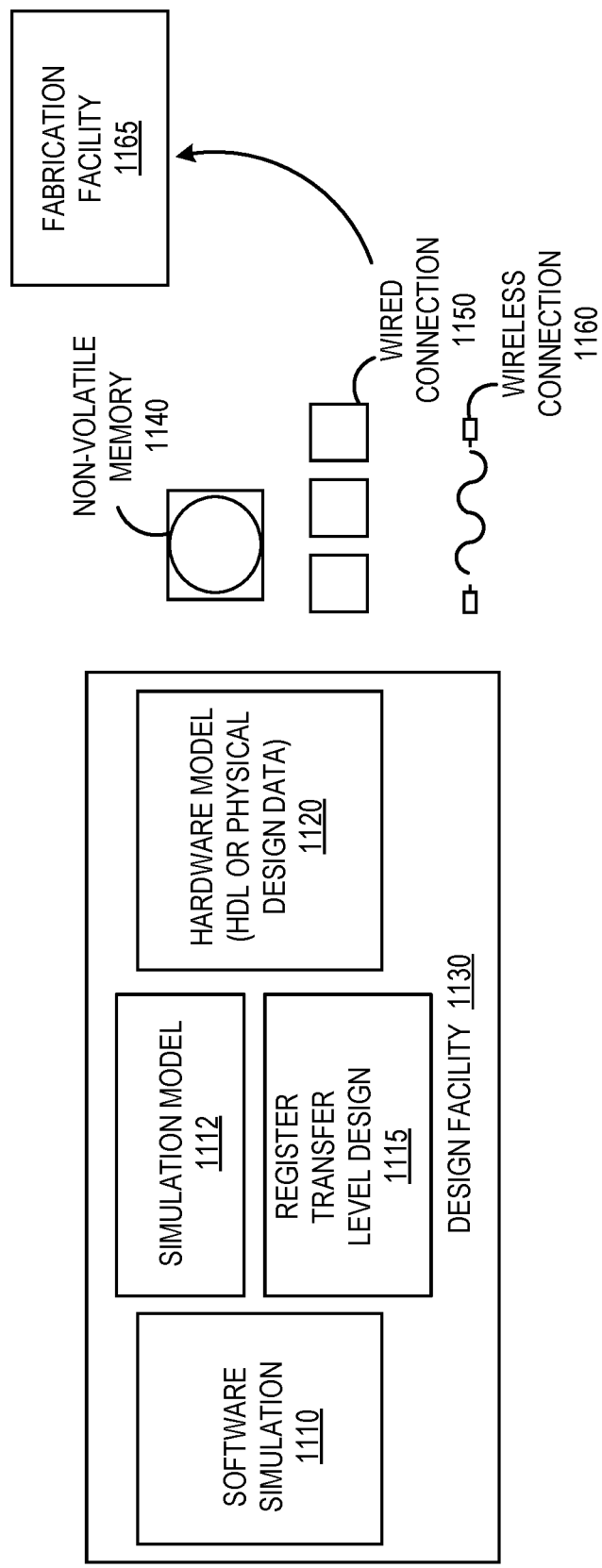
FIG. 11A is a block diagram illustrating an IP core development system that may be used to manufacture an integrated circuit to perform operations according to an embodiment.

FIG. 11A is a block diagram illustrating an IP core development system 1100 that may be used to manufacture an integrated circuit to perform operations according to an embodiment. The IP core development system 1100 may be used to generate modular, re-usable designs that can be incorporated into a larger design or used to construct an entire integrated circuit (e.g., an SOC integrated circuit). A design facility 1130 can generate a software simulation 1110 of an IP core design in a high-level programming language (e.g., C/C++). The software simulation 1110 can be used to design, test, and verify the behavior of the IP core using a simulation model 1112. The simulation model 1112 may include functional, behavioral, and/or timing simulations. A register transfer level (RTL) design 1115 can then be created or synthesized from the simulation model 1112. The RTL design 1115 is an abstraction of the behavior of the integrated circuit that models the flow of digital signals between hardware registers, including the associated logic performed using the modeled digital signals. In addition to an RTL design 1115, lower-level designs at the logic level or transistor level may also be created, designed, or synthesized. Thus, the particular details of the initial design and simulation may vary.

The RTL design 1115 or equivalent may be further synthesized by the design facility into a hardware model 1120, which may be in a hardware description language (HDL), or some other representation of physical design data. The HDL may be further simulated or tested to verify the IP core design. The IP core design can be stored for delivery to a 3rd party fabrication facility 1165 using non-volatile memory 1140 (e.g., hard disk, flash memory, or any non-volatile storage medium). Alternatively, the IP core design may be transmitted (e.g., via the Internet) over a wired connection 1150 or wireless connection 1160. The fabrication facility 1165 may then fabricate an integrated circuit that is based at least in part on the IP core design. The fabricated integrated circuit can be configured to perform operations in accordance with at least one embodiment described herein.

Figure 11B:
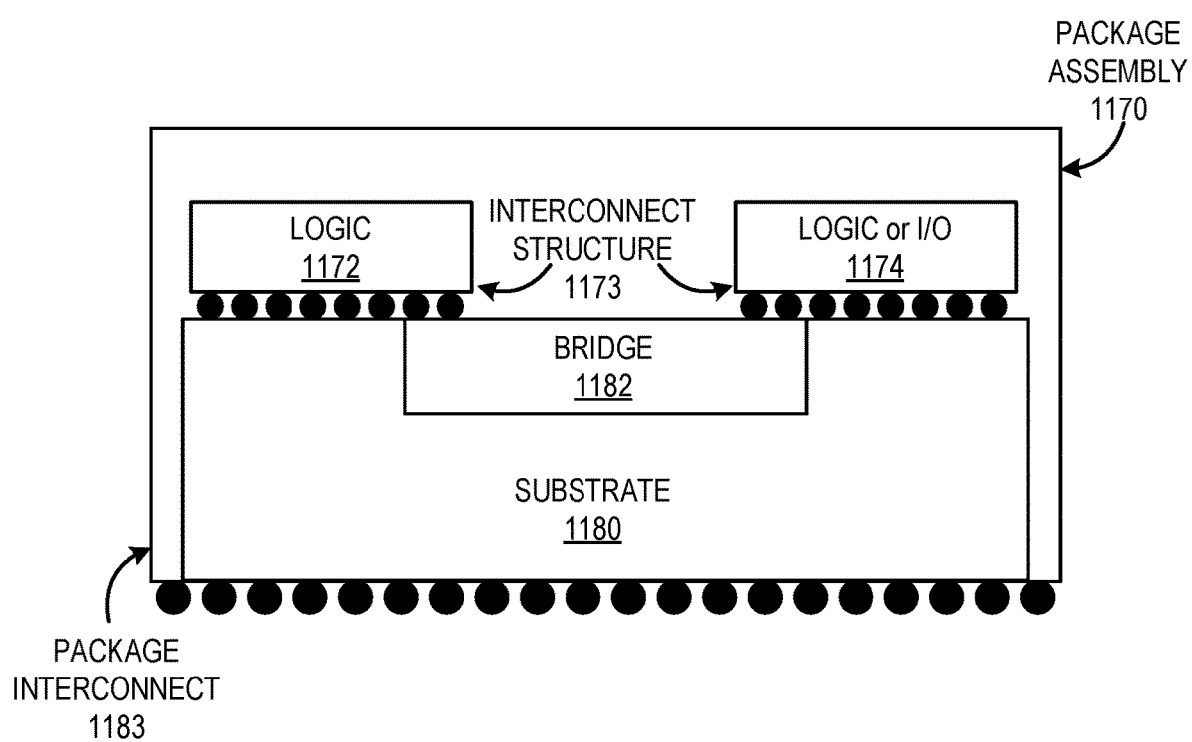
FIG. 11B illustrates a cross-section side view of an integrated circuit package assembly, according to some embodiments described herein.

FIG. 11B illustrates a cross-section side view of an integrated circuit package assembly 1170, according to some embodiments described herein. The integrated circuit package assembly 1170 illustrates an implementation of one or more processor or accelerator devices as described herein. The package assembly 1170 includes multiple units of hardware logic 1172, 1174 connected to a substrate 1180. The logic 1172, 1174 may be implemented at least partly in configurable logic or fixed-functionality logic hardware, and can include one or more portions of any of the processor core(s), graphics processor(s), or other accelerator devices described herein. Each unit of logic 1172, 1174 can be implemented within a semiconductor die and coupled with the substrate 1180 via an interconnect structure 1173. The interconnect structure 1173 may be configured to route electrical signals between the logic 1172, 1174 and the substrate 1180, and can include interconnects such as, but not limited to bumps or pillars. In some embodiments, the interconnect structure 1173 may be configured to route electrical signals such as, for example, input/output (I/O) signals and/or power or ground signals associated with the operation of the logic 1172, 1174. In some embodiments, the substrate 1180 is an epoxy-based laminate substrate. The substrate 1180 may include other suitable types of substrates in other embodiments. The package assembly 1170 can be connected to other electrical devices via a package interconnect 1183. The package interconnect 1183 may be coupled to a surface of the substrate 1180 to route electrical signals to other electrical devices, such as a motherboard, other chipset, or multi-chip module.

In some embodiments, the units of logic 1172, 1174 are electrically coupled with a bridge 1182 that is configured to route electrical signals between the logic 1172, 1174. The bridge 1182 may be a dense interconnect structure that provides a route for electrical signals. The bridge 1182 may include a bridge substrate composed of glass or a suitable semiconductor material. Electrical routing features can be formed on the bridge substrate to provide a chip-to-chip connection between the logic 1172, 1174.

Although two units of logic 1172, 1174 and a bridge 1182 are illustrated, embodiments described herein may include more or fewer logic units on one or more dies. The one or more dies may be connected by zero or more bridges, as the bridge 1182 may be excluded when the logic is included on a single die. Alternatively, multiple dies or units of logic can be connected by one or more bridges. Additionally, multiple logic units, dies, and bridges can be connected together in other possible configurations, including three-dimensional configurations.

Figure 11C:
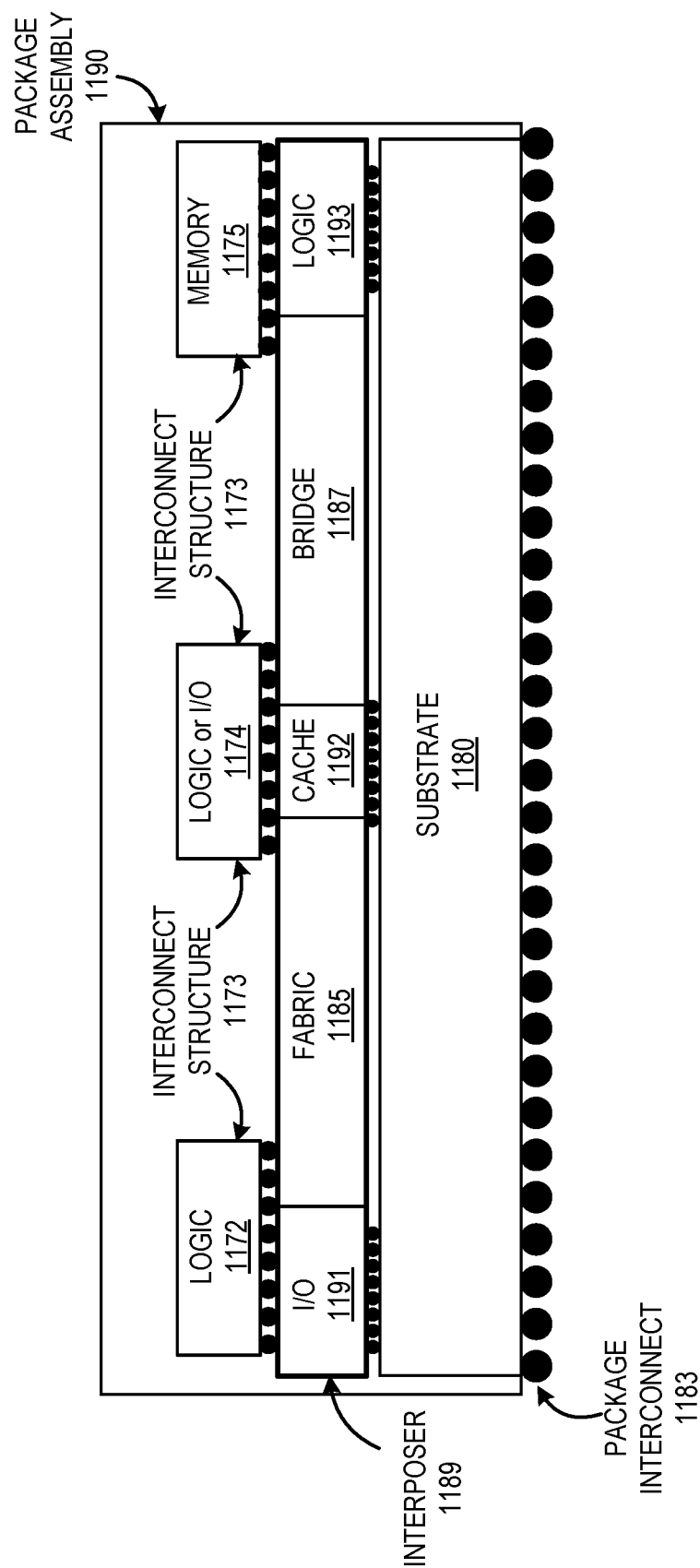
FIG. 11C illustrates a package assembly that includes multiple units of hardware logic chiplets connected to a substrate.

FIG. 11C illustrates a package assembly 1190 that includes multiple units of hardware logic chiplets connected to a substrate 1180. A graphics processing unit, parallel processor, and/or compute accelerator as described herein can be composed from diverse silicon chiplets that are separately manufactured. In this context, a chiplet is an at least partially packaged integrated circuit that includes distinct units of logic that can be assembled with other chiplets into a larger package. A diverse set of chiplets with different IP core logic can be assembled into a single device. Additionally the chiplets can be integrated into a base die or base chiplet using active interposer technology. The concepts described herein enable the interconnection and communication between the different forms of IP within the GPU. IP cores can be manufactured using different process technologies and composed during manufacturing, which avoids the complexity of converging multiple IPs, especially on a large SoC with several flavors IPs, to the same manufacturing process. Enabling the use of multiple process technologies improves the time to market and provides a cost-effective way to create multiple product SKUs. Additionally, the disaggregated IPs are more amenable to being power gated independently, components that are not in use on a given workload can be powered off, reducing overall power consumption.

In various embodiments a package assembly 1190 can include components and chiplets that are interconnected by a fabric 1185 and/or one or more bridges 1187. The chiplets within the package assembly 1190 may have a 2.5D arrangement using Chip-on-Wafer-on-Substrate stacking in which multiple dies are stacked side-by-side on a silicon interposer 1189 that couples the chiplets with the substrate 1180. The substrate 1180 includes electrical connections to the package interconnect 1183. In one embodiment the silicon interposer 1189 is a passive interposer that includes through-silicon vias (TSVs) to electrically couple chiplets within the package assembly 1190 to the substrate 1180. In one embodiment, silicon interposer 1189 is an active interposer that includes embedded logic in addition to TSVs. In such embodiment, the chiplets within the package assembly 1190 are arranged using 3D face to face die stacking on top of the active interposer 1189. The active interposer 1189 can include hardware logic for I/O 1191, cache memory 1192, and other hardware logic 1193, in addition to interconnect fabric 1185 and a silicon bridge 1187. The fabric 1185 enables communication between the various logic chiplets 1172, 1174 and the logic 1191, 1193 within the active interposer 1189. The fabric 1185 may be an NoC interconnect or another form of packet switched fabric that switches data packets between components of the package assembly. For complex assemblies, the fabric 1185 may be a dedicated chiplet enables communication between the various hardware logic of the package assembly 1190.

Bridge structures 1187 within the active interposer 1189 may be used to facilitate a point to point interconnect between, for example, logic or I/O chiplets 1174 and memory chiplets 1175. In some implementations, bridge structures 1187 may also be embedded within the substrate 1180. The hardware logic chiplets can include special purpose hardware logic chiplets 1172, logic or I/O chiplets 1174, and/or memory chiplets 1175. The hardware logic chiplets 1172 and logic or I/O chiplets 1174 may be implemented at least partly in configurable logic or fixed-functionality logic hardware and can include one or more portions of any of the processor core(s), graphics processor(s), parallel processors, or other accelerator devices described herein. The memory chiplets 1175 can be DRAM (e.g., GDDR, HBM) memory or cache (SRAM) memory. Cache memory 1192 within the active interposer 1189 (or substrate 1180) can act as a global cache for the package assembly 1190, part of a distributed global cache, or as a dedicated cache for the fabric 1185.

Each chiplet can be fabricated as separate semiconductor die and coupled with a base die that is embedded within or coupled with the substrate 1180. The coupling with the substrate 1180 can be performed via an interconnect structure 1173. The interconnect structure 1173 may be configured to route electrical signals between the various chiplets and logic within the substrate 1180. The interconnect structure 1173 can include interconnects such as, but not limited to bumps or pillars. In some embodiments, the interconnect structure 1173 may be configured to route electrical signals such as, for example, input/output (I/O) signals and/or power or ground signals associated with the operation of the logic, I/O, and memory chiplets. In one embodiment, an additional interconnect structure couples the active interposer 1189 with the substrate 1180.

In some embodiments, the substrate 1180 is an epoxy-based laminate substrate. The substrate 1180 may include other suitable types of substrates in other embodiments. The package assembly 1190 can be connected to other electrical devices via a package interconnect 1183. The package interconnect 1183 may be coupled to a surface of the substrate 1180 to route electrical signals to other electrical devices, such as a motherboard, other chipset, or multi-chip module.

In some embodiments, a logic or I/O chiplet 1174 and a memory chiplet 1175 can be electrically coupled via a bridge 1187 that is configured to route electrical signals between the logic or I/O chiplet 1174 and a memory chiplet 1175. The bridge 1187 may be a dense interconnect structure that provides a route for electrical signals. The bridge 1187 may include a bridge substrate composed of glass or a suitable semiconductor material. Electrical routing features can be formed on the bridge substrate to provide a chip-to-chip connection between the logic or I/O chiplet 1174 and a memory chiplet 1175. The bridge 1187 may also be referred to as a silicon bridge or an interconnect bridge. For example, the bridge 1187, in some embodiments, is an Embedded Multi-die Interconnect Bridge (EMIB). In some embodiments, the bridge 1187 may simply be a direct connection from one chiplet to another chiplet.

Figure 11D:
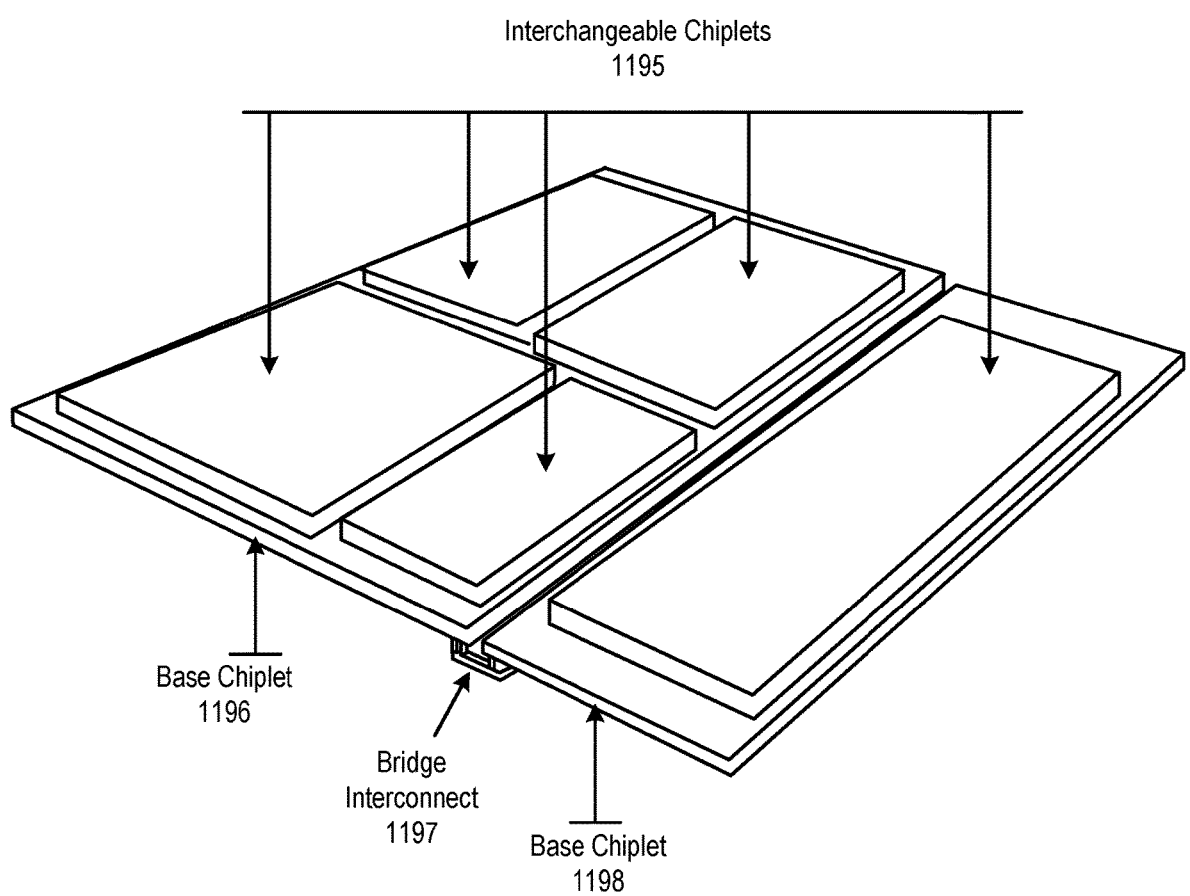
FIG. 11D illustrates a package assembly including interchangeable chiplets 1195, according to an embodiment.

FIG. 11D illustrates a package assembly 1194 including interchangeable chiplets 1195, according to an embodiment. The interchangeable chiplets 1195 can be assembled into standardized slots on one or more base chiplets 1196, 1198. The base chiplets 1196, 1198 can be coupled via a bridge interconnect 1197, which can be similar to the other bridge interconnects described herein and may be, for example, an EMIB. Memory chiplets can also be connected to logic or I/O chiplets via a bridge interconnect. I/O and logic chiplets can communicate via an interconnect fabric. The base chiplets can each support one or more slots in a standardized format for one of logic or I/O or memory/cache.

In one embodiment, SRAM and power delivery circuits can be fabricated into one or more of the base chiplets 1196, 1198, which can be fabricated using a different process technology relative to the interchangeable chiplets 1195 that are stacked on top of the base chiplets. For example, the base chiplets 1196, 1198 can be fabricated using a larger process technology, while the interchangeable chiplets can be manufactured using a smaller process technology. One or more of the interchangeable chiplets 1195 may be memory (e.g., DRAM) chiplets. Different memory densities can be selected for the package assembly 1194 based on the power, and/or performance targeted for the product that uses the package assembly 1194. Additionally, logic chiplets with a different number of type of functional units can be selected at time of assembly based on the power, and/or performance targeted for the product. Additionally, chiplets containing IP logic cores of differing types can be inserted into the interchangeable chiplet slots, enabling hybrid processor designs that can mix and match different technology IP blocks.

Exemplary System on a Chip Integrated Circuit

Figure 12:
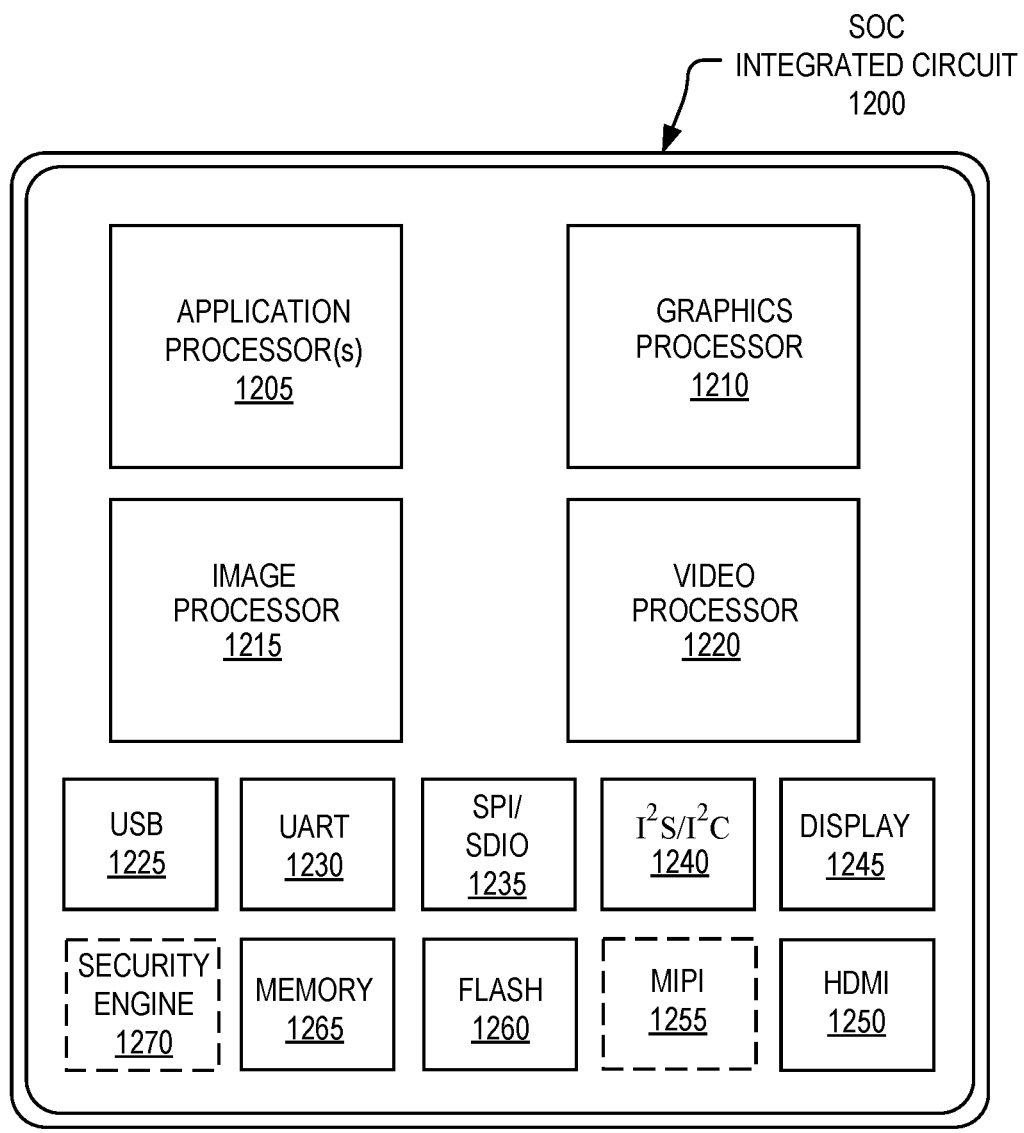
FIG. 12 is a block diagram illustrating an exemplary system on a chip integrated circuit that may be fabricated using one or more IP cores, according to an embodiment.
Figure 13A:
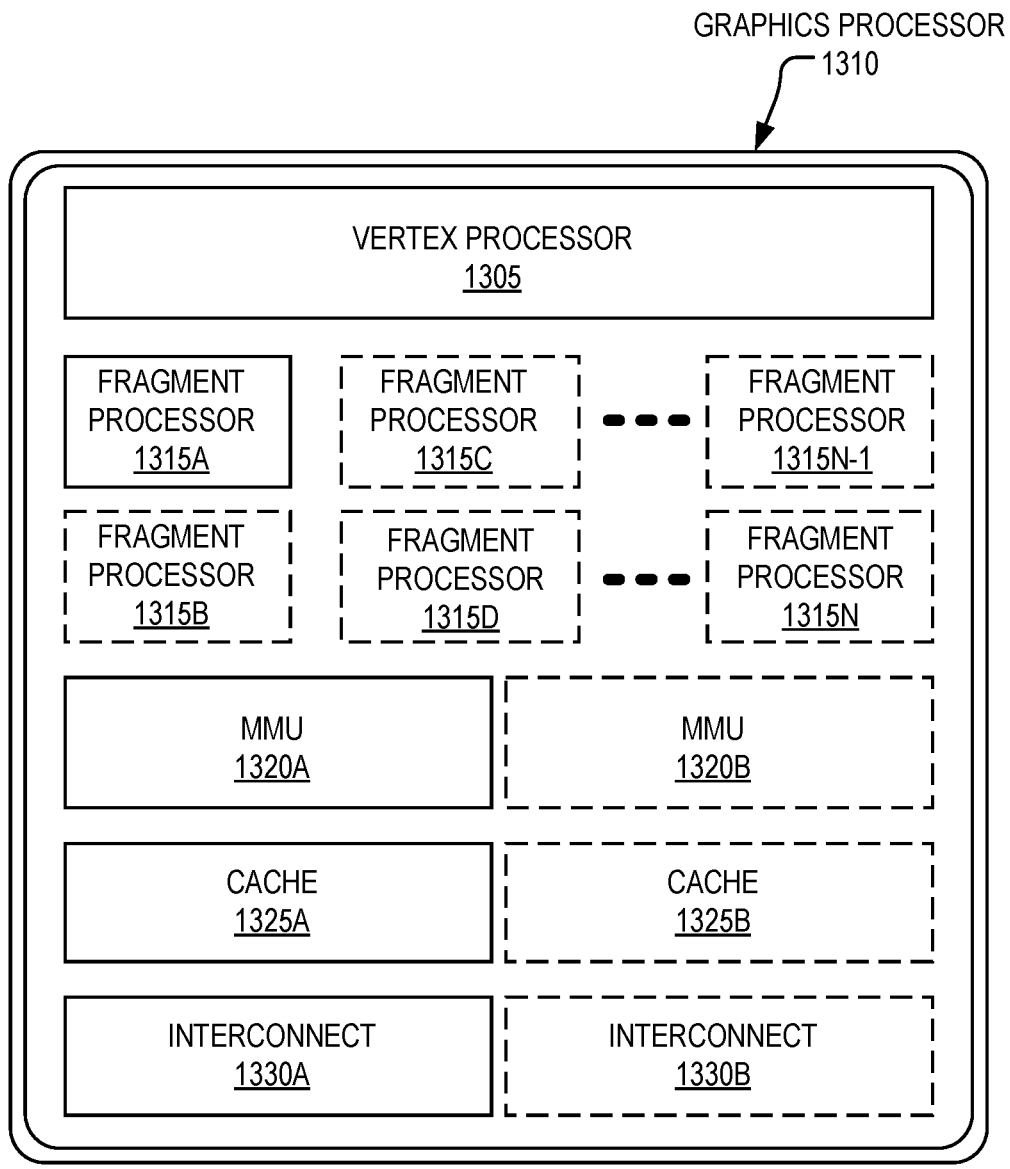
FIGS. 13A-13B are block diagrams illustrating exemplary graphics Processors for use within an SoC, according to embodiments described herein.
Figure 13B:
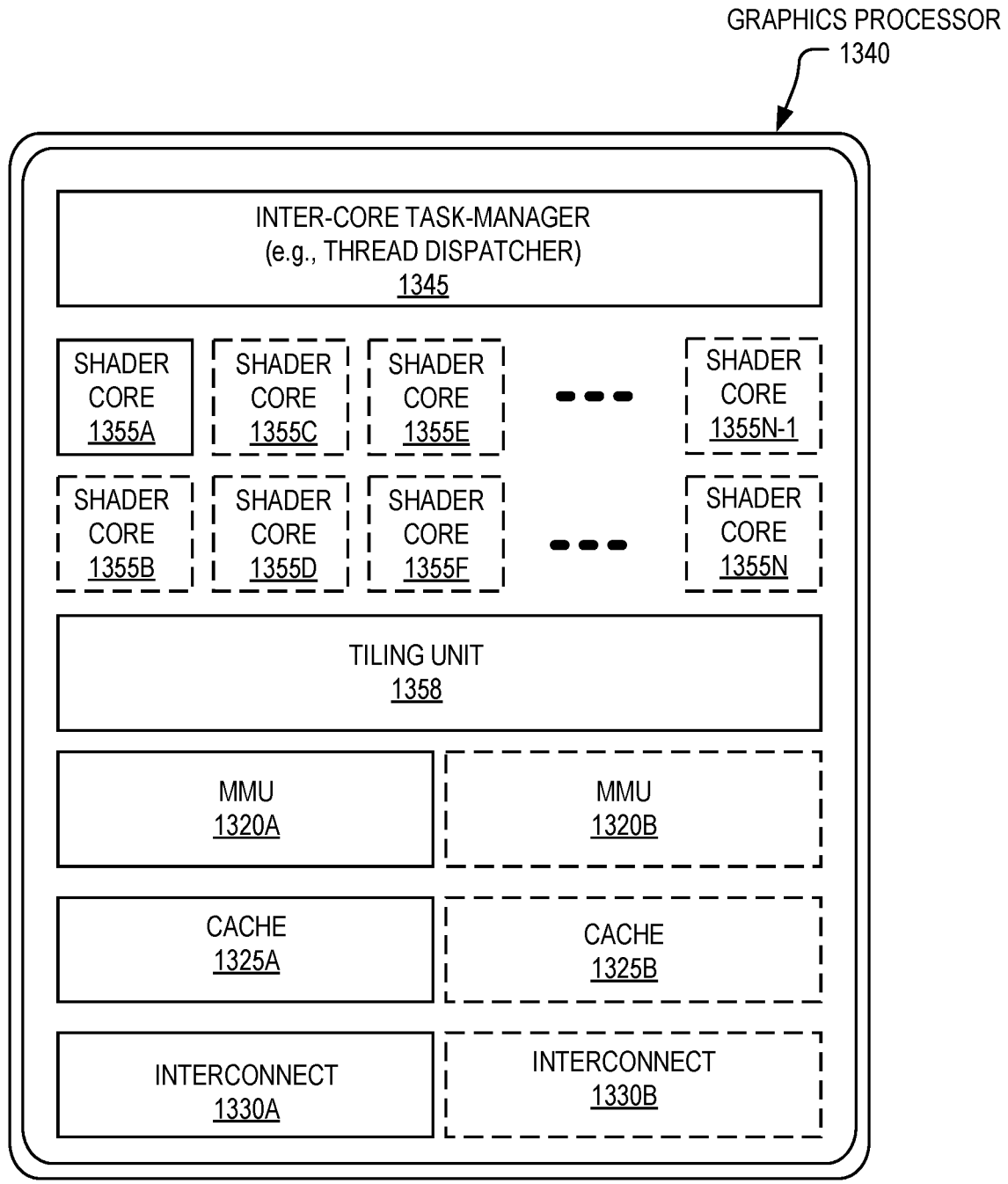

FIGS. 12-13B illustrate exemplary integrated circuits and associated graphics processors that may be fabricated using one or more IP cores, according to various embodiments described herein. In addition to what is illustrated, other logic and circuits may be included, including additional graphics processors/cores, peripheral interface controllers, or general-purpose processor cores.

FIG. 12 is a block diagram illustrating an exemplary system on a chip integrated circuit 1200 that may be fabricated using one or more IP cores, according to an embodiment. Exemplary integrated circuit 1200 includes one or more application processor(s) 1205 (e.g., CPUs), at least one graphics processor 1210, and may additionally include an image processor 1215 and/or a video processor 1220, any of which may be a modular IP core from the same or multiple different design facilities. Integrated circuit 1200 includes peripheral or bus logic including a USB controller 1225, UART controller 1230, an SPI/SDIO controller 1235, and an I2S/I2C controller 1240. Additionally, the integrated circuit can include a display device 1245 coupled to one or more of a high-definition multimedia interface (HDMI) controller 1250 and a mobile industry processor interface (MIPI) display interface 1255. Storage may be provided by a flash memory subsystem 1260 including flash memory and a flash memory controller. Memory interface may be provided via a memory controller 1265 for access to SDRAM or SRAM memory devices. Some integrated circuits additionally include an embedded security engine 1270.

FIGS. 13A-13B are block diagrams illustrating exemplary graphics processors for use within an SoC, according to embodiments described herein. FIG. 13A illustrates an exemplary graphics processor 1310 of a system on a chip integrated circuit that may be fabricated using one or more IP cores, according to an embodiment. FIG. 13B illustrates an additional exemplary graphics processor 1340 of a system on a chip integrated circuit that may be fabricated using one or more IP cores, according to an embodiment. Graphics processor 1310 of FIG. 13A is an example of a low power graphics processor core. Graphics processor 1340 of FIG. 13B is an example of a higher performance graphics processor core. Each of graphics processor 1310 and graphics processor 1340 can be variants of the graphics processor 1210 of FIG. 12.

As shown in FIG. 13A, graphics processor 1310 includes a vertex processor 1305 and one or more fragment processor(s) 1315A-1315N (e.g., 1315A, 1315B, 1315C, 1315D, through 1315N-1, and 1315N). Graphics processor 1310 can execute different shader programs via separate logic, such that the vertex processor 1305 is optimized to execute operations for vertex shader programs, while the one or more fragment processor(s) 1315A-1315N execute fragment (e.g., pixel) shading operations for fragment or pixel shader programs. The vertex processor 1305 performs the vertex processing stage of the 3D graphics pipeline and generates primitives and vertex data. The fragment processor(s) 1315A-1315N use the primitive and vertex data generated by the vertex processor 1305 to produce a framebuffer that is displayed on a display device. In one embodiment, the fragment processor(s) 1315A-1315N are optimized to execute fragment shader programs as provided for in the OpenGL API, which may be used to perform similar operations as a pixel shader program as provided for in the Direct 3D API.

Graphics processor 1310 additionally includes one or more memory management units (MMUs) 1320A-1320B, cache(s) 1325A-1325B, and circuit interconnect(s) 1330A-1330B. The one or more MMU(s) 1320A-1320B provide for virtual to physical address mapping for the graphics processor 1310, including for the vertex processor 1305 and/or fragment processor(s) 1315A-1315N, which may reference vertex or image/texture data stored in memory, in addition to vertex or image/texture data stored in the one or more cache(s) 1325A-1325B. In one embodiment the one or more MMU(s) 1320A-1320B may be synchronized with other MMUs within the system, including one or more MMUs associated with the one or more application processor(s) 1205, image processor 1215, and/or video processor 1220 of FIG. 12, such that each processor 1205-1220 can participate in a shared or unified virtual memory system. The one or more circuit interconnect(s) 1330A-1330B enable graphics processor 1310 to interface with other IP cores within the SoC, either via an internal bus of the SoC or via a direct connection, according to embodiments.

As shown FIG. 13B, graphics processor 1340 includes the one or more MMU(s) 1320A-1320B, cache(s) 1325A-1325B, and circuit interconnect(s) 1330A-1330B of the graphics processor 1310 of FIG. 13A. Graphics processor 1340 includes one or more shader core(s) 1355A-1355N (e.g., 1455A, 1355B, 1355C, 1355D, 1355E, 1355F, through 1355N-1, and 1355N), which provides for a unified shader core architecture in which a single core or type or core can execute all types of programmable shader code, including shader program code to implement vertex shaders, fragment shaders, and/or compute shaders. The unified shader core architecture is also configurable to execute direct compiled high-level GPGPU programs (e.g., CUDA). The exact number of shader cores present can vary among embodiments and implementations. Additionally, graphics processor 1340 includes an inter-core task manager 1345, which acts as a thread dispatcher to dispatch execution threads to one or more shader cores 1355A-1355N and a tiling unit 1358 to accelerate tiling operations for tile-based rendering, in which rendering operations for a scene are subdivided in image space, for example to exploit local spatial coherence within a scene or to optimize use of internal caches.

Super-Compression—Interleaving of Variable Bitrate Streams for GPU Implementations In some embodiments, an apparatus, system, or process provides for super-compression operation including interleaving of variable bitrate streams produced by cascaded dictionary and entropy coders for GPU implementations.

In data processing operations that include graphics data, such as gaming, virtual reality, and other graphics intensive applications, there may be very large amounts of texture data to be transferred and stored. In order to reduce the burden imposed by such data, the data is commonly compressed utilizing texture compression. In order to further reduce the data to be streamed, a second level compression referred to as super-compression is applied to generate a bitstream for streaming. The resulting bitstream may be received for decoding by multiple decoders, each of which will receive specific chunks of the stream for decoding, In an operation, what is desired to access data independently and in a deterministic manner. Texture data, with an X offset and a Y offset, may represent a rectangular region in the texture, wherein a system is to calculate the offsets and then go to the location and obtain the texture data. This is made possible when there is a fixed rate, with every square/rectangular region in an image being handled in in the same manner. For example, the data may represent 2 Kbytes of data (or any other data size), with the data being referred to as a symbol. However, the amount of texture data in an application is very large, and thus additional compression may be applied to minimize the amount of data to be transferred or stored. However, handling the compressed can require large amounts of metadata to enable identification of the location of each data element within a stream.

In some embodiments, an apparatus, system, or process for super-compression provides an interleaved operation for compression of data utilizing cascaded dictionary and entropy coders in a Single Instruction Multiple Data (SIMD) entropy encoder and decoder system. In some embodiments, the apparatus, system, or process provides for dictionary and entropy encoding compression without requiring significant metadata for accessing the compressed bitstream. In some embodiments, the apparatus, system, or process exploits purpose-built GPU algorithms for high performance in either GPU software or GPU hardware.

Enabling GPU parallelism for entropy decoders is crucial for achieving high performance decoding. Among the parallelism challenges to be addressed in a encoder-decoder pipeline system are maintaining proper synchronization of encoders and decoders with respect to the incoming bitstream, and determining how algorithms are to understand exactly which bit begins a particular coded symbol sequence for decoding. Among other features, an ideal algorithm would require little or no extra metadata in maintain synchronization as the metadata reduces the amount of space available for data and thus degrades compression ratios.

In comparison with embodiments described here, alternative interleaving processes may include the following:

Naïvely Interleaved Entropy Encoders: A naïve approach to SIMD interleaved bitstreams may, for example, simply take a fixed unit of data from each of multiple separately encoded bitstreams and interleave the selected data units together. This process may continue until one or more bitstreams has no more bits. Each time one of the bitstreams reaches a point that it has no more bits, the number of interleaved bitstreams is decremented by one. In this manner, eventually all bits from all bitstreams are processed. This interleaving method requires that each SIMD lane manage its outer loop iteration independently and allows the lanes to terminate early as they run out of bits.

However, among the disadvantages of this type of interleaving process is that the iteration pattern in processing generates outer loop divergence as well as inner loop table lookup divergence as Huffman codes are translated and as bitstream indices are computed. GPUs are not efficient at execution divergence, and good performance generally requires algorithms that avoid, limit, or constrain such divergence. A further disadvantage with this method is that, because of its uneven completion pattern across the multiple execution lanes, the process yields disorganized decoded symbol writes that generally cannot be handled efficiently on GPUs. Such disorganized writes would require costly SIMD scatter stores and partial writes.

ANS Interleaved Entropy Encoders: The Asymmetric Numeral Systems (ANS) class of entropy algorithms defines methods for computing property states that can be used to control when and how many bits the encoder and decoder read from memory for further processing.

In contrast with an ANS entropy encoder, an embodiment of a variable width interleaved encoder/decoder may instead provide a "programmatic construct" that can provide similar friendly mathematical properties as ANS, but without implementing the explicit state management that is required for the ANS entropy encoder. Based on the ANS state computation methods, an alternative process presents interleaving of entropy encoders that allows for fast SIMD decoding without significant additional overhead. For each iteration of the encoder or decoder, the ANS technology computes a unique integer state. This unique state ensures that a decoder reading bits will be in the same state as the encoder writing those bits. This property enables ANS bitstream SIMD interleaving of multiple independent coded bitstreams.

A downside of ANS based entropy coding is that the decoder is required to consume bits in the reverse order as the encoder. In particular, the final ANS state for each independent coded bitstream is also transmitted as additional metadata sent with the coded bits. This precludes the streaming of data of indefinite size. Further, because the order in which data is encoded is different from the order in which data is decoded, no adaptation of the symbol probabilities is possible. In contrast, an embodiment of a variable width interleaved system may be implemented to provide similar SIMD parallelism, but without precluding streaming or adaptation.

Self-Synchronizing Entropy Decoders: Self-synchronizing entropy decoders do not provide SIMD interleaving of encoded bitstreams, but instead employ a naïve SIMD parallel divide and conquer method to subdivide the bitstream to be decoded. Such self-synchronizing decoding is then intended to make use of the Huffman property of "self-synchronization" to discover synchronization points where symbol codes actually begin, and where the SIMD subdivision should ideally be.

However, self-synchronizing decoders require additional and redundant compute passes on the coded bitstream to determine the synchronization points. The actual decoding can only begin after such operation. Moreover, additional temporary metadata is required to communicate synchronization points between SIMD lanes and also between workgroups. This computation and metadata represent substantial overhead.

A further disadvantage is that a self-synchronizing entropy decoder method requires use of prefix sum wave intrinsics to determine destination addresses. In contrast, an embodiment of a variable width interleaved system may provide highly structured writes, and without requiring wave intrinsics to compute destination addresses.

Gap Array Entropy Encoders/Decoders: Gap array entropy encoders/decoders employ and transmit a metadata structure referred to as a "gap array" to help with parallel decoding. The "gaps" in the array indicate the starting bit position of the first complete codeword in the parallel subdivided streams. While such encoders/decoder employs self-synchronization to determine SIMD parallel starting bits, this employs the gap array to indicate starting bits between the coarser GPU workgroups.

However, the gap array adds metadata overhead and increases complexity of the encoder. In contrast, an embodiment of a variable width interleaved system does not require the gap array metadata or the redundant computation and temporary data required for self-synchronization.

Key loop is the symbol/word decode. Interleaving is done in a fashion that each of the decoders get data separately, but there is an instrumented decoder where you look at how the 32 decoders are requesting data, and data is put into the stream accordingly, this is how the stream is constructed.

In some embodiments, in a compression operation texture data is compressed into symbols. These symbols may then be processed to generate streams of tokens, where each token may represent one or more symbols. Multiple parallel dictionary encoders may be employed to generate token streams of variable lengths. A histogram of the tokens may then be produced in order to build an optimized entropy code.

Utilizing this entropy code, each token stream may be encoded into a bitstream, with the sub-chunks being variably interleaved within each of multiple workgroup in a graphics pipeline, with the size of each workgroup's bitstream being recorded. The outputs of all of the workgroups can then be compacted into a contiguous stream of data without any gaps for transmission or storage. The generated stream may be provided to a decoder pipeline having fused entropy and decoder stages, with the decoder being aware of the symbols being decoded.

In some embodiments, a super-compression pipeline employs multiple (SIMD n) cascaded LZ77 and Huffman entropy encoders in parallel. While a high-performance decompressor is an ultimate goal, the compressor's construction and behavior are critical to the goal of developing such a decompressor. The bitstream write pattern produced by the parallel compressors are required to be precisely synchronized with the bitstream read pattern of the parallel decompressors. In some embodiments, bitstream interleaving provides that a number of bitstreams interleaved varies every iteration, based upon the needs of the decompressor.

Figure 14:
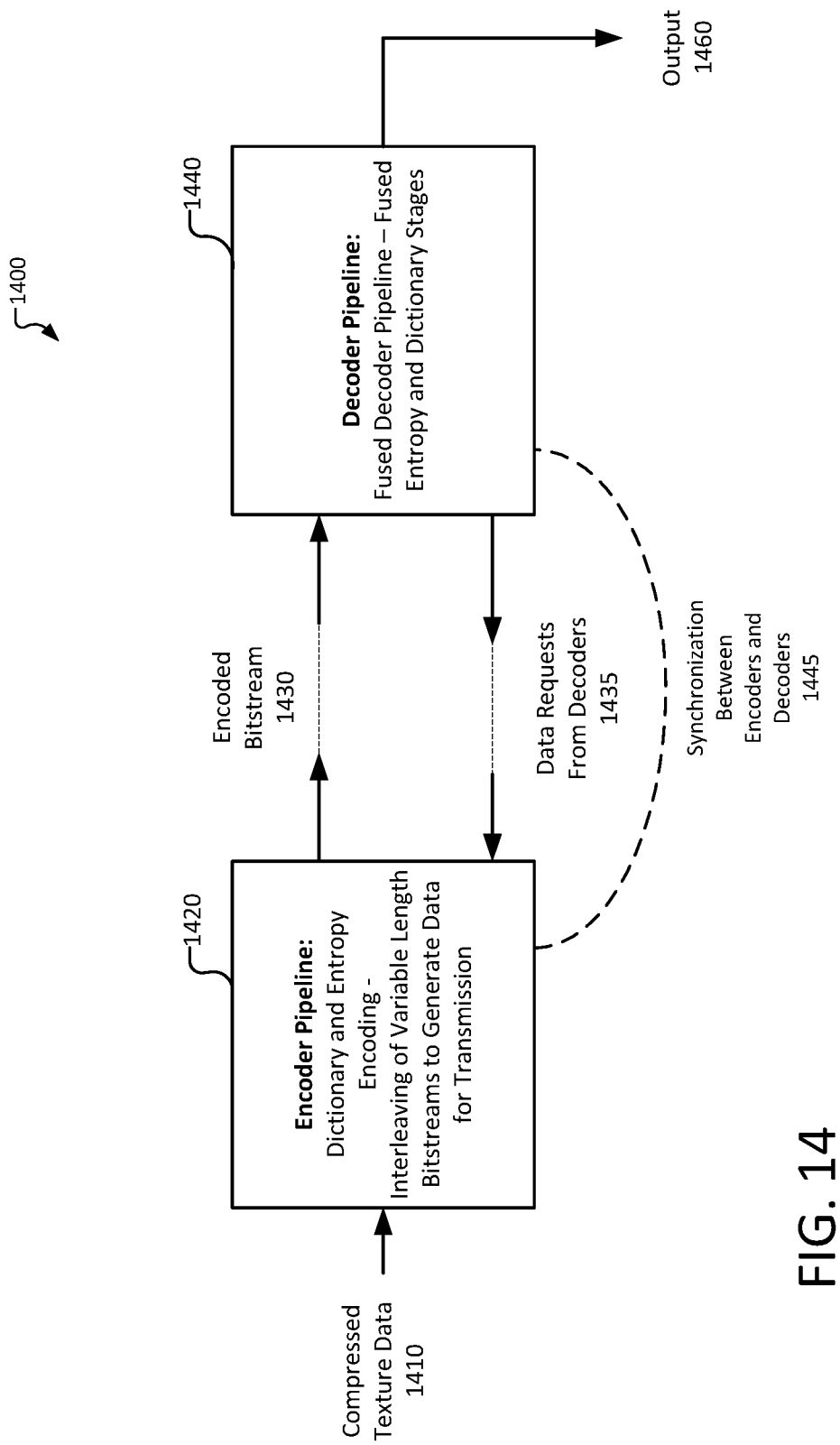
FIG. 14 is an illustration of an encoder/decoder pipeline architecture to provide interleaving of variable bitrate streams, according to some embodiments.

FIG. 14 is an illustration of an encoder/decoder pipeline architecture to provide interleaving of variable bitrate streams, according to some embodiments. In some embodiments, a encoder-decoder apparatus 1400 (which may be referred to as a codec, or coder/decoder) may be provided for one or more processors, where the one or more processors may include one or more graphics processing units (GPUs). The encoder-decoder apparatus 1400 includes an encoder pipeline 1420 and a decoder pipeline 1440. The encoder pipeline 1420 is to receive data for encoding by multiple parallel encoders in each workgroup of a set of workgroups, where the data may include compressed texture data 1410, such as such as texture data in a gaming or other graphics intensive application. The encoder pipeline 1420 provides for dictionary and entropy encoding of the receiving data, the pipeline to provide interleaving of variable length bitstreams to generate an encoded bitstream 1430 for transmission.

The decoder pipeline 1440 is to receive the encoded bitstream 1430, and to provide processing with multiple parallel decoders to decode the bitstream and generate an output 1460 for processing. In some embodiments, the decoder pipeline 1440 comprises a fused decoder pipeline including fused entropy and dictionary stages. In operation, the decoders of the decoder pipeline are to provide data requests 1435 to the encoder pipeline 1420 as the decoders require data for decoding. In some embodiments, the encoder-decoder apparatus 1400 provides synchronization between the encoders and decoders 1445 to enable the encoder pipeline 1420 to deliver encoded data to the decoder pipeline 1440 as required by the parallel decoders in response to the data requests 1435, and to enable to the decoders to locate data for decoding within the encoded bitstream 1430.

Figure 15A:
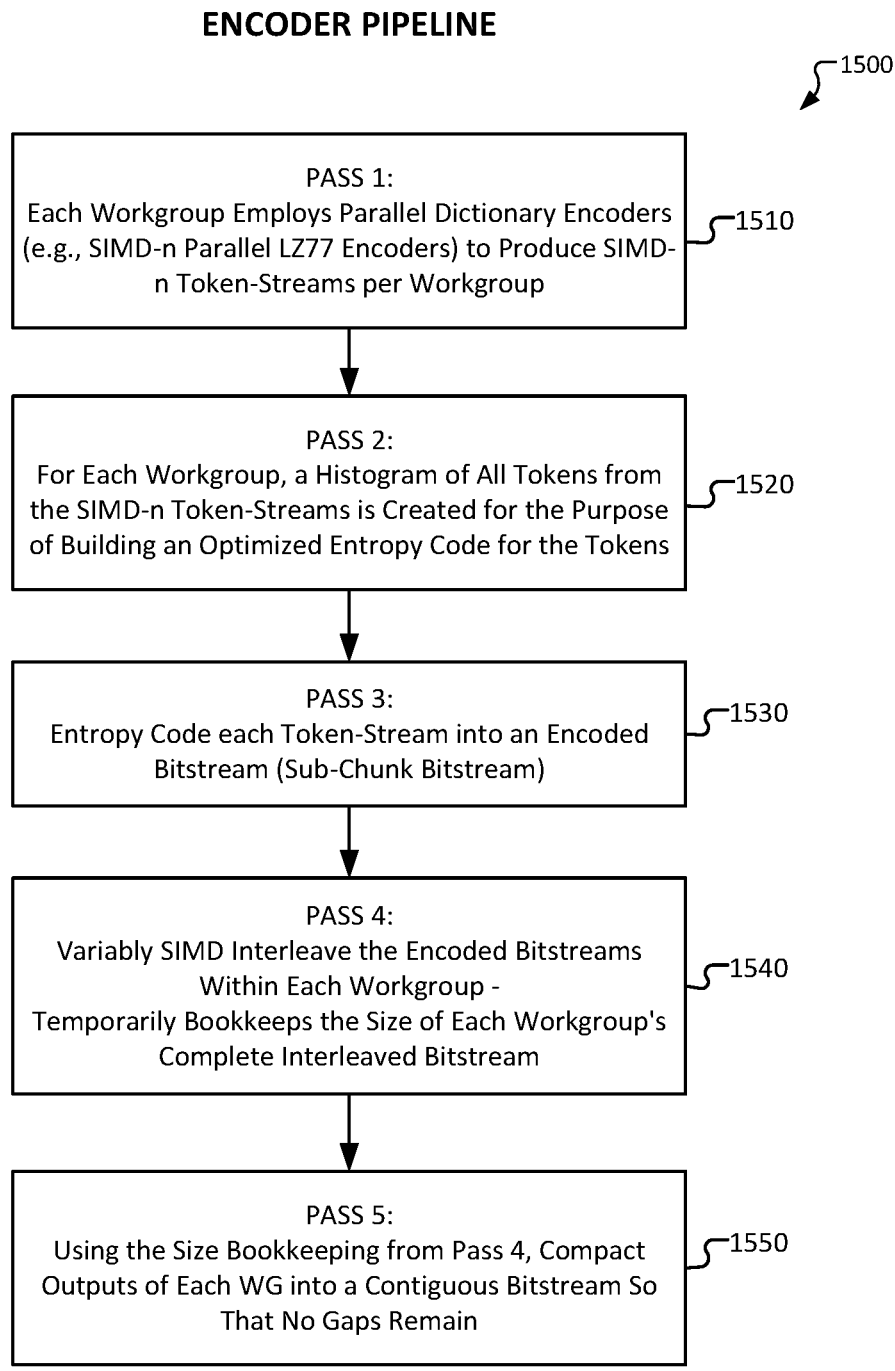
FIG. 15A is an illustration of an encoder pipeline to provide interleaving of variable bitrate streams, according to some embodiments.

FIG. 15A is an illustration of an encoder pipeline to provide interleaving of variable bitrate streams in compression of data, according to some embodiments. In some embodiments, an encoder pipeline 1500, such as the encoder pipeline 1420 illustrated in FIG. 14, may provide encoding of graphics data, including data for gaming or other graphics intensive applications. The encoder pipeline may include the operation of multiple workgroups, each workgroup including multiple parallel encoders.

In some embodiments, the encoding of data by the encoder pipeline 1500 may be performed in five passes:

Pass 1 (1510): In an operation in which multiple workgroups are operating to provide compression of data, such as texture data for graphics operation (which may be in the form of symbols), each workgroup employs multiple parallel dictionary encoders, such as SIMD-n parallel LZ77 encoders, to produce SIMD-n token-streams per workgroup, where the token-streams may be of variable lengths.

Pass 2 (1520): For each workgroup, a histogram of all tokens from the SIMD-n token-streams is created for the purpose of building an optimized entropy code for the tokens. This entropy-code is uniform across the SIMD-n tokens-streams in the workgroup. In some embodiments, for additional savings in compression costs, a set of 'm' workgroups (which may include some or all workgroups in a system) may be pooled together and adopt a single entropy-code set. The pooling of workgroup data in this manner reduces the code-table signaling costs.

Pass 3 (1530): In Pass 3, each of the token streams generated by the workgroups is entropy coded into a bitstream. This bitstream for a workgroup may be referred to as the sub-chunk bitstream, the bitstream including sub-chunks of data from each of the token streams.

Pass 4 (1540): In Pass 4, the sub-chunk bitstreams are variably SIMD interleaved within each workgroup according to which of the multiple decoders requires data for decoding. In this regard, an operation will temporarily bookkeep the size of each workgroup's complete interleaved bitstream. In a particular implementation in which there are 32 lanes with 2 KB symbols, there is a 64 KB granularity, and the data tracks where each 64 KB begins.

Pass 5 (1550): In Pass 5, a final contiguous bitstream is generated. Using the size bookkeeping data generated from Pass 4, the entire bitstream is compacted so that no gaps remain in the bitstream.

For each iteration of the encoding process, corresponding to a decoded symbol, the number of bitstreams that are interleaved is variable based on when each SIMD execution lane of the decoder will need new bits to continue decoding.

Per iteration variability is described in U.S. Ser. No. 17/357,038, filed Jun. 24, 2021, "Variable Width Interleaved Coding for Graphics Processing". However, it is noted that variability in the cascaded compressor in an embodiment presented herein will be more pronounced in comparison with such operation because in an embodiment multiple symbols may collapse into a single token at the dictionary encoding stage, i.e., each token will represent one or more symbols.

Figure 15B:
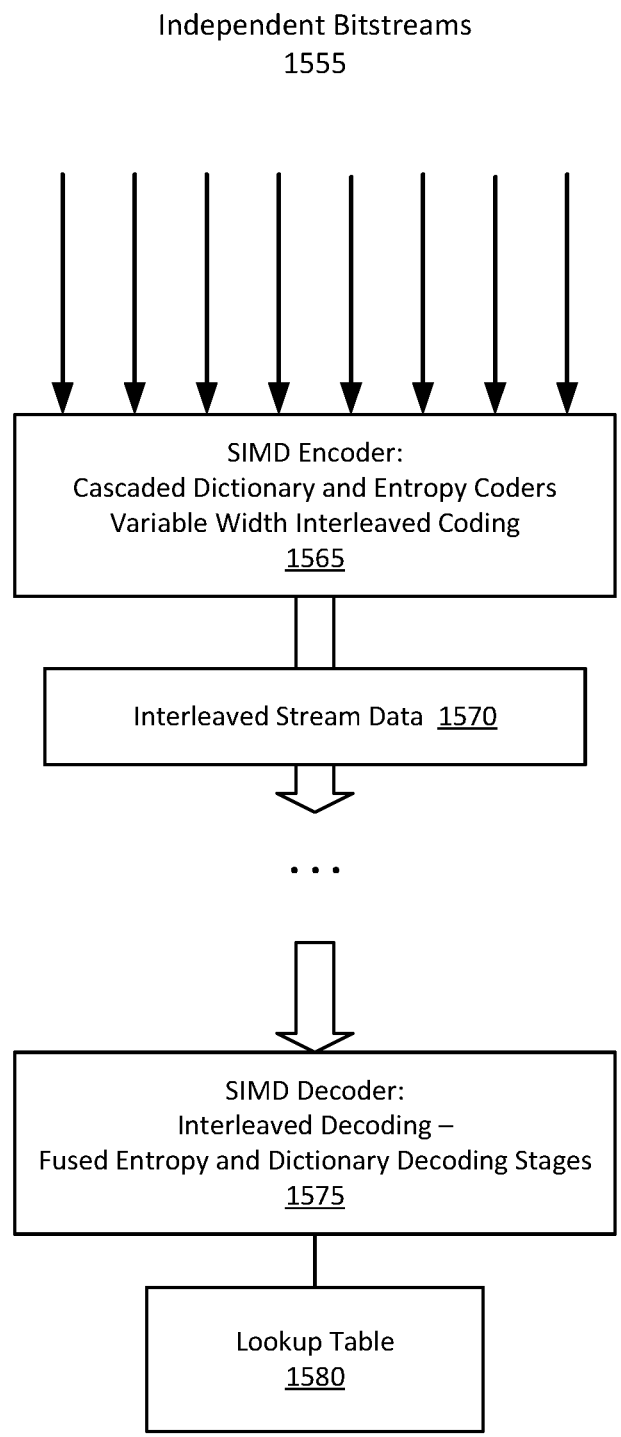
FIG. 15B is an illustration of interleaving of SIMD bitstreams using variable width interleaving, according to some embodiments.
Figure 16A:
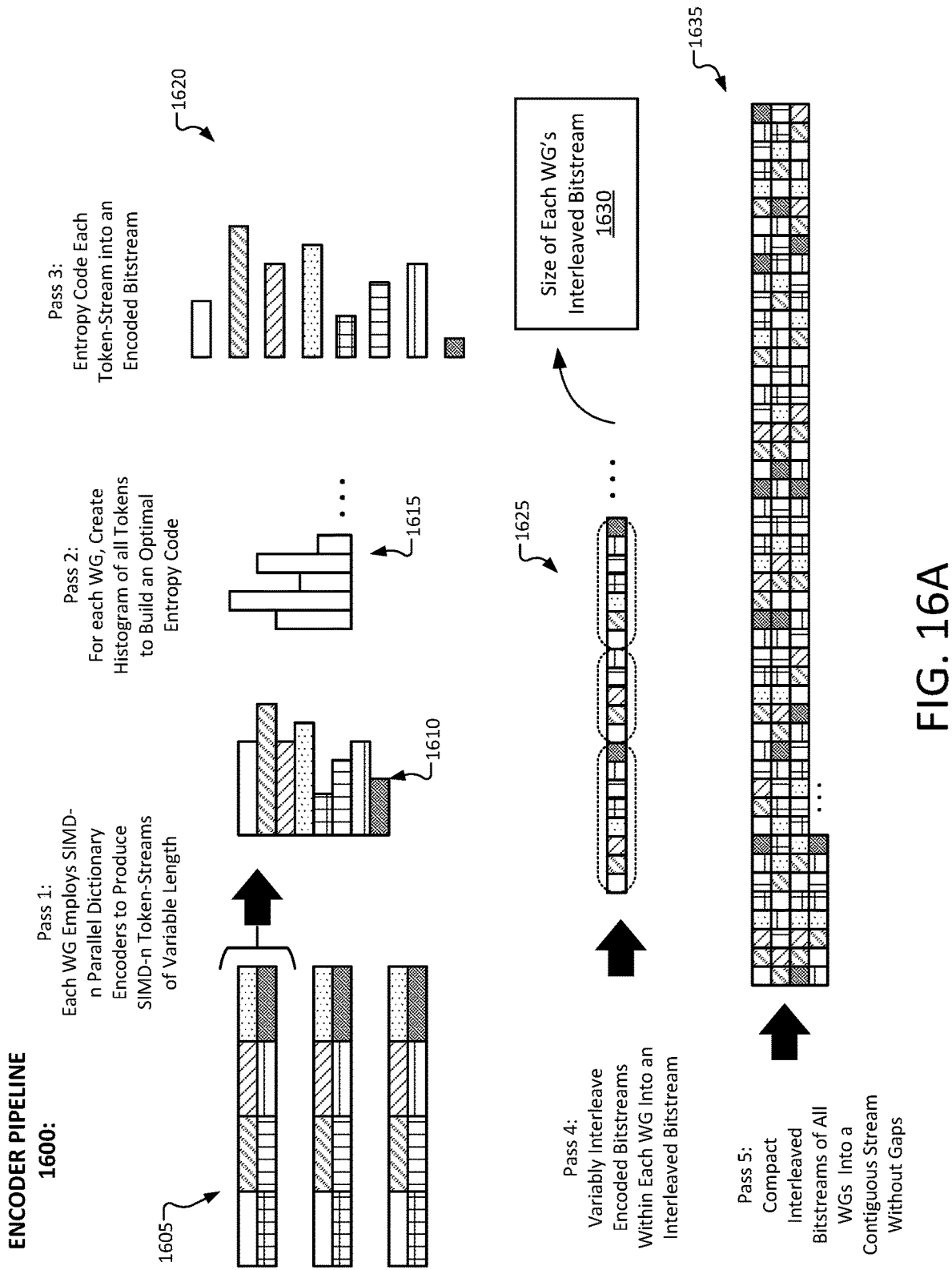
FIG. 16A illustrates operation of a super-compression dictionary and entropy encoder pipeline providing variable width bitstream interleaving, according to some embodiments.
Figure 16B:
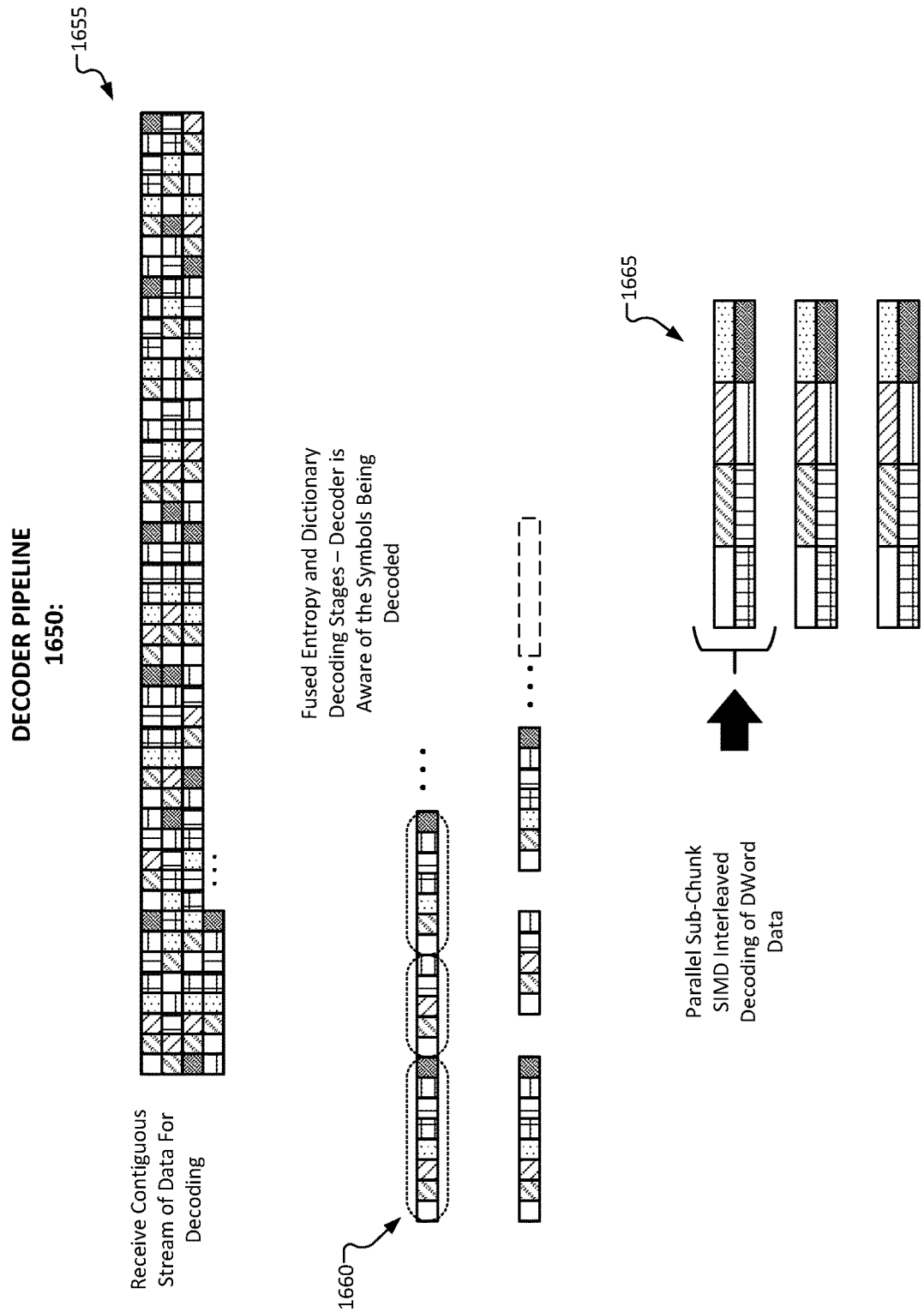
FIG. 16B illustrates operation of a super-compression dictionary and entropy decoder pipeline providing variable width bitstream interleaving, according to some embodiments.

FIG. 15B is an illustration of interleaving of SIMD bitstreams using variable width interleaving, according to some embodiments. As illustrated, multiple independent bitstreams 1555 may be received for encoding. In some embodiments, an SIMD encoder 1565 receiving the bitstreams 1555 includes cascaded dictionary and entropy coders to perform variable width interleaved coding and generate interleaved stream data 1570 efficiently and effectively for transport or storage, the illustrated encoder 1565 comprising multiple dictionary encoders in parallel and multiple Huffman entropy encoders in parallel. The variable width interleaved coding encoding operation may be as illustrated in FIG. 16A. In some embodiments, the data may then be directed to an SIMD decoder 1575 to provide interleaved decoding, such as illustrated in FIG. 16B. In some embodiments, the decoder 1575 includes fused entropy and dictionary decoding stages so that the decoder is aware of the symbols that are decoded. The data may include data relating to a GPU based texture super-decompression pipeline. In some embodiments, the decoder may utilize a lookup table 1580 for entropy decoding, as further described below.

In decoding of tokens, such as illustrated in FIG. 15B, a system may utilize a fundamental iteration or clocking in which a symbol will be decoded by a decoder in each iteration. In a particular implementation, each decoder is initially provided with one DWord (Double Word—comprising 4 bytes/32 bits) for decoding, and request data when the amount of data left is less than a certain value (such as 32 bits). In a decoding operation the number of iterations that will pass before a particular decoder requires additional data for decoding is dependent on the number of symbols that were compressed within the token that the decoder has received for entropy-decoding, i.e., the decoders will be consuming data at different rates. For example, if a certain decoder lane has entropy-decoded a token that represents 'm' symbols (wherein m is a positive integer of 1 or more), then 'm' symbol decoding iterations will pass before that lane needs more data for decoding, and the decoder will not request data until a required threshold of data left for decoding is reached. In another example, if a decoder is decoding a single symbol, additional data will be required in a next iteration. Because the decoder lanes count iterations based on the number of symbols that are decoded rather than the number of tokens that are decoded, all decompression lanes are aware of their progress and operate to keep themselves synchronized.

In some embodiments, the interleaving of data is accomplished based on the number of decoder lanes requiring data utilizing a prefix sum. In an example, a decoder in lane 16 (of lanes 0 through 31) has 16 decoder lanes ahead of it (lanes 0-15) in obtaining data. For each lane requesting data there may be bit that is set ('1'), with an operation tracking such values. If 10 of the lanes 0-15 request data, then lane 16 will access the 11th DWord in the stream. Thus, the interleaving provided in the encoding operation, such as illustrated in FIG. 15A, is utilized in this manner in the decoding operation.

Algorithms for High Performance GPU Memory Reads and Writes-Both the GPU memory read and the memory write behaviors of a decoder, such as SIMD decoder 1575, are crux design concerns for a high performance video system, such as a PC gaming system. In general, GPU compute software will perform significantly better when logically adjacent kernel instances can load or write logically adjacent data in memory. For a given cacheline load, this adjacency pattern ensures that there are no gaps of unnecessary data between explicitly loaded values. Following this pattern allows kernel/shader compilers to implement memory reads with maximally efficient SIMD vector loads, instead of the more general but far slower SIMD gather loads. The design of an embodiment of a decoder may be utilized to ensure use of SIMD vector loads for memory streaming reads.

In some embodiments, a decoder's streaming writes to memory are similarly implemented with SIMD vector stores, instead of more general but far slower SIMD scatter stores. Avoiding SIMD scatter stores on GPUs is also important because this avoids expensive partial writes, which can provide two to three times worse performance than well-formed complete cacheline writes. Achieving this memory write behavior will assist in maximizing memory cache efficiency. In some embodiments, the algorithm design choices that follow may work together to support these optimal memory behaviors.

Variable Width Bitstream Interleaving—An embodiment of a super-compression pipeline may employ multiple (SIMD n) Huffman entropy encoders in parallel. While a high-performance decoder is an ultimate goal, the encoder's construction and behavior are critical to the goal of developing the decoder. The bitstream write pattern produced by the parallel encoders need to be synchronized with the bitstream read pattern of the parallel decoders. In some embodiments, the bitstream interleaving provides a number of bitstreams interleaved that may vary with every iteration, based upon the needs of the decoder.

FIG. 16A illustrates operation of a super-compression dictionary and entropy encoder pipeline providing variable width bitstream interleaving, according to some embodiments. In some embodiments, the encoder pipeline 1600 for a workgroup is operable to receive SIMD-n bitstreams 1605, such as the n=8 bitstreams illustrated in FIG. 16A, for encoding. However, this is an example, and embodiments are not limited to any particular number of bitstreams. An embodiment of a respective decoder pipeline that may operate together with the encoder pipeline 1600 may be as illustrated in FIG. 16B.

As shown in FIG. 16A, an encoder pipeline operation of the pipeline 1600 consists of five passes:

Pass 1: Each workgroup (WG) in a system performs parallel sub-chunk entropy encoding—Each workgroup employs SIMD-n parallel dictionary encoders to produce SIMD-n coded token-streams 1610 per workgroup, wherein the token-streams 1610 consist of data of variable lengths in the dictionary encoding.

Pass 2: For each workgroup, a histogram 1615 is created for all tokens in order to build an optimized entropy code. In some embodiments, a set of 'm' workgroups (which may include some or all workgroups in a system) may be pooled together and adopt a combined entropy-code set.

Pass 3: Each token-stream is then entropy coded into a bitstream (sub-chunk bitstream) 1620, the bitstream including sub-chunks of data from each of the token streams.

Pass 4: Each workgroup performs parallel sub-chuck entropy SIMD interleaving of DWord data—As illustrated, the encoder pipeline operation provides for variably SIMD interleaving of the coded bitstreams to generate an interleaved bitstream 1625 for each workgroup. An embodiment is to temporarily bookkeep a size of each workgroup's complete interleaved bitstream 1630. Each iteration may include a different number of DWords from the coded bitstreams based at least in part on the current data requirements of the decoder pipeline (such as illustrated in FIG. 16B), such as an Iteration 0 including 8 DWords, an Iteration 1 including 5 DWords, an Iteration 2 including 7 DWords, and continuing with following iterations.

Pass 5: The outputs of all workgroups are compacted into a contiguous stream of interleaved data without gaps—Using the size bookkeeping from Encoder Pass 4, the entire bit stream is compacted into a contiguous stream of data such that no gaps remain. An example of a contiguous stream 1635 is illustrated in FIG. 16A.

FIG. 16B illustrates operation of a super-compression entropy decoder pipeline providing variable width bitstream interleaving, according to some embodiments. A decoder pipeline 1650 is to receive a stream of interleaved data 1655 as generated by a super-compression entropy encode pipeline, such as illustrated in FIG. 16A. The interleaved data includes varying lengths of DWord data, such as the illustrated iterations including 8 DWords, 5 DWords, 7 DWords, and continuing with following iterations. In some embodiments, the decoder pipeline is to provide data requirements for the decoders to the encoder pipeline to allow the encoder pipeline to generate the data stream in the manner such that the decoders will correctly read the received data stream.

In some embodiments, the decoder pipeline includes fused dictionary and entropy decoding, and wherein the decoder pipeline is aware of the symbols that are to be decoded. The decoder then can separate the contiguous stream into data chunks according to such data requirements 1660. The decoder then is to perform parallel sub-chunk SIMD interleaved decoding of the DWord data to regenerate the data streams 1665. The decoding of the DWord data may include use of a lookup table to perform decoding of the entropy coded data, as further described below.

For each iteration of the encoding pipeline, the number of bitstreams that are interleaved is variable based on when each SIMD execution lane of the decoder will need new bits to continue decoding. An example of this per iteration variability is shown in FIG. 16A. Because of this variability and because no metadata is required to be transmitted to support it, each iteration of the encoder and decoder is to compute indices into the SIMD interleaved bitstream. To enable correctly computing these indices to the interleaved bitstream, the GPU implementations of both the encoder and decoder are to collaborate on several design choices.

In some embodiments, a parallel encoder is implemented with an SIMD width that is equal to the SIMD width of the target GPU ISA. The selection is dependent on the particular implementation. In an example, GPUs may have a SIMD width (aka warp size) of 32 in a first case; may have a SIMD width (aka wavefront) of 32, and sometimes 64, in a second case; or may have a SIMD width of 8, 16, or 32 in a third case. For DirectX gaming applications on GPUs, SIMD-16 is most common, although SIMD-32 may be enabled with compiler extensions.

In some embodiments, the encoder and decoder also select a kernel workgroup size that is equal to the target GPU SIMD width. This workgroup size choice enables the GPU compute decode kernel to avoid all expensive barrier calls when using shared local memory. The choice also enables the GPU compute decode kernel to employ fast wave intrinsics that are restricted to working at GPU SIMD widths.

GPU memory hierarchies and GPU execution unit hardware data paths are designed to work with DWord sized (4 bytes) data values per SIMD lane. Thus, an encoder and decoder are to write and read bits in DWord sized increments. This choice drives both the bitbuffer design and the SIMD interleaving bit stream addressing logic. This choice also drives the size choice of the input Huffman symbol size to be one-byte symbols. Thus, four one-byte symbols pack neatly into a single four-byte DWord.

```
StreamBitsIfNeeded( )
Begin
    If (bitbuffer<1 DWord threshold)
        index=iterationBase+WavePrefixSum (1)
        // Use SIMD vector loads to read source bitstream
        Load bitbuffer with a new source DWord from index
        iterationBase=index+1
    Endif
    iterationBase=WaveMaxActive (iterationBase)
End
```
Algorithm 1

Algorithm 1 provides an illustration of pseudo code for StreamBitsIfNeeded ( ). Each iteration of this algorithm will test if more bits are needed. If so, then a PrefixSum( ) is used to compute offset indices from a base, and streams bits from the SIMD interleaved bitstream.

Computing Bitstream Indices with Wave Intrinsics—In some embodiments, both the Encoder Pass 2 (element 1520 as illustrated in FIG. 15A, Pass 4 as illustrated in FIG. 16A) and the decoder use PrefixSum( ) and ActiveMax( ) wave intrinsics to efficiently compute indices into their bitstreams. As these execute, each iteration will test if each lane's bitbuffer has reached a threshold (e.g., a full DWord of 32 bits), and then stream more bits as needed. Each iteration begins with a base index for all SIMD lanes. A PrefixSum( ) wave intrinsic is used to determine offsets from that base index. All active lanes reaching the threshold will compute an offset index and stream, while inactive lanes will not participate. After testing, computing index, and streaming, then an ActiveMax( ) intrinsic is used to compute a new base index for the next iteration. The relevant pseudo code is shown in Algorithm 1.

As the Encoder Pass 4 (element 1540 as illustrated in FIG. 15A, Pass 4 as illustrated in FIG. 16A) writes its SIMD interleaved bitstream 1625, the operation makes use of an "instrumented" version of the decoder and Algorithm 1. Instead of reading bits, each iteration of the instrumented version of Algorithm 1 informs the Encoder Pass 4 how to write the interleaved bitstream. Effectively, the decoder is to inform the encoder exactly how the decoder will read the interleaved bitstream.

In some embodiments, unlike certain previous techniques, a decoder's SIMD interleaving requires no additional metadata and no redundant computation to determine this variability, and where bits for each bitstream reside. The instrumented decoder predicts the variability so that encoder and decoder will be synchronized. Furthermore, this bitstream pattern enables 1) fast SIMD vector loads 2) constrained execution divergence 3) fast SIMD vector stores.

Fast SIMD vector loads: In some embodiments, the encoder bitstream pattern ensures that the decoder can perform memory reads that fetch contiguous data, and that the decoder does not fetch cachelines containing gaps of unused data. While each iteration may read contiguous data that is not perfectly aligned to cacheline boundaries, any residual cacheline over fetch will be quickly consumed on the next iteration, thus avoiding any wasteful cacheline reads. The contiguous quality of the source bitstream interleaving enables the GPU decoder to use fast SIMD vector loads.

GPU Huffman Table Lookup Design-Critical to the performance of a Huffman entropy decode GPU implementation are design choices regarding the lookup table driven Huffman decode. While the textbook classical implementation of Huffman coding represents codes as a bitwise binary tree, both coding and decoding can be written as translation tables. Because of the variable lengths of Huffman codes, the design of the decode tables requires care. In some embodiments, a GPU friendly multi-level Huffman lookup table is designed to employ 8 bits per level lookup and to constrain the maximum codelength to 16 bits.

Multi-level Table Design—In some embodiments, a first design choice for a lookup table may use 8 bits to index each level table in the multi-level lookup tables. Like the one-byte symbol choice, this pairs well with the four-byte DWord bitstream interleaving. This choice also means that only a single level lookup will be needed to decode the most common symbols, which will be encoded with codes in the 5-8 bits range.

In some embodiments, a second design choice may limit a maximum code size to 16 bits. This in turn limits the depth of multi-level table look up to two levels. An advantage of this choice is to minimize SIMD divergence as the GPU decoder decodes interleaved bitstreams. While decoding, a given iteration will diverge by at most a single level table lookup. However, in practice the most frequently occurring symbols will require only a first level decode lookup, frequently resulting in no execution divergence.

For such a lookup table design of 8-bit indices and 16-bit maximum code length for 256 symbols, the total memory for storing the tables is variable based on the entropy probability distribution of the source symbols to be encoded. The total lookup table memory used for storing all the tables (in all the levels) is variable. In a worst case, total table memory needed=(Entry_Size)*(256+256*256)=4 B*256*256=256 KB. This worst case corresponds to the maximum entropy case of every symbol (of the 64K symbols) being equally probable. In contrast, in a best case, total table memory needed=(Entry_Size)*256*2=4 B*256*2=2 KB. This best case corresponds to the extremely skewed probability distribution where there are 511 (255+256) symbols of which the 255 symbols have a probability of 1/256 each and the other 256 symbols have a probability of 1/(256*256).

In general, required table sizes are a function of the probability distribution of the symbols. In some implementations approximately 75% savings in the memory needed may be achieved. Empirically, good decode performance results may be seen with table sizes of 32 KB and 64 KB. Such table sizes are supportable by GPU caches, and will fit in level 2 GPU caches, and often even in level 1 GPU caches.

Flat Lookup Table—Because GPU compute languages such as DirectX® HLSL (High-Level Shader Language) generally do not support memory address pointers and allow only a small number of buffers to be bound to a compute kernel's execution, an embodiment may "flatten" the multi-level decode lookup table. In this instance flattening refers to all next level memory pointers being converted into integer indices, and which then are offset so that table levels reside within a single contiguous buffer. This process can be done offline, prior to the table use in the encoder and decoder.

Table Entry Structure—As described above, GPUs are generally designed for DWord data elements. Thus, a multi-level decode lookup table may employ a single DWord for each table entry. In this implementation, each 32-bit entry dedicates:

24 bits: Decoded symbol or next level index
7 bits: Number of bits decoded
1 bit: Flag indicating symbol or index.

Targeting Both GPU Shared Local Memory and GPU Cached Memory—It may be demonstrated that, with the above described tables, the decoder can better take advantage of GPU architecture by storing the first level lookup table in 1 KB of GPU shared local memory. An embodiment may rely on demand-driven memory caching to supply any needed entries for subsequent levels. Moreover, GPUs often implement shared local memory with DWord size memory ports, which enables multiple GPU SIMD lanes to simultaneously access different adjacent DWords. In a particular implementation, the choice of DWord sized table entries aligns to this performance opportunity. Storing only the 1st level table lookup in shared local memory is an additional advantage of an embodiment and distinguishes it from other implementations. The algorithm and the features described may be applied to map better to a GPU than existing concepts.

Hypothetically, if a decoder were to store the entire table in shared local memory, it would spend needless cycles loading table values that may not be needed. Also allocating larger amounts of shared local memory (e.g. 24 KB, 32 KB, 48 KB . . . ) to each workgroup quickly forces GPU schedulers to drive down concurrent GPU occupancy. As empirical testing has shown, both of these concerns may substantially degrade the performance of a decoder, and these are avoided by only loading the first level. For each GPU compute workgroup, a decoder allocates only a single 1 KB to Huffman table storage and 4 KB to streaming write buffering. This very modest shared local memory allocation does not impact GPU occupancy on modern GPUs.

Pseudo code for an embodiment derived from HLSL code for the table lookup is shown in Algorithm 2.

```
HuffmanTableLookup( )
Begin
    // 1st level from SLM:
    bits=Get 8 bits from bitbuffer
    tableEntry=1stLevelTableInSharedLocalMemory
        [bits]
    If (tableEntry.isASymbol)
        Put bits back into bitbuffer per tableEntry.numBits-
            Decoded
        Return tableEntry.symbolOrIndex
    Endif
    baseLevel=Index from tableEntry.symbolOrIndex
    // 2nd level from cached memory:
    bits=Get 8 bits from bitbuffer
    tableEntry=2ndLevelTableInCachedlMemory
        [baseLevel+bits]
    Put bits back into bitbuffer per tableEntry.numBitsDe-
        coded
    Return tableEntry.symbolOrIndex
End
Algorithm 2
```

Algorithm 2: Pseudo code derived from the HLSL implementation for the flattened lookup table for Huffman decode. In some embodiments, the iteration for the first level lookup is broken out so that it can used in shared local memory, and any second level lookups will use cached memory accesses.

Further Improvements to Table Design—In some embodiments, there are further table design considerations that may be implemented to provide additional improvements, including:

Codewords that consume fewer bits than the index bit-width are repeated at multiple indices. This is an inefficiency that can be addressed. The record size (size of each table entry) can be optimized to the following: ceil(log 2(alphabet size))+ceil(log 2(index size))+1. Thus, for an alphabet as large as 4096 symbols, only a 16 bit record is needed for 8 bit indexing. If record size optimization is insufficient, an additional level of indirection can be added at each level of table look-up to further reduce the inefficiency of memory use (at the cost of added indexing).

A shared standard Huffman table could be employed across chunks of a given texture asset, or even across texture assets. Using such a shared table would likely reduce compression ratios, but it would substantially level GPU cache hierarchies allowing independent decodes to share the same cached table, and ensuring it is always warm in the cache.

GPU Decoder To Constrain Execution Divergence And Enable Vector Stores—In describing the construction of the Huffman encoder pipeline and the design of the Huffman multi-level decode tables, several design choices described herein also apply to construction of the decoder. Among those, the same Algorithm 1 may be employed by the GPU decoder to efficiently compute indices to the SIMD interleaved bit stream.

The decoder is shown conceptually in FIG. 16B. The GPU decoder also uses the carefully designed multi-level lookup table that is efficiently traversed with Algorithm 2. To support Algorithm 2, the decoder also first loads the first-level lookup table into 1 KB of shared local memory. FIG. 16B provides a conceptual view of a decoder as GPU SIMD lanes read from an SIMD interleaved bitstream, according to some embodiments.

Constrained Execution Divergence—An additional advantage of an embodiment is that the SIMD execution divergence of the decoder is constrained to fall only within the two conditionals shown in Algorithm 1 and Algorithm 2. The frequency of Algorithm 2's divergence will be occasional. This limited divergence will be resolved quickly after the two conditionals. In a particular implementation, will be no divergence in the outer loop, and no other divergence in the decoder's execution. This constrained execution divergence together with the processing pattern on the interleaved bitstream ensures a highly structured SIMD execution.

Fast SIMD Vector Stores—Because of the highly structured execution of an embodiment, at the end of each decoder iteration in each SIMD lane, four adjacent symbols will be fully decoded and ready to form fully packed DWord. The subsequent iterations of each lane will produce more fully packed DWords that are memory adjacent to the DWords produced by previous iterations. Although any single iteration would still require slower SIMD scatter stores and painful partial writes because the execution is highly structured, the algorithm can avoid these and employ GPU shared local memory.

Buffering Writes with Shared Local Memory—In some embodiments, an additional amount of shared local memory (for example, 4 KB) is allocated to every workgroup. As the decoder iterates, it will buffer locally multiple cacheline size runs of contiguous data, produced by several iterations of the decoder. Periodically, as that shared local memory buffer is filled, the decoder then writes out several complete cachelines with fast well-behaved SIMD vector stores. The decoder continues repeating this periodic pattern of buffering to shared local memory, and then bursting out vector writes, until the interleaved bitstreams has been fully decoded. It is noted that while this is described herein as a GPU compute software realization, it also describes construction of GPU fixed function hardware.

Pseudo code for an embodiment of decoder is shown in Algorithm 3. It demonstrates the necessary iteration patterns, management of these shared local memory allocations, and invocations of Algorithm 1 and Algorithm 2. Algorithm 3 provides an illustration of pseudo code derived from an HLSL GPU implementation for the Huffman decoder.

---

Algorithm 3

---

```
GPUHuffmanDecoder ( )
Begin
    // Load 1KB 1st level look table to SLM, via SIMD vector loads
    Each SIMD lane loads a slice to SLM
    // Iterate over all subchunks
    For (sc = 0 ... numSimdSubChunksPerTile)
        // Iterate until enough contiguous DWords
        For (dword = 0 ... numContigDWords)
            // Fully decode four symbols:
            For (s = 0 ... 4 symbols)
                // The only execution divergence lives here:
                bitbuffer = StreamBitsIFNeeded ( ) // Algorithm 1,
                SIMD vector loads
                symbol[s] = HuffmanTableLookup ( ) // Algorithm 2
            EndFor
            // Temporarily store in shared local memory:
            slmBuffer [dword][SIMDLaneId] = symbol [ ]
        EndFor
        // Now flush shared local memory to regular memory.
        // This will enable fast SIMD vector stores
        For (dword = 0 ... Num of contiguous DWords to store)
            index = sc + (dword * numSimdSubChunksPerTile) +
            SIMDLaneId
            // SIMD vector stores:
            memBuffer[index] = slmBuffer[SIMDLaneId][dword]
        EndFor
    EndFor
End
```

---

It is noted that Algorithm 1, Algorithm 2, and Algorithm 3 are examples of particular implementations, and embodiments are not limited to such examples.

Figure 17A:
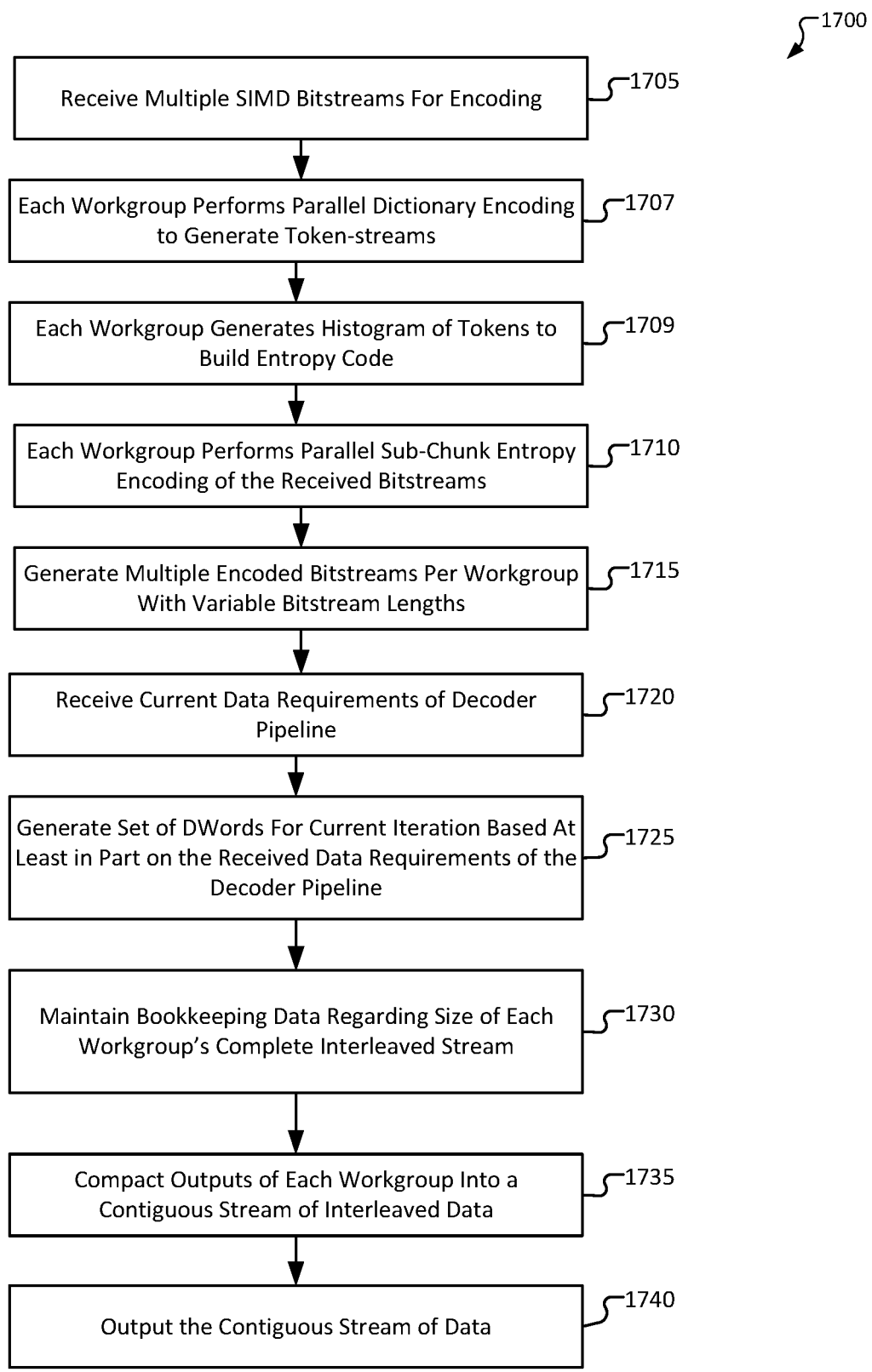
FIG. 17A is an illustration of a process for variable width interleaved dictionary and entropy coding for graphics processing, according to some embodiments.

FIG. 17A is an illustration of a process for variable width interleaved dictionary and entropy coding for graphics processing, according to some embodiments. In a process 1700 for variable width interleaved Huffman coding, multiple SIMD bitstreams are received for encoding 1705. The received data may include, for example, texture data for a graphics application, such as a gaming or other graphics intensive operation. Each of multiple workgroups for a graphics processor is to perform parallel encoding to generate token-streams in a first pass 1707, and is to generate a histogram of tokens in a workgroup for purposes of building an optimized entropy code in a second pass 1709. In some embodiments, a combined histogram may be generated for multiple workgroups, which may include some or all of the workgroups in a system.

Each of multiple workgroups is to perform parallel sub-chunk entropy encoding in a third pass 1710. In some embodiments, each workgroup employs SIMD-n parallel entropy encoders to produce SIMD-n coded bitstreams per workgroup 1715, the coded bitstreams consisting of data (generally DWord data) of variable lengths in the entropy encoding.

In some embodiments, the process 1700 continues with receiving current data requirements of a decoder pipeline 1720. Based at least in part on the received current data requirements of the decoder pipeline, a set of DWords is generated for the current iteration in a fourth pass 1725. A determination whether more bits are needed may be made according to the provisions of Algorithm 1. In this manner, each iteration of the encoding operation may have a different number of DWords from the coded streams according to the current data requirements of the decoder pipeline. In some embodiments, the process includes maintaining bookkeeping data regarding the size of each workgroup's complete interleaved data stream 1730.

In some embodiments, the process 1700 continues with compacting the outputs of each workgroup into a contiguous stream of interleaved data 1735 (which may also be referred to as a continuous data stream) in a fifth pass, the contiguous stream being formed to reduce or eliminate any gaps between the multiple streams of data. In some embodiments, the bookkeeping data regarding the size of each workgroup's complete interleaved data stream is utilized in the generation of the contiguous stream. The contiguous stream of data then may be outputted for use in the graphics processing 1740. In some embodiments, the continuous stream of data may also be buffered or stored as needed.

Figure 17B:
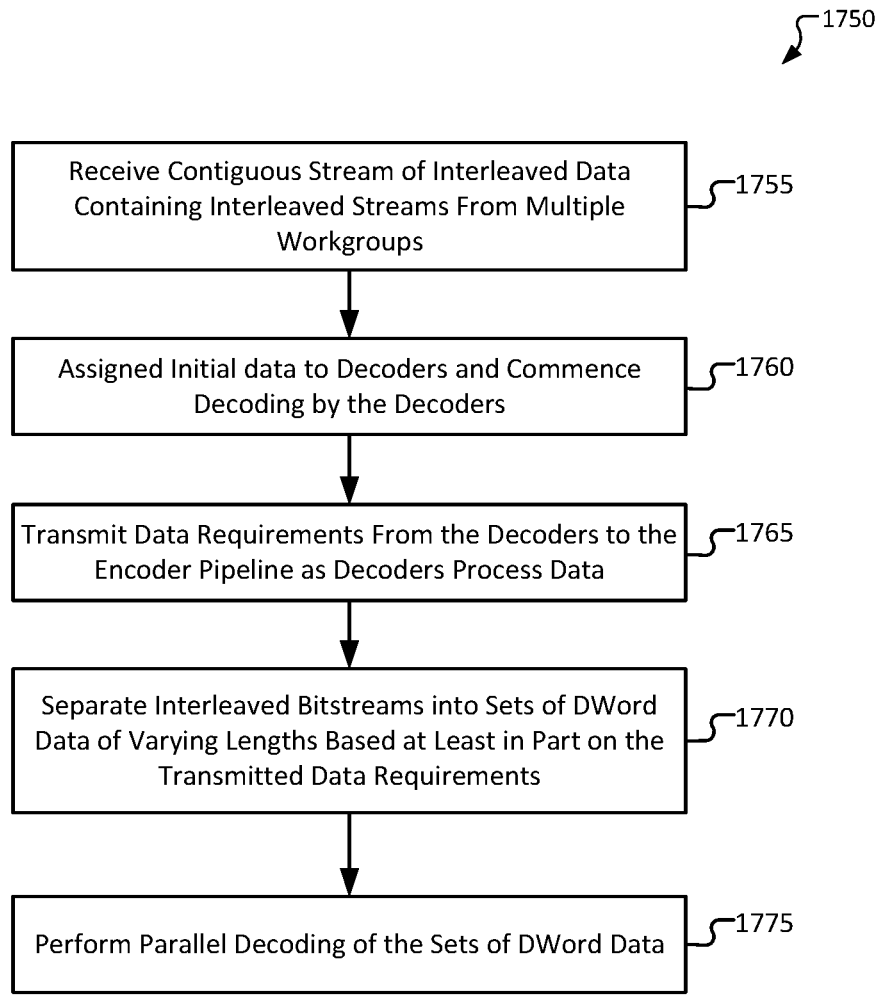
FIG. 17B is an illustration of a process for decoding of variable width interleaved data for graphics processing, according to some embodiments.

FIG. 17B is an illustration of a process for decoding of variable width interleaved data for graphics processing, according to some embodiments. In a process 1750 for variable width interleaved decoding, a contiguous stream of interleaved data is received for decoding 1755, the contiguous stream comprising interleaved data streams of multiple workgroups, such as generated according to FIG. 17A. In some embodiments, the decoder includes fused dictionary and entropy decoding. In some embodiments, initial data may be assigned to decoders and the decoders may commence decoding 1760, if provided in an implementation.

In some embodiments, the process 1750 continues with each decoder transmitting data requirements of the decoder to the encoder pipeline 1765, the data requirements to inform the encoder how the decoder will read the received stream and thus allow the encoder to build the stream according to the decoder's data needs.

In some embodiments, the contiguous stream is separated into multiple sets of DWord data of varying lengths based at least on the data requirements that were provided to encoder by the decoder 1770. The process 1750 then provides for performance of parallel decoding of the DWord data to regenerate the input data streams 1775.

Writing Native Tiling from Shared Local Memory Buffer—In some embodiments, an additional refinement to the process 1750 allows compute shader kernels, such as a Huffman decoder, to directly write native tiled GPU format for block compressed textures. This provides an additional novel GPU capability that removes the requirement for a GPU to run a secondary copy engine postprocessing pass to store the decoded texture data in the native tiled GPU format. The Huffman decoder method's use of shared local memory buffering may be extended seamlessly to support such a capability. Instead of requiring the writing of contiguous cachelines, the process would provide for writing the relevant native tiled pattern.

Shared Local Memory (SLM) Direct Memory Access (DMA)—It is noted that special function "SLM DMA" hardware may be added to GPUs for direct memory transfers into and from shared local memory. Such SLM DMA may not be present in contemporary GPUs, but may be helpful for the load of the 1 KB first level table, and assist in eliminating instruction cycles currently employed to load the first level table. If the SLM DMA also supported write capability, this may also be used for writing out the 4 KB shared local memory buffers to GPU memory, and eliminating instruction cycles currently employed to do so.

Gaming Use Cases—An embodiment may enable the fast decompression of game media assets, and addresses two end-user perceptible use cases in PC platform game applications:

1. Fast game load; and
2. Dynamic streaming of game assets.

In fast game load, it is critical to maximize read bandwidth in reading game assets from persistent NVMe (Non-Volatile Memory express) SSD (Solid-State Drive) storage, and to read the collection of media assets as fast as possible. The goal is to deliver an "instant on" game start up experience to the end user. This allows game developers to avoid showing annoying and non-interactive game content such as load screens or cut scenes to distract the end user, while slow loading game content in the background.

In dynamic streaming of game assets, game worlds may dynamically choose which texture assets and even which tile of which texture MiP level to load. This might be based on which assets are needed to render the current scene view, or on level of detail choices, or both. Significant new rendering innovations by game developers are fueled by the higher bandwidth persistent storage of NVMe SSD, and accelerated asset streaming systems such as described herein.

Target Problem Domain—To improve bandwidth from GPUs to NVMe SSDs, new game consoles dedicate significant fixed function custom IP for fast read and inline decompression of compressed game assets. However, this technology is not present on conventional PC platforms. It is noted that the Microsoft DirectStorage API seeks to lay a foundation for streaming decompression services on future PC platforms. For these services, it is critical to provide high performance GPU software and hardware implementations.

The most important stored game assets for GPU rendering are the block-compressed texture assets. These are often stored in well documented block compression formats such as DirectX's BC1 or BC7 for example. It can be determined from analysis of modern PC games that such GPU texture assets can often occupy 75%, 80%, or more of a Game's asset storage footprint. This varies with specific game content.

Streaming compression services provides second level lossless compression on top of those already block-compressed texture assets. This meta-level lossless compression is typically referred to as super-compression, or super-decompression for read the case. To support the gaming use cases, the super-decompression design goals are to provide ~2× or better bandwidth multiplier for SSD reads, a high performance super-decompression implementation for GPUs, and to efficiently yield conventional block-compressed textures that are ready for immediate rendering use by GPUs.

A super-decompression pipeline may be expected to be composed of a number of decompression algorithms, with fast entropy decode as a key foundational algorithm. The described implementation is focused on Huffman decode as the chosen entropy algorithm, but embodiments of these techniques may well apply to other entropy coding/decoding algorithms.

Texture Decompression Processing Parallelism—In order to maximally exploit the highly parallelized compute throughput of GPUs, it critical to have enough independent units of parallel work to do. Huffman decode of super-compressed texture assets can be subdivided to suit this need for GPU parallelism. These levels of texture decompression parallelization are important as they form the algorithmic foundation of a variable width SIMD interleaved encoder and decoder.

Figure 18:
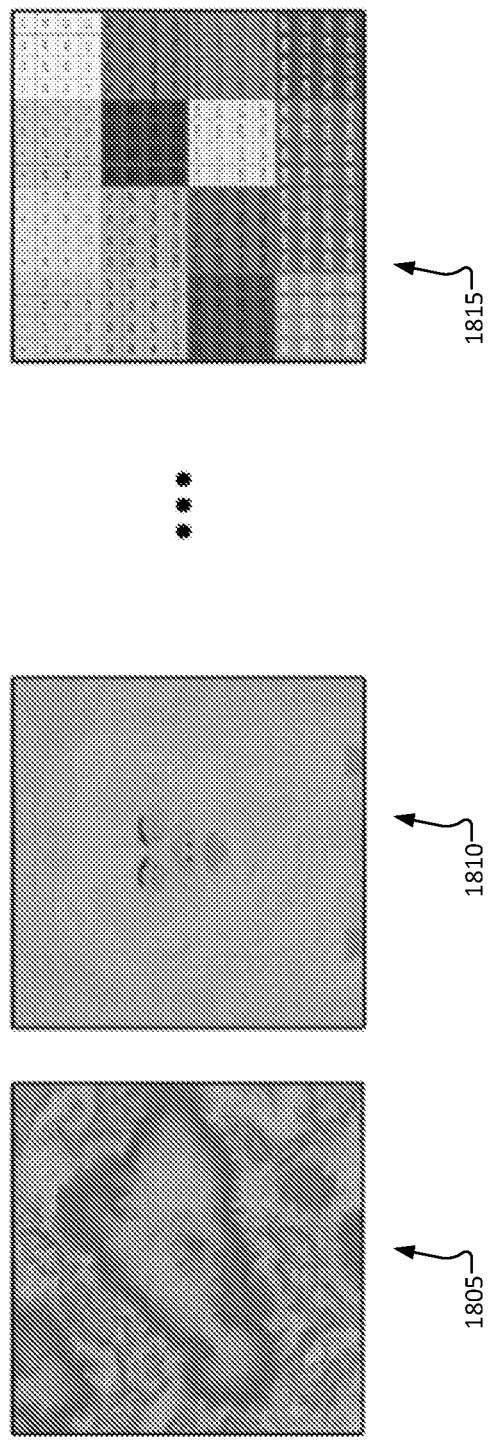
FIG. 18 is an illustration of texture parallelism that may be addressed in some embodiments.

FIG. 18 is an illustration of texture parallelism that may be addressed in some embodiments. In a fast game load use case, it may be expected that game startup or game level load will require thousands of texture assets. This in of itself can provide substantial number of units of parallel work, as shown in FIG. 18. FIG. 18 illustrates texture level parallelism in a process. It may be expected that games and other 3D applications will seek to load thousands of textures at application start up. For PC platform game titles, the most common texture storage formats are BC (Block Compression) formats (BCn) BC1-BC7. For illustration, a first texture asset 1805, a second texture asset 1810, and continuing through an nth texture asset 1815 are provided.

Chunk or Tile Parallelism—To facilitate the dynamic asset streaming use case, and to unify the super-decompression decoder implementation, it may be expected that during the super-compression encoding of these texture assets 1805-1815 that they will be further subdivided into either chunks or tiles of 64 KB size, as shown in FIGS. 19A-20B.

Figure 19A:
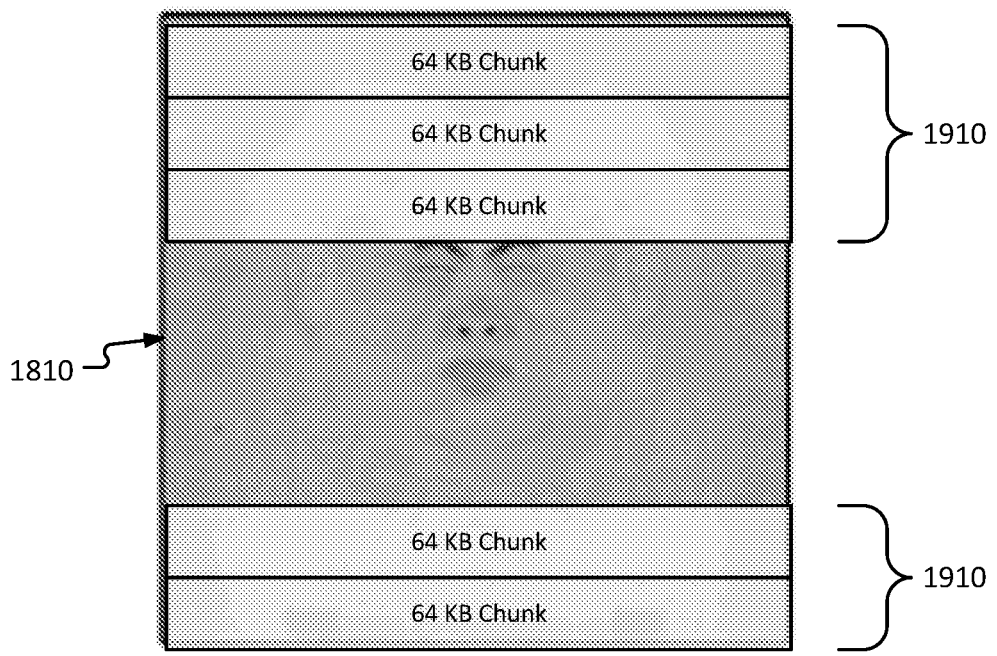
FIG. 19A illustrates super-compression authoring tools subdividing texture assets into chunks, according to some embodiments.
Figure 19B:
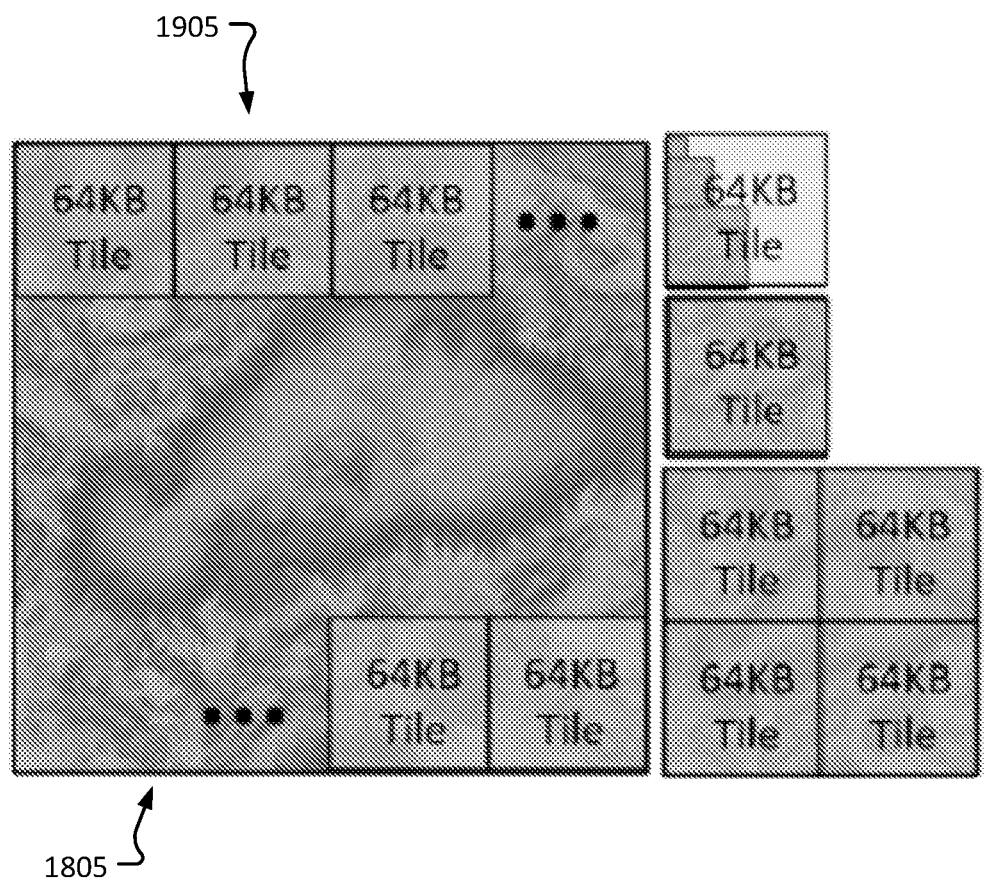
FIG. 19B illustrates super-compression authoring tools subdividing texture assets into tiles, according to some embodiments.

FIG. 19A illustrates super-compression authoring tools subdividing texture assets into chunks, according to some embodiments, and FIG. 19B illustrates super-compression authoring tools subdividing texture assets into tiles, according to some embodiments. FIG. 19A illustrates texture asset 1810 divided into multiple chunks 1910, while FIG. 19B illustrates texture asset 1805 divided into multiple tiles 1905. In these illustrations, the chunks 1910 and tiles 1905 are each 64 KB in size. However, embodiments are not limited to any particular chunk or tile size. Note that if a texture asset contains a multi-resolution MiP hierarchy of texture data, the tiles will span that MiP hierarchy. For the coarsest resolution MiP levels, it may be expected that several levels will all reside within a single tile.

In various implementations, 64 KB is an important size choice for several reasons. First, modern PC operating systems, PC GPUs, and PC CPUs are generally enabled to optimally serve GPU virtual memory in memory pages of size 64 KB. Particularly for dynamic streaming use cases, it may be preferred for performance and memory management concerns if texture super decompression for a single chunk can target a single 64 KB memory page.

Second, ≤64 KB sized allocation is also well suited to the read performance sweet spot for NVMe SSDs. It may be expected to saturate SSD bandwidth and asynchronous request queues with many simultaneous inflight 64 KB chunk/tile requests. 64 KB has also proven to be a large enough data window to support good compression ratios and performance of commonly used compression algorithms such as L7W, LZ77, and Huffman entropy encoding. 64 KB also allows alignment for BC1-BC7 blocks within the chunks. Finally, a 64 KB page contains enough texture data to be visually interesting to the human eye, yet it has been shown in practice to enable reasonably fine-grained virtual texture memory management.

Based on expected use case, authoring tools could subdivide the texture assets in either the chunk arrangement, or in the tile arrangement as shown. A current entropy decode implementation is not affected by the choice. However, there may be other future super compression algorithm design choices that merit focus and standardization on tile arrangement.

Figure 20A:
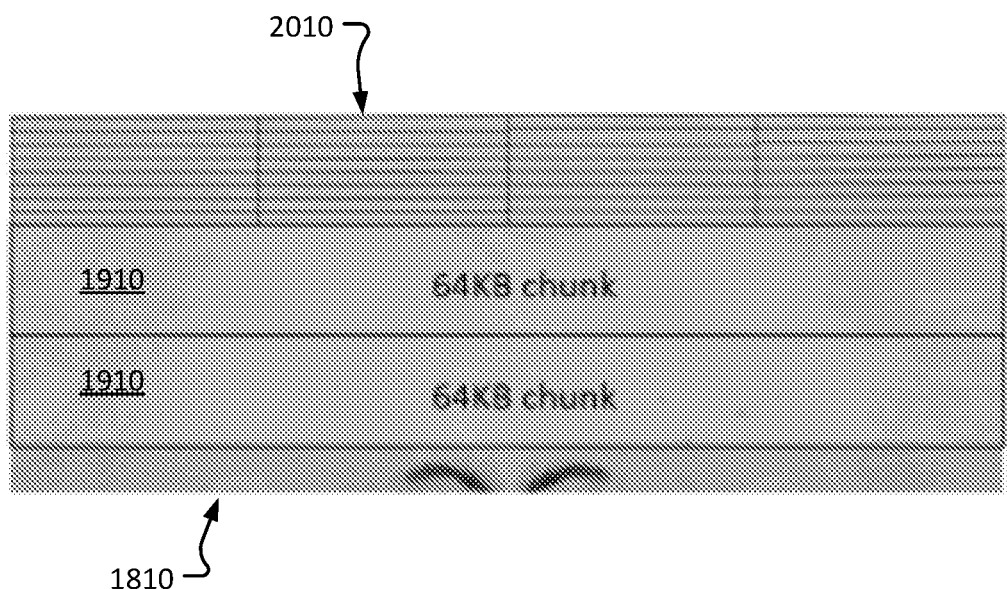
FIG. 20A illustrates further subdividing texture asset chunks into sub-chunks, according to some embodiments.
Figure 20B:
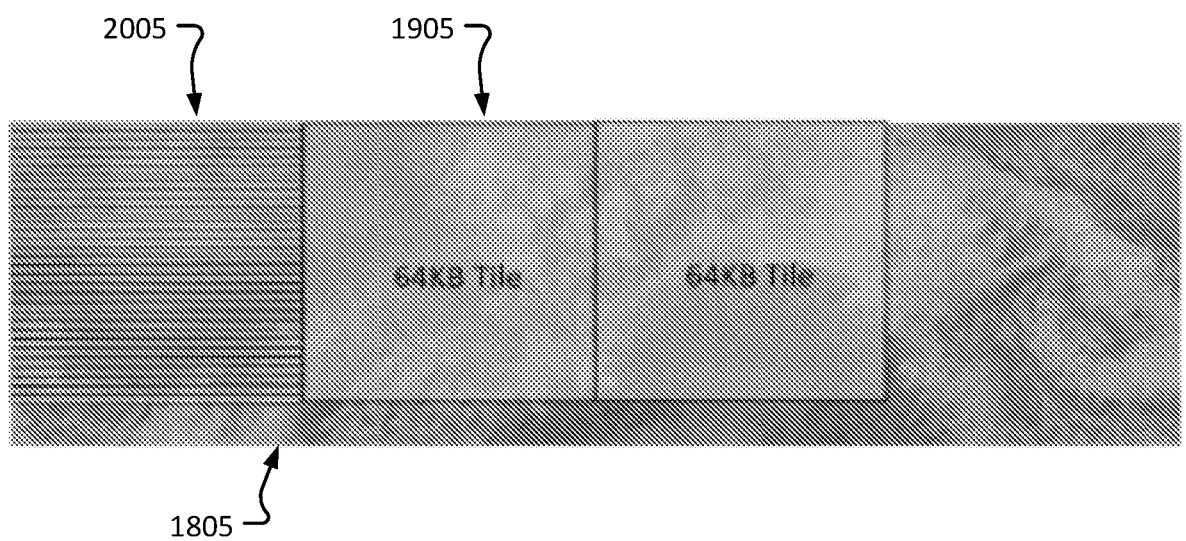
FIG. 20B illustrates further subdividing texture asset tiles into sub-chunks, according to some embodiments.

FIG. 20A illustrates further subdividing texture asset chunks into sub-chunks, according to some embodiments, and FIG. 20B illustrates further subdividing texture asset tiles into sub-chunks, according to some embodiments. In some embodiments, each chunk or tile may be further subdivided into sub-chunks, as shown in FIGS. 20A and 20B. FIG. 20A illustrates each chunk 1910 of texture asset 1810 being further subdivided into sub-chunks 2010, and FIG. 20B illustrates each tile 1905 of texture asset 1805 being further subdivided into sub-chunks 2005. A SIMD 32 example is shown in FIGS. 20A and 20B. In some embodiments, the number of sub-chunks per each chunk is to match the SIMD width of the target GPU implementation that will perform the decode. Both the encoder and the decoder may be required to agree on this choice of SIMD width.

The illustrated additional level of subdivision is carefully designed to support full utilization of the SIMD compute resources on a target GPU implementation. SIMD parallelism is applied to ensure every compute SIMD lane has independent units of work to perform. This parallelism enables each SIMD lane to be independently responsible for decoding an independently coded bitstream. Seen from the view of the encoder, it is as if multiple (SIMD n) encoders are working in parallel, each with its own sub-chunk. Likewise, when decoded, multiple decoders are working in parallel, each decoding its own sub-chunk. The only interplay between these SIMD parallel encoders and decoders, is how bits are written and read to the bitstream.

In the description above, for the purposes of explanation, numerous specific details are set forth in order to provide a thorough understanding of the described embodiments. It will be apparent, however, to one skilled in the art that embodiments may be practiced without some of these specific details. In other instances, well-known structures and devices are shown in block diagram form. There may be intermediate structure between illustrated components. The components described or illustrated herein may have additional inputs or outputs that are not illustrated or described.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a computer-readable medium having stored thereon computer program instructions, which may be used to program a computer (or other electronic devices) for execution by one or more processors to perform a process according to certain embodiments. The computer-readable medium may include, but is not limited to, magnetic disks, optical disks, read-only memory (ROM), random access memory (RAM), erasable programmable read-only memory (EPROM), electrically-erasable programmable read-only memory (EEPROM), magnetic or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present embodiments. It will be apparent to those skilled in the art that many further modifications and adaptations can be made. The particular embodiments are not provided to limit the concept but to illustrate it. The scope of the embodiments is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments, various features are sometimes grouped together in a single embodiment, figure, or description thereof for the purpose of streamlining the disclosure and aiding in the understanding of one or more of the various novel aspects. This method of disclosure, however, is not to be interpreted as reflecting an intention that the claimed embodiments requires more features than are expressly recited in each claim. Rather, as the following claims reflect, novel aspects lie in less than all features of a single foregoing disclosed embodiment. Thus, the claims are hereby expressly incorporated into this description, with each claim standing on its own as a separate embodiment. The foregoing description and drawings are to be regarded in an illustrative rather than a restrictive sense. Persons skilled in the art will understand that various modifications and changes may be made to the embodiments described herein without departing from the broader spirit and scope of the features set forth in the appended claims.

The following Examples pertain to certain embodiments:

In Example 1, an apparatus comprises one or more processors including a graphic processor, the graphics processor including a super-compression encoder pipeline to provide variable width interleaved coding; and memory for storage of data, wherein the graphics processor is to perform parallel dictionary encoding on a bitstream of symbols one of multiple workgroups, the workgroup to employ a plurality of encoders to generate a plurality of token-streams of variable lengths; create a histogram including at least tokens from the plurality of token-streams for the workgroup to generate an optimized entropy code; entropy code each of the plurality of token-streams for the workgroup into an encoded bitstream; and variably interleave the encoded bitstreams to generate an interleaved bitstream and book-keep a size of the interleaved bitstream.

In Example 2, the encoder pipeline is further to perform encoding for each of the plurality of workgroups to generate an interleaved bitstream for each workgroup, and to book-keep a size of the interleaved bitstream of each workgroup.

In Example 3, the encoder pipeline is further to combine the interleaved bitstreams of the plurality of workgroups; and using the sizes of the interleaved bitstreams, compact the combined interleaved bitstreams into a contiguous bitstream without gaps between the bitstreams.

In Example 4, entropy coding each of the plurality of token-streams for the workgroup into an encoded bitstream is based on requests from one or more of a plurality of decoders for additional data.

In Example 5, variable interleaving the encoded bitstreams into the interleaved bitstream includes determining the interleaving for each of a plurality of iterations based on the requests from the plurality of decoders.

In Example 6, one or more of the tokens of the token streams represents multiple symbols.

In Example 7, the histogram is based on tokens from token-streams for multiple workgroups of the plurality of workgroups.

In Example 8, data is processed in the token-streams in a form of Dwords (double words).

In Example 9, the bitstream of symbols comprises compressed texture data for a gaming application.

In Example 10, one or more non-transitory computer-readable storage mediums having stored thereon executable computer program instructions that, when executed by one or more processors, cause the one or more processors to perform operations comprising receiving, at a super-compression decoder pipeline, a bitstream, the bitstream including an interleaved bitstream for a workgroup of a plurality of workgroups; assigning initial data from the interleaved bitstream to each of a plurality of parallel decoders for the workgroup; commencing decoding of data by the plurality of parallel decoders; transmitting, by one or more of the plurality of parallel decoders, data requirements for additional decoding as each decoder of the plurality of parallel decoders reaches a threshold of remaining data to decode; and separating the interleaved bitstream into encoded bitstreams for decoding of tokens, the separation of the interleaved bitstream being based at least in part on the transmitted data requirements.

In Example 11, the decoder pipeline provides fused dictionary and entropy decoding.

In Example 12, the data requirements are determined for each iteration of a plurality of iterations of decoding.

In Example 13, data of the encoded bitstreams are decoded in Dword (double words) increments.

In Example 14, one or more of the tokens of the encoded bitstreams represents multiple symbols.

In Example 15, a method includes performing parallel dictionary encoding on a bitstream of symbols by a plurality of workgroups in a super-compression encoder pipeline, each workgroup of the plurality of workgroups to employ a plurality of encoders to generate a plurality of token-streams of variable lengths; creating a histogram including tokens from the plurality of token-streams of each workgroup of the plurality of workgroups to generate an optimized entropy code; entropy coding each of the plurality of token-streams for each workgroup into a plurality of encoded bitstreams for each workgroup; and variably interleaving the encoded bitstreams for each workgroup to generate a respective interleaved bitstream, and bookkeeping a size of the interleaved bitstream for each workgroup.

In Example 16, the method further includes combining the interleaved bitstreams of the plurality of workgroups; and, using the sizes of the interleaved bitstreams, compacting the combined interleaved bitstreams into a contiguous bitstream without gaps between the bitstreams.

In Example 17, the method further includes transmitting the contiguous bitstream to a super-compression decoder pipeline.

In Example 18, entropy coding each of the plurality of token-streams for a workgroup into an encoded bitstream is based on requests from one or more of a plurality of decoders of the super-compression decoder pipeline for additional data.

In Example 19, variable interleaving of the encoded bitstreams into the interleaved bitstream for the workgroup includes determining the interleaving for each of a plurality of iterations based on the requests from the plurality of decoders.

In Example 20, one or more of the tokens of the token streams represents multiple symbols.

In Example 21, an apparatus includes means for receiving, at a super-compression decoder pipeline, a bitstream, the bitstream including an interleaved bitstream for a workgroup of a plurality of workgroups; assigning initial data from the interleaved bitstream to each of a plurality of parallel decoders for the workgroup; commencing decoding of data by the plurality of parallel decoders; transmitting, by one or more of the plurality of parallel decoders, data requirements for additional decoding as each decoder of the plurality of parallel decoders reaches a threshold of remaining data to decode; and separating the interleaved bitstream into encoded bitstreams for decoding of tokens, the separation of the interleaved bitstream being based at least in part on the transmitted data requirements.

In Example 22, the decoder pipeline provides fused dictionary and entropy decoding.

In Example 23, the data requirements are determined for each iteration of a plurality of iterations of decoding.

In Example 24, data of the encoded bitstreams are decoded in Dword (double words) increments.

In Example 25, one or more of the tokens of the encoded bitstreams represents multiple symbols.

In Example 26, machine-readable storage includes machine-readable instructions that, when executed, cause a processor to implement a method as claimed in any preceding claim.

In the description above, for the purposes of explanation, numerous specific details are set forth in order to provide a thorough understanding of the described embodiments. It will be apparent, however, to one skilled in the art that embodiments may be practiced without some of these specific details. In other instances, well-known structures and devices are shown in block diagram form. There may be intermediate structure between illustrated components. The components described or illustrated herein may have additional inputs or outputs that are not illustrated or described.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a computer-readable medium having stored thereon computer program instructions, which may be used to program a computer (or other electronic devices) for execution by one or more processors to perform a process according to certain embodiments. The computer-readable medium may include, but is not limited to, magnetic disks, optical disks, read-only memory (ROM), random access memory (RAM), erasable programmable read-only memory (EPROM), electrically-erasable programmable read-only memory (EEPROM), magnetic or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present embodiments. It will be apparent to those skilled in the art that many further modifications and adaptations can be made. The particular embodiments are not provided to limit the concept but to illustrate it. The scope of the embodiments is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments, various features are sometimes grouped together in a single embodiment, figure, or description thereof for the purpose of streamlining the disclosure and aiding in the understanding of one or more of the various novel aspects. This method of disclosure, however, is not to be interpreted as reflecting an intention that the claimed embodiments requires more features than are expressly recited in each claim. Rather, as the following claims reflect, novel aspects lie in less than all features of a single foregoing disclosed embodiment. Thus, the claims are hereby expressly incorporated into this description, with each claim standing on its own as a separate embodiment.

The foregoing description and drawings are to be regarded in an illustrative rather than a restrictive sense.

Persons skilled in the art will understand that various modifications and changes may be made to the embodiments described herein without departing from the broader spirit and scope of the features set forth in the appended claims.

What is claimed is:

1. An apparatus comprising:
   one or more processors including a graphic processor, the graphics processor including:
      a super-compression encoder pipeline to perform variable width interleaved coding of one or more bitstreams to generate a contiguous bitstream, and
      a super-compression decoder pipeline to decode the contiguous bitstream to regenerate the one or more bitstreams; and
   memory for storage of data including data for graphics processing;
   wherein the encoder pipeline is to:
      perform parallel dictionary encoding on a bitstream of symbols by a workgroup of a plurality of workgroups, the workgroup to employ a plurality of encoders of the encoder pipeline to generate a plurality of token-streams of variable lengths;
      create a histogram including at least tokens from the plurality of token-streams for the workgroup to generate an optimized entropy code for the plurality of token-streams;
      utilize the optimized entropy code to entropy code each of the plurality of token-streams for the workgroup into an encoded bitstream; and
      variably interleave the encoded bitstreams to generate an interleaved bitstream and record a size of the interleaved bitstream.

2. The apparatus of claim 1, wherein the encoder pipeline is further to:
   perform encoding for each of the plurality of workgroups to generate an interleaved bitstream for each workgroup, and to record a size of the interleaved bitstream of each workgroup.

3. The apparatus of claim 2, wherein the encoder pipeline is further to:
   combine the interleaved bitstreams of the plurality of workgroups; and
   using the recorded sizes of the interleaved bitstreams, compact the combined interleaved bitstreams into the contiguous bitstream without gaps between the interleaved bitstreams.

4. The apparatus of claim 1, wherein entropy coding each of the plurality of token-streams for the workgroup into an encoded bitstream is based on requests from one or more decoders of a plurality of decoders of the decoder pipeline for additional data for decoding by the one or more decoders.

5. The apparatus of claim 4, wherein variable interleaving the encoded bitstreams into the interleaved bitstream includes determining the interleaving for each of a plurality of iterations based on the requests from the plurality of decoders of the decoder pipeline.

6. The apparatus of claim 1, wherein one or more of the tokens of the token-streams represents multiple symbols.

7. The apparatus of claim 1, wherein the histogram is based on tokens from token-streams for multiple workgroups of the plurality of workgroups.

8. The apparatus of claim 1, wherein data is processed in the token-streams in a form of Dwords (double words).

9. The apparatus of claim 1, wherein the bitstream of symbols comprises compressed texture data for a gaming application.

10. One or more non-transitory computer-readable storage mediums having stored thereon executable computer program instructions that, when executed by one or more processors, cause the one or more processors to perform operations comprising:
    receiving, at a super-compression decoder pipeline of a graphics processor, a contiguous bitstream generated by a super-compression encoder pipeline of the graphics processor, the contiguous bitstream including an interleaved bitstream for a workgroup of a plurality of workgroups; and
    decoding the interleaved bitstream by the decoder pipeline, including:
       assigning initial data from the interleaved bitstream to each of a plurality of parallel decoders of the decoder pipeline for the workgroup;
       commencing decoding of data by the plurality of parallel decoders;
       transmitting to the encoder pipeline, by one or more of the plurality of parallel decoders, data requirements for additional decoding as each decoder of the plurality of parallel decoders reaches a threshold of remaining data to decode; and
       separating the interleaved bitstream into encoded bitstreams for decoding of tokens within the encoded bitstreams to generate symbols, the separation of the interleaved bitstream being based at least in part on the transmitted data requirements.

11. The one or more non-transitory computer-readable storage mediums of claim 10, wherein the decoder pipeline provides fused dictionary and entropy decoding.

12. The one or more non-transitory computer-readable storage mediums of claim 10, wherein the data requirements are determined for each iteration of a plurality of iterations of decoding by the decoder pipeline.

13. The one or more non-transitory computer-readable storage mediums of claim 10, wherein data of the encoded bitstreams are decoded in Dword (double words) increments.

14. The one or more non-transitory computer-readable storage mediums of claim 10, wherein one or more of the tokens of the encoded bitstreams represents multiple symbols.

15. A method comprising:
    processing one or more bitstreams, by a super-compression encoder pipeline of a graphics processor, to generate a contiguous bitstream for output, the processing by the encoder pipeline including:
       performing parallel dictionary encoding on a bitstream of symbols by a plurality of workgroups in the encoder pipeline, each workgroup of the plurality of workgroups to employ a plurality of encoders to generate a plurality of token-streams of variable lengths;
       creating a histogram including tokens from the plurality of token-streams of each workgroup of the plurality of workgroups to generate an optimized entropy code for the plurality of token-streams;
       utilizing the optimized entropy code to entropy code each of the plurality of token-streams for each workgroup into a plurality of encoded bitstreams for each workgroup; and
       variably interleaving the encoded bitstreams for each workgroup to generate a respective interleaved bitstream, and recording a size of the interleaved bitstream for each workgroup.

16. The method of claim 15, wherein processing the one or more bitstreams by the encoder pipeline further includes:

combining the interleaved bitstreams of the plurality of workgroups; and using the recorded sizes of the interleaved bitstreams, compacting the combined interleaved bitstreams into the contiguous bitstream without gaps between the interleaved bitstreams.

17. The method of claim 16, wherein processing the one or more bitstreams by the encoder pipeline further includes:

transmitting the contiguous bitstream to a super-compression decoder pipeline of the graphics processor.

18. The method of claim 17, wherein entropy coding each of the plurality of token-streams for a workgroup into an encoded bitstream is based on requests from one or more decoders of a plurality of decoders of the decoder pipeline for additional data for decoding by the one or more decoders.

19. The method of claim 18, wherein variable interleaving of the encoded bitstreams into the interleaved bitstream for the workgroup includes determining the interleaving for each of a plurality of iterations based on the requests from the plurality of decoders of the decoder pipeline.

20. The method of claim 15, wherein one or more of the tokens of the token-streams represents multiple symbols.

\* \* \* \* \*